United States Patent
Schäfer et al.

(10) Patent No.: US 8,080,667 B2
(45) Date of Patent: *Dec. 20, 2011

(54) ELECTROLUMINESCENT METAL COMPLEXES WITH TRIAZOLES AND BENZOTRIAZOLES

(75) Inventors: Thomas Schäfer, Liestal (CH); Kristina Bardon, Waldshut (DE); Beat Schmidhalter, Bubendorf (CH); Roger Prétôt, Basel (CH)

(73) Assignee: BASF SE, Ludwigshafen (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/794,948

(22) Filed: Jun. 7, 2010

(65) Prior Publication Data

US 2010/0244014 A1 Sep. 30, 2010

Related U.S. Application Data

(62) Division of application No. 11/629,573, filed as application No. PCT/EP2005/052845 on Jun. 20, 2005, now Pat. No. 7,820,828.

(30) Foreign Application Priority Data

Jun. 28, 2004 (EP) .................................... 04102981

(51) Int. Cl.
 *C07F 15/00* (2006.01)
 *H01L 51/00* (2006.01)

(52) U.S. Cl. ......... 548/108; 313/504; 428/690; 548/101

(58) Field of Classification Search .................. 548/101, 548/108; 313/504; 428/690
 See application file for complete search history.

(56) References Cited

U.S. PATENT DOCUMENTS

| | | | |
|---|---|---|---|
| 3,852,297 A | 12/1974 | Moser et al. | |
| 7,820,828 B2 * | 10/2010 | Schafer et al. | 548/108 |
| 2001/0019782 A1 | 9/2001 | Igarashi et al. | 428/690 |
| 2002/0055014 A1 | 5/2002 | Okada et al. | 428/690 |

FOREIGN PATENT DOCUMENTS

| | | |
|---|---|---|
| EP | 1067165 | 1/2001 |
| EP | 1239526 | 9/2002 |
| JP | 48-056245 A2 | 8/1973 |
| JP | 2002/105055 A | 4/2002 |

OTHER PUBLICATIONS

P. I. Djurovich et al., Polymer Preprints, (2000), vol. 41, No. 1, pp. 770-771.
M. A. Baldo et al., Applied Physics Letters, vol. 75, No. 1, Jul. 5, 1999, pp. 4-6.
Wei-Sheng Huang et al., Chem. Mater., (2004), vol. 16, pp. 2480-2488.
J. A. C. Allison et al., J. Heterocyclic Chem., vol. 12, No. 6, Dec. 1975, pp. 1275-1277.
M. Nonoyama et al., Transition Met. Chem., vol. 3, May 1978, pp. 366-369.
Peter J. Steel et al., Journal of Organometallic Chemistry, vol. 327, (1987), pp. 101-114.
English Language Abstract of JP 2002/105055 Downloaded on Mar. 16, 2011.

* cited by examiner

*Primary Examiner* — Charanjit Aulakh
(74) *Attorney, Agent, or Firm* — Shiela A. Loggins

(57) ABSTRACT

This invention relates to electroluminescent metal complexes with triazoles and benzotriazoles, respectively of the formula

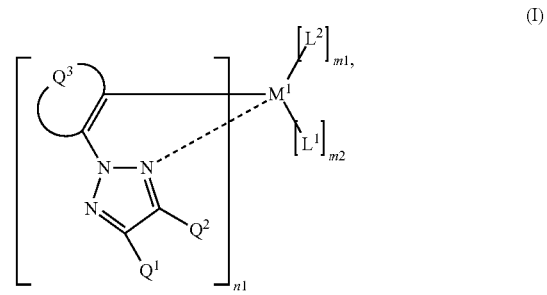

(I)

a process for their preparation, electronic devices comprising the metal complexes and their use in electronic devices, especially organic light emitting diodes (OLEDs), as oxygen sensitive indicators, as phosphorescent indicators in bioassays, and as catalysts.

6 Claims, No Drawings

ELECTROLUMINESCENT METAL COMPLEXES WITH TRIAZOLES AND BENZOTRIAZOLES

This application is a divisional of U.S. application Ser. No. 11/629,573 filed Dec. 14, 2006, now U.S. Pat. No. 7,820,828 which is a national stage of PCT/EP 2005/052845, filed Jun. 20, 2005, the contents of which are incorporated herein by reference.

This invention relates to electroluminescent metal complexes with triazoles and benzotriazoles, a process for their preparation, electronic devices comprising the metal complexes and their use in electronic devices, especially organic light emitting diodes (OLEDs), as oxygen sensitive indicators, as phosphorescent indicators in bioassays, and as catalysts.

Organic electronic devices that emit light, such as light-emitting diodes that make up displays, are present in many different kinds of electronic equipment. In all such devices, an organic active layer is sandwiched between two electrical contact layers. At least one of the electrical contact layers is light-transmitting so that light can pass through the electrical contact layer. The organic active layer emits light through the light-transmitting electrical contact layer upon application of electricity across the electrical contact layers.

It is well known to use organic electroluminescent compounds as the active component in light-emitting diodes. Simple organic molecules such as anthracene, thiadiazole derivatives, and coumarin derivatives are known to show electroluminescence. Semiconductive conjugated polymers have also been used as electroluminescent components, as has been disclosed in, for example, in U.S. Pat. No. 5,247,190, U.S. Pat. No. 5,408,109 and EP-A-443 861. Complexes of 8-hydroxyquinolate with trivalent metal ions, particularly aluminum, have been extensively used as electroluminescent components, as has been disclosed in, for example, U.S. Pat. No. 5,552,678.

Burrows and Thompson have reported that fac-tris(2-phenylpyridine) iridium can be used as the active component in organic light-emitting devices. (Appl. Phys. Lett. 1999, 75, 4.) The performance is maximized when the iridium compound is present in a host conductive material. Thompson has further reported devices in which the active layer is poly(N-vinyl carbazole) doped with fac-tris[2-(4',5'-difluorophenyl)pyridine-C'.sup.2,N]iridium(III). (Polymer Preprints 2000, 41(1), 770.)

J. A. C. Allison et al., J. Heterocyclic Chem. 12 (1975) 1275-1277 discloses 2-phenyl-1,2,3-triazole chloro complexes of palladium and their use as catalysts in the synthesis of chlorinated phenyl triazines.

M. Nonoyama and C. Hayata, Transition Met. Chem. 3 (1978) 366-369 describe cyclometallations of 2-aryl-4,5-dimethyl-1,2,3-triazoles [H(C—N)] with palladium(II), platinum(II), rhodium(III) and iridium(III) chloride which results in [MCl(C—N)]$_2$ for M=Pd, or Pt and [MCl(C—N)$_2$]$_2$ species for M=Rh, or Ir. These complexes react with monodentate ligands, L, such as pyridine and tri-n-butylphosphine to give MCl(C—N)L and MCl(C—N)$_2$L complexes US20020055014 relates to a light-emitting device comprising a phosphorescent compound. Preferred phosphorescent compounds include compounds having a partial structure represented by the formula shown below

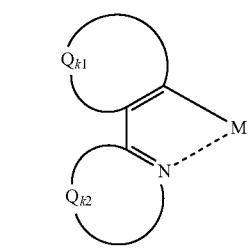

wherein M represents a transition metal; $Q_{k1}$ represents an atomic group necessary for forming a 5- or 6-membered aromatic ring; and $Q_{k2}$ represents an atomic group necessary for forming a 5- or 6-membered aromatic azole ring. The 5- or 6-membered aromatic azole ring completed by $Q_{k2}$ may include triazole, but does not include 1,2,3-triazole.

US20010019782 discloses a light-emitting material comprising a compound having a partial structure represented by the following formula

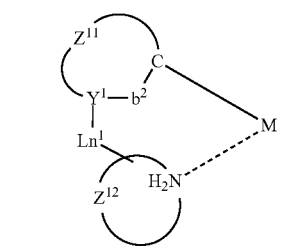

wherein $Z^{11}$ and $Z^{12}$ each represent a nonmetallic atom group required to form a 5- or 6-membered ring with at least one of carbon atom and nitrogen atom, said ring optionally having a substituent or forming a condensed ring with the other ring; $Ln^1$ represents a divalent group; $Y^1$ represents a nitrogen atom or carbon atom; and $b^2$ represents a single bond or double bond. Among the preferred examples of the 5- or 6-membered ring formed by $Z^{11}$ and $Z^{12}$ are 1,2,3-triazole rings, and 1,2,4-triazole rings. The divalent group $Ln^1$ does not comprise a single bond.

Phosphorescent bis-cyclometalated iridium complexes containing benzoimidazole-based ligands are described by W.-S. Huang et al. in Chem. Mater. 16 (2004) 2480-2488.

The $^1$H and $^{13}$C NMR of the following cyclopalladated metal complex are described in P. J. Steel, G. B. Caygill, Journal of Organometallic Chemistry 327 (1987) 101-114:

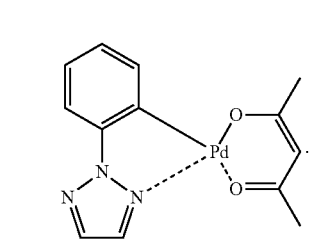

However, there is a continuing need for electroluminescent compounds having improved efficiency.

Accordingly the present invention is directed to compounds (metal complexes) of the formula

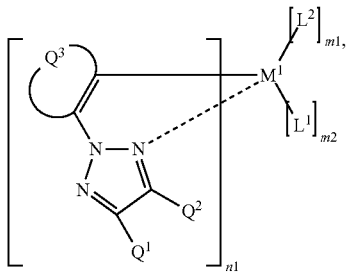 (I)

wherein
n1 is an integer of 1 to 3,
m1 and m2 are an integer 0, 1 or 2,
$M^1$ is a metal with an atomic weight of greater than 40,
$L^1$ is a monodentate ligand or a bidentate ligand,
$L^2$ is a monodentate ligand,
$Q^1$ and $Q^2$ are independently of each other an organic substituent, or
$Q^1$ and $Q^2$ together with the carbon atoms, to which they are bonded, form a group

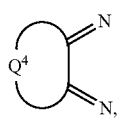

wherein $Q^4$ represents a group of forming a condensed aromatic, or heteroaromatic ring, which can optionally be substituted; and
$Q^3$ represents a group of forming a condensed aromatic, or heteroaromatic ring, which can optionally be substituted, with the proviso that the following compound

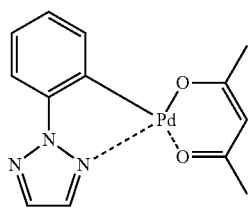

is excluded and the monodentate ligand is not a halogen atom, a process for their preparation, electronic devices comprising the metal complexes and their use in electronic devices, especially organic light emitting diodes (OLEDs), as oxygen sensitive indicators, as phosphorescent indicators in bioassays, and as catalysts.

The present invention is directed to metal complexes comprising at least one ligand derived from triazole and 2H-benzotriazole, respectively.

The 2H-benzotriazole compound in the context of the present invention means a 2H-benzotriazole or hetero-2H-benzotriazole.

Examples that specify the possibilities for the

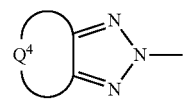

group designated above are as follows:

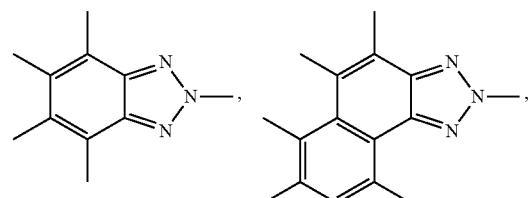

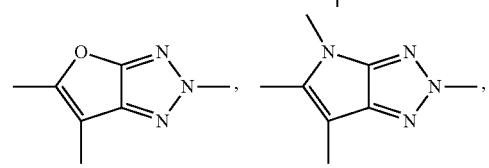

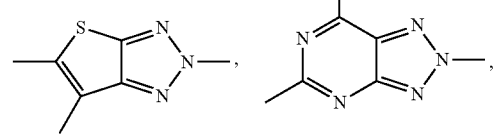

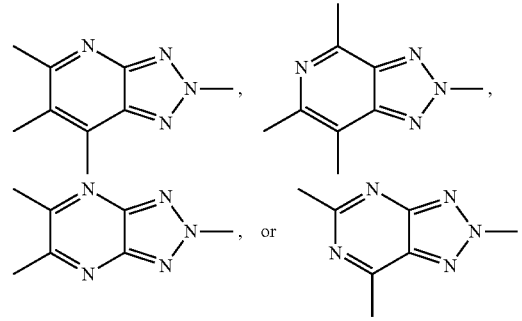

It is understood that the open valences in the 2H-benzotriazole moiety represents a covalent bond that is not limited in its substitution. According to the present invention the metal complex comprise at least a triazole or 2H-benzotriazole ligand, i.e. it may comprise two or three or more triazole or 2H-benzotriazole ligands.

Specific examples of

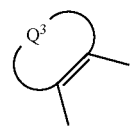

are given below in the definition of $Y^1$, $Y^2$ and $Y^3$.

The term "ligand" is intended to mean a molecule, ion, or atom that is attached to the coordination sphere of a metallic ion. The term "complex", when used as a noun, is intended to mean a compound having at least one metallic ion and at least one ligand. The term "group" is intended to mean a part of a compound, such a substituent in an organic compound or a ligand in a complex. The term "facial" is intended to mean one isomer of a complex, $Ma_3b_3$, having octahedral geometry, in which the three "a" groups are all adjacent, i.e. at the corners of one triangular face of the octahedron. The term "meridional" is intended to mean one isomer of a complex, $Ma_3b_3$, having octahedral geometry, in which the three "a" groups occupy three positions such that two are trans to each other, i.e. the three "a" groups sit in three coplanar positions, forming an arc across the coordination sphere that can be thought of as a meridion. The phrase "adjacent to," when used to refer to layers in a device, does not necessarily mean that one layer is immediately next to another layer. The term "photoactive" refers to any material that exhibits electroluminescence and/or photosensitivity.

The metal complexes of the present invention are characterized in that at least one ligand is derived from a triazole or benzotriazole compound.

Suitable triazoles or benzotriazoles

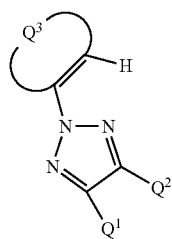

are known or can be produced according to known procedures. The synthesis of suitable benzotriazoles is, for example, described in WO03/105538, and PCT2004EP53111 as well as the references cited therein.

The metal is generally a metal $M^1$ with an atomic weight of greater than 40,

Preferably the metal $M^1$ is selected from the group consisting of Fe, Ru, Ni, Co Ir, Pt, Pd, Rh, Re, Os, Tl, Pb, Bi, In, Sn, Sb, Te, Ag and Au.

More preferably the metal is selected from Ir, Rh and Re as well as Pt and Pd, wherein Ir is most preferred.

The ligand is preferably a monoanionic bidentate ligand. In general these ligands have N, O, P, or S as coordinating atoms and form 5- or 6-membered rings when coordinated to the iridium. Suitable coordinating groups include amino, imino, amido, alkoxide, carboxylate, phosphino, thiolate, and the like. Examples of suitable parent compounds for these ligands include β-dicarbonyls (β-enolate ligands), and their N and S analogs; amino carboxylic acids (aminocarboxylate ligands); pyridine carboxylic acids (iminocarboxylate ligands); salicylic acid derivatives (salicylate ligands); hydroxyquinolines (hydroxyquinolinate ligands) and their S analogs; and diarylphosphinoalkanols (diarylphosphinoalkoxide ligands).

Examples of bidentate ligands, $L^1$ or L', are

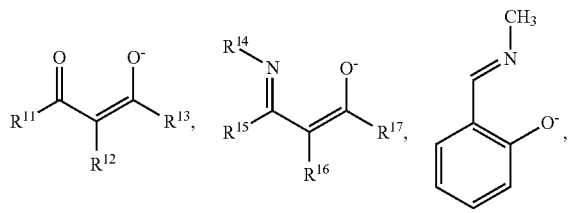

(US2004/0001970)

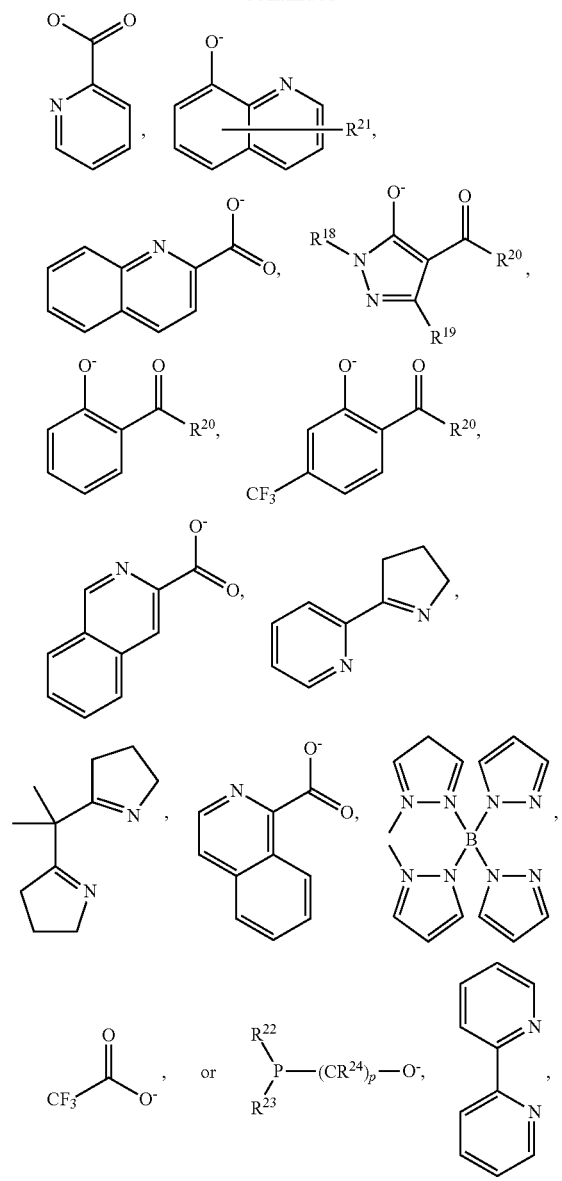

(WO03040256)

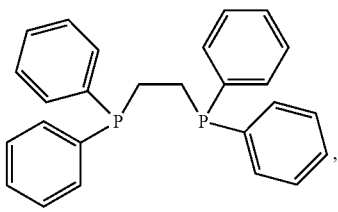

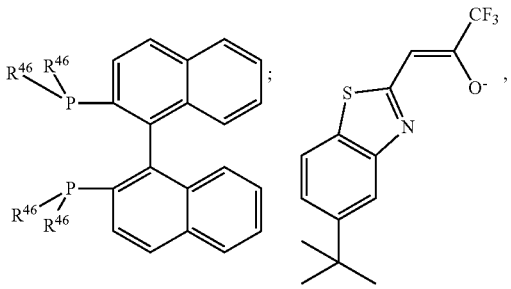

-continued

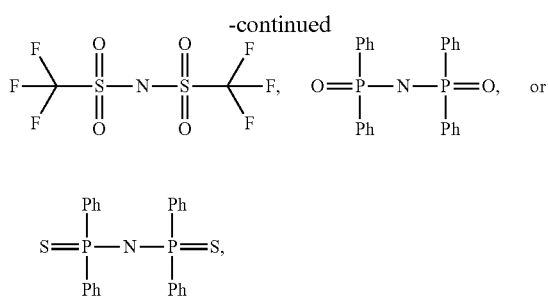 or wherein
$R^{11}$ and $R^{15}$ are independently of each other hydrogen, $C_1$-$C_8$alkyl, $C_6$-$C_{18}$aryl, $C_2$-$C_{10}$heteroaryl, or $C_1$-$C_8$perfluoroalkyl,
$R^{12}$ and $R^{16}$ are independently of each other hydrogen, or $C_1$-$C_8$alkyl, and
$R^{13}$ and $R^{17}$ are independently of each other hydrogen, $C_1$-$C_8$alkyl, $C_6$-$C_{18}$aryl, $C_2$-$C_{10}$heteroaryl, $C_1$-$C_8$perfluoroalkyl, or $C_1$-$C_8$alkoxy, and
$R^{14}$ is $C_1$-$C_8$alkyl, $C_6$-$C_{10}$aryl, or $C_7$-$C_{11}$aralkyl,
$R^{18}$ is $C_6$-$C_{10}$aryl,
$R^{19}$ is $C_1$-$C_8$alkyl,
$R^{20}$ is $C_1$-$C_8$alkyl, or $C_6$-$C_{10}$aryl,
$R^{21}$ is hydrogen, $C_1$-$C_8$alkyl, or $C_1$-$C_8$alkoxy, which may be partially or fully fluorinated,
$R^{22}$ and $R^{23}$ are independently of each other $C_n(H+F)_{2n+1}$, or $C_6(H+F)_5$, $R^{24}$ can be the same or different at each occurrence and is selected from H, or $C_n(H+F)_{2n+1}$,
p is 2, or 3, and
$R^{46}$ is $C_1$-$C_8$alkyl, $C_6$-$C_{18}$aryl, or $C_6$-$C_{18}$aryl, which is substituted by $C_1$-$C_8$alkyl.

Examples of suitable phosphino alkoxide ligands

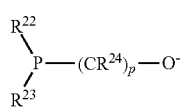

(WO03040256) are listed below:
3-(diphenylphosphino)-1-oxypropane [dppO]
1,1-bis(trifluoromethyl)-2-(diphenylphosphino)-ethoxide [tfmdpeO].

Examples of particularly suitable compounds HL,

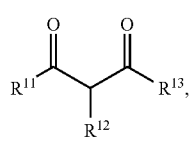

from which the ligands L are derived, include

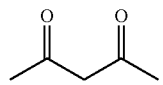

(2,4-pentanedionate [acac]),

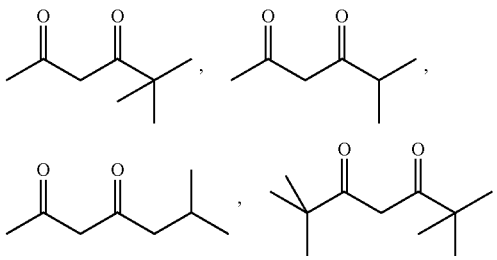

(2,2,6,6-tetramethyl-3,5-heptanedionate [TMH]),

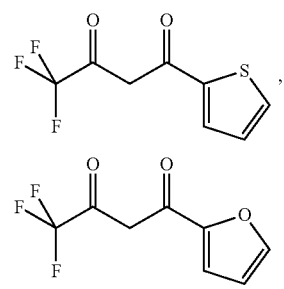

(1,3-diphenyl-1,3-propanedionate [DI]),

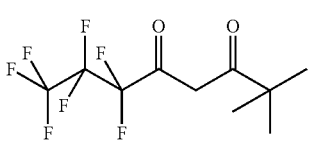

(4,4,4-trifluoro-1-(2-thienyl)-1,3-butanedionate [TTFA]),

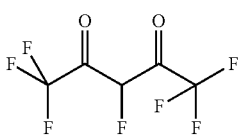

(7,7-dimethyl-1,1,1,2,2,3,3-heptafluoro-4,6-octanedionate [FOD]), (1,1,1,3,5,5,5-heptafluoro-2,4-pentanedionate [F7acac]),

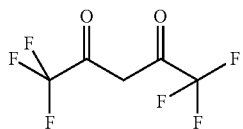

(1,1,1,5,5,5-hexafluoro-2,4-pentanedionate [F6acac]),

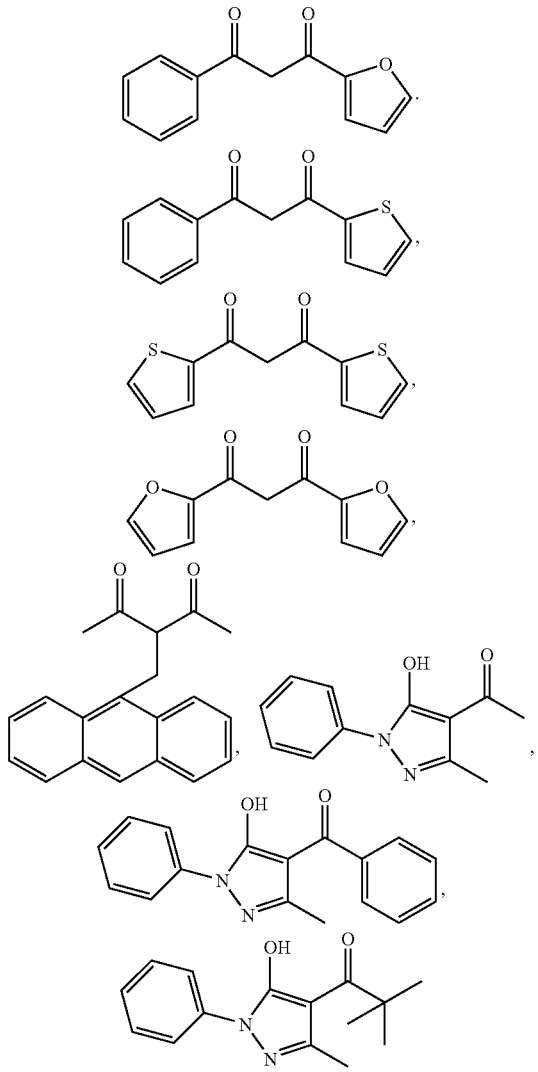

(1-phenyl-3-methyl-4-i-butyryl-pyrazolinonate [FMBP]),

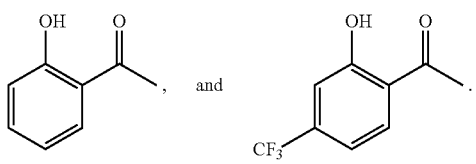

The hydroxyquinoline parent compounds, HL, can be substituted with groups such as alkyl or alkoxy groups which may be partially or fully fluorinated. In general, these compounds are commercially available. Examples of suitable hydroxyquinolinate ligands, L, include:
8-hydroxyquinolinate [8hq]
2-methyl-8-hydroxyquinolinate [Me-8hq]
10-hydroxybenzoquinolinate [10-hbq]

In a further embodiment the present invention the bidentate ligand, $L^1$, or L', is a ligand of formula

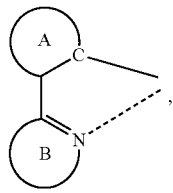

wherein
the ring A,

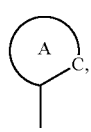

represents an optionally substituted aryl group which can optionally contain heteroatoms,
the ring B,

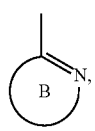

represents an optionally substituted nitrogen containing aryl group, which can optionally contain further heteroatoms, or the ring A may be taken with the ring B binding to the ring A to form a ring.

The preferred ring A includes a phenyl group, a substituted phenyl group, a naphthyl group, a substituted naphthyl group, a furyl group, a substituted furyl group, a benzofuryl group, a substituted benzofuryl group, a thienyl group, a substituted thienyl group, a benzothienyl group, a substituted benzothienyl group, and the like. The substitutent on the substituted phenyl group, substituted naphthyl group, substituted furyl group, substituted benzofuryl group, substituted thienyl group, and substituted benzothienyl group include $C_1$-$C_{24}$alkyl groups, $C_2$-$C_{24}$alkenyl groups, $C_2$-$C_{24}$alkynyl groups, aryl groups, heteroaryl groups, $C_1$-$C_{24}$alkoxy groups, $C_1$-$C_{24}$alkylthio groups, a cyano group, $C_2$-$C_{24}$acyl groups, $C_1$-$C_{24}$alkyloxycarbonyl groups, a nitro group, halogen atoms, alkylenedioxy groups, and the like.

In said embodiment the bidentate ligand

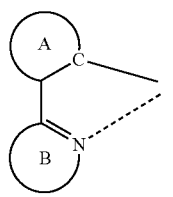

is preferably a group of formula

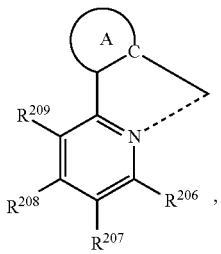

wherein $R^{206}$, $R^{207}$, $R^{208}$, and $R^{209}$ are independently of each other hydrogen, $C_1$-$C_{24}$alkyl, $C_2$-$C_{24}$alkenyl, $C_2$-$C_{24}$alkynyl, aryl, heteroaryl, $C_1$-$C_{24}$alkoxy, $C_1$-$C_{24}$alkylthio, cyano, acyl, alkyloxycarbonyl, a nitro group, or a halogen atom; the ring A represents an optionally substituted aryl or heteroaryl group; or the ring A may be taken with the pyridyl group binding to the ring A to form a ring; the alkyl group, alkenyl group, alkynyl group, aryl group, heteroaryl group, alkoxy group, alkylthio group, acyl group, and alkyloxycarbonyl group represented by $R^{206}$, $R^{207}$, $R^{208}$, and $R^{209}$ may be substituted.

An example of a preferred class of bidentate ligands, $L^1$, $L'$ or $L''$, are compounds of the formula

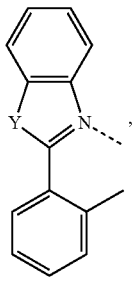

especially

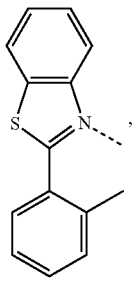

wherein Y is S, O, $NR^{200}$, wherein $R^{200}$ is hydrogen, cyano, $C_1$-$C_4$alkyl, $C_2$-$C_4$alkenyl, optionally substituted $C_6$-$C_{10}$aryl, especially phenyl, —(CH$_2$)$_r$—Ar, wherein Ar is an optionally substituted $C_6$-$C_{10}$aryl, especially

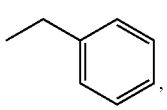 

a group —(CH$_2$)$_{r'}$X$^{20}$, wherein r' is an integer of 1 to 5, $X^{20}$ is halogen, especially F, or Cl; hydroxy, cyano, —O—C$_1$-C$_4$alkyl, di(C$_1$-C$_4$alkyl)amino, amino, or cyano; a group —(CH$_2$)$_r$OC(O)(CH$_2$)$_{r''}$CH$_3$, wherein r is 1, or 2, and r" is 0, or 1;

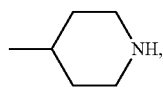

—NH-Ph, —C(O)CH$_3$, —CH$_2$—O—(CH$_2$)$_2$—Si(CH$_3$)$_3$, or

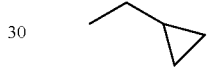

Another preferred class of bidentate ligands, $L^1$, $L'$ or $L''$, is a compound of formula

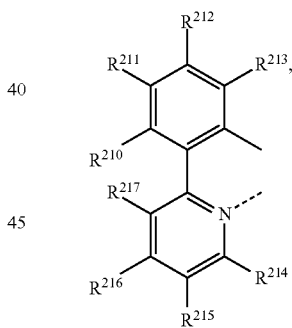

wherein $R^{214}$ is hydrogen, halogen, especially F, or Cl; nitro, $C_1$-$C_4$alkyl, $C_1$-$C_4$perfluoroalkyl, $C_1$-$C_4$alkoxy, or optionally substituted $C_6$-$C_{10}$aryl, especially phenyl, $R^{215}$ is hydrogen, halogen, especially F, or Cl; $C_1$-$C_4$alkyl, $C_1$-$C_4$perfluoroalkyl, optionally substituted $C_6$-$C_{10}$aryl, especially phenyl, or optionally substituted $C_6$-$C_{10}$perfluoroaryl, especially $C_6F_5$,
$R^{216}$ is hydrogen, $C_1$-$C_4$alkyl, $C_1$-$C_4$perfluoroalkyl, optionally substituted $C_6$-$C_{10}$aryl, especially phenyl, or optionally substituted $C_6$-$C_{10}$perfluoroaryl, especially $C_6F_5$,
$R^{217}$ is hydrogen, halogen, especially F, or Cl; nitro, cyano, $C_1$-$C_4$alkyl, $C_1$-$C_4$perfluoroalkyl, $C_1$-$C_4$alkoxy, or optionally substituted $C_6$-$C_{10}$aryl, especially phenyl,
$R^{210}$ is hydrogen,
$R^{211}$ is hydrogen, halogen, especially F, or Cl; nitro, cyano, $C_1$-$C_4$alkyl, $C_2$-$C_4$alkenyl, $C_1$-$C_4$perfluoroalkyl, —O—C$_1$-C$_4$perfluoroalkyl, tri($C_1$-$C_4$alkyl)silanyl, especially tri(meth-

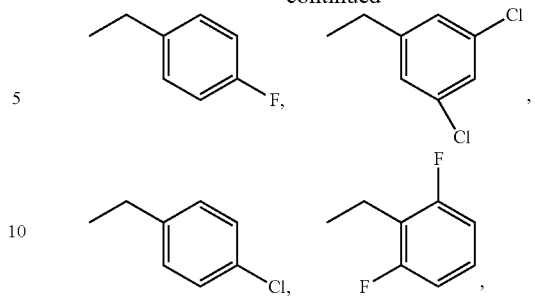

yl)silanyl, optionally substituted $C_6$-$C_{10}$aryl, especially phenyl, or optionally substituted $C_6$-$C_{10}$perfluoroaryl, especially $C_6F_5$, $R^{212}$ is hydrogen, halogen, especially F, or Cl; nitro, hydroxy, mercapto, amino, $C_1$-$C_4$alkyl, $C_2$-$C_4$alkenyl, $C_1$-$C_4$perfluoroalkyl, $C_1$-$C_4$alkoxy, —O—$C_1$-$C_4$perfluoroalkyl, —S—$C_1$-$C_4$alkyl, a group —$(CH_2)_rX^{20}$, wherein r is 1, or 2, $X^{20}$ is halogen, especially F, or Cl; hydroxy, cyano, —O—$C_1$-$C_4$alkyl, di($C_1$-$C_4$alkyl)amino, —$CO_2X^{21}$, wherein $X^{21}$ is H, or $C_1$-$C_4$alkyl; —CH=CHCO$_2X^{22}$, wherein $X^{22}$ is $C_1$-$C_4$alkyl; —CH(O), —$SO_2X^{23}$, —$SOX^{23}$, —NC(O)$X^{23}$, —$NSO_2X^{23}$, —NHX$^{23}$, —N($X^{23}$)$_2$, wherein $X^{23}$ is $C_1$-$C_4$alkyl; tri($C_1$-$C_4$alkyl)siloxanyl, optionally substituted —O—$C_6$-$C_{10}$aryl, especially phenoxy, cyclohexyl, optionally substituted $C_6$-$C_{10}$aryl, especially phenyl, or optionally substituted $C_6$-$C_{10}$perfluoroaryl, especially $C_6F_5$, and $R^{213}$ is hydrogen, nitro, cyano, $C_1$-$C_4$alkyl, $C_2$-$C_4$alkenyl, $C_1$-$C_4$perfluoroalkyl, —O—$C_1$-$C_4$perfluoroalkyl, tri($C_1$-$C_4$alkyl)silanyl, or optionally substituted $C_6$-$C_{10}$aryl, especially phenyl.

Specific examples of bidentate ligands, $L^1$, L' or L", are the following compounds (X-1) to (X-47):

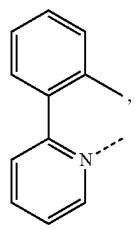
(X-1)

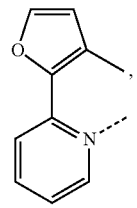
(X-2)

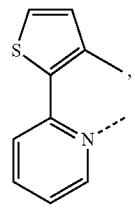
(X-3)

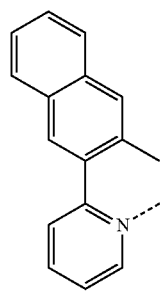
(X-4)

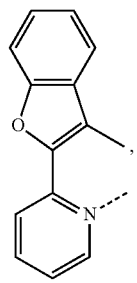
(X-5)

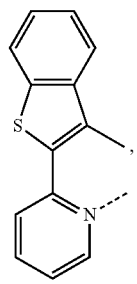
(X-6)

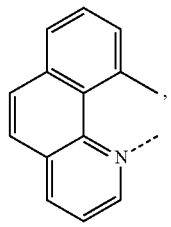
(X-7)

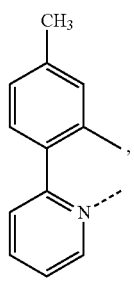
(X-8)

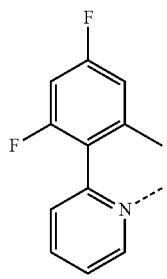
(X-9)

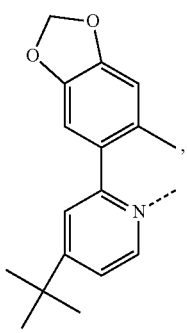 (X-10)
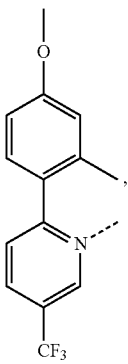 (X-11)
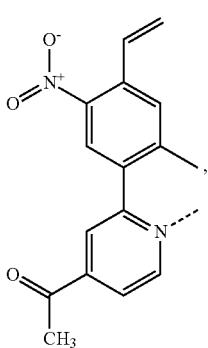 (X-12)
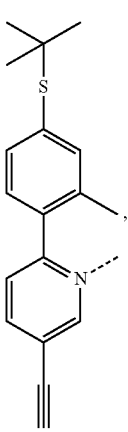 (X-13)
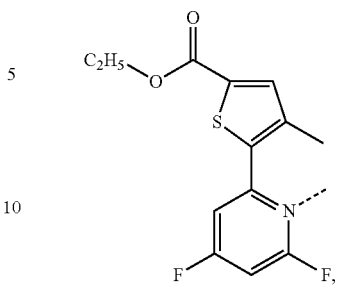 (X-14)
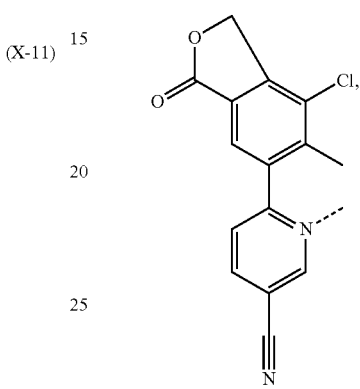 (X-15)
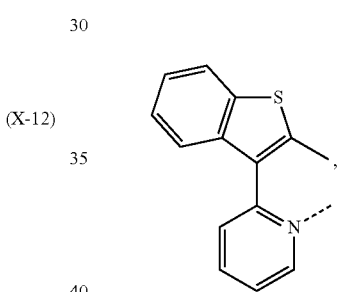 (X-16)
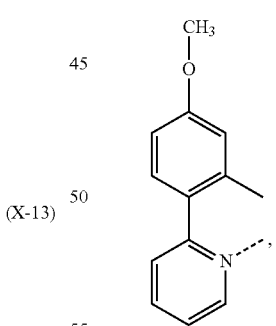 (X-17)
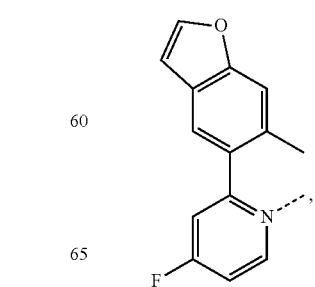 (X-18)

(X-19) 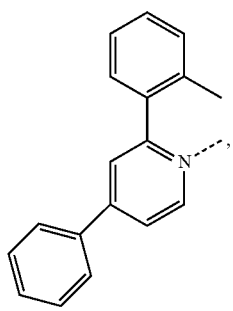
(X-20) 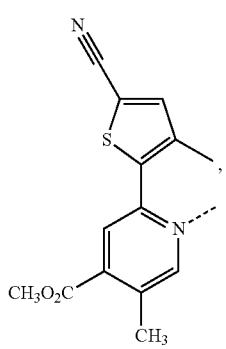
(X-21) 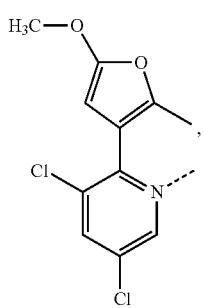
(X-22) 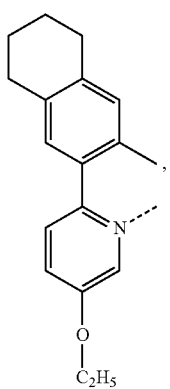
(X-23) 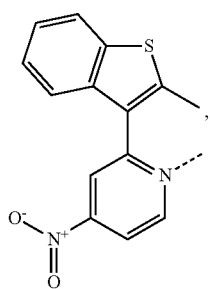
(X-24) 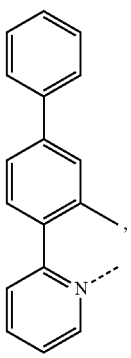
(X-25) 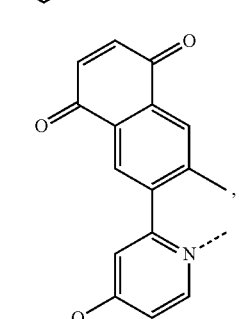
(X-26) 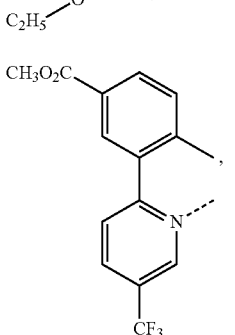
(X-27) 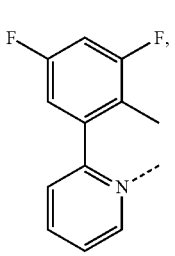
(X-28) 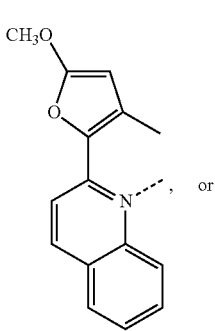 or

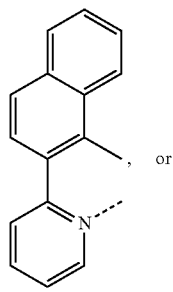, or
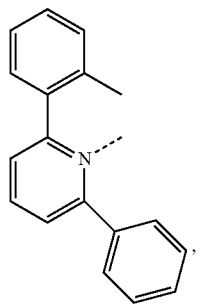
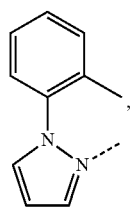
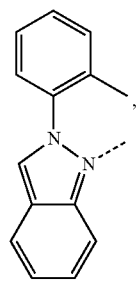
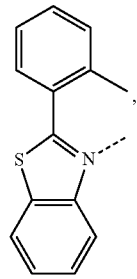
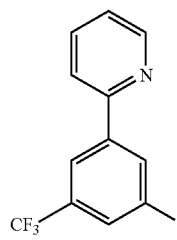
(X-29)
(X-30)
(X-31)
(X-32)
(X-33)
(X-34)
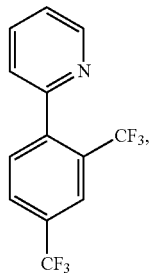
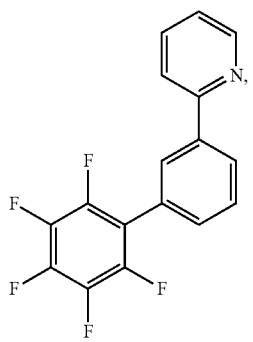
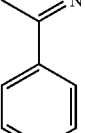
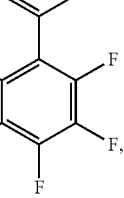
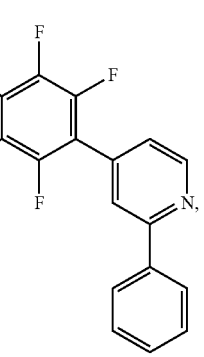
(X-35)
(X-36)
(X-37)
(X-37)

(X-38)
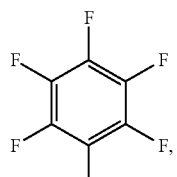
(X-39)
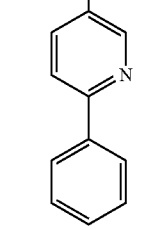
(X-40)
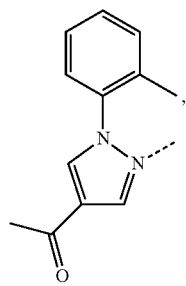
(X-41)
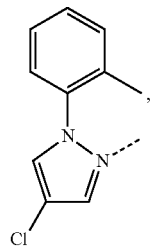
(X-42)
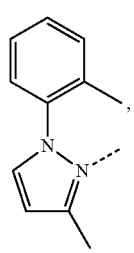
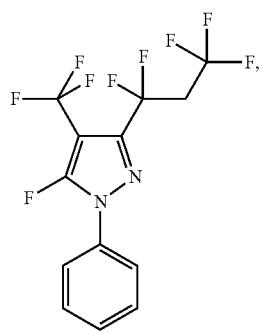
(X-43)
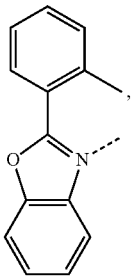
(X-44)
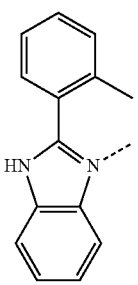
(X-45)
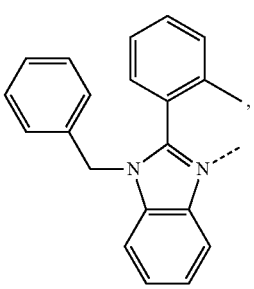
(X-46)
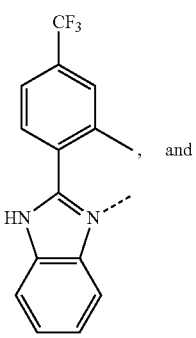
, and
(X-47)
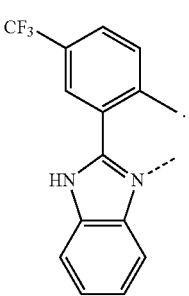

In a preferred embodiment of the present invention the compound has the formula:

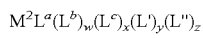  (II), wherein w=0 or 1, x=0 or 1, y=0, 1 or 2, and z=0 or 1, with the proviso that:

x=1, y+z=0 and when y=2 then z=0;

$M^2$ is Pt, Pd, Rh, Re, or Ir,

L' is a bidentate ligand or a monodentate ligand; with the proviso that: when L' is a monodentate ligand, y+z=2, and when L' is a bidentate ligand, z=0;

L" is a monodentate ligand; and $L^a$, $L^b$ and $L^c$ are alike or different from each other and each of $L^a$, $L^b$ and $L^c$ has the structure (IIIa), (IIIb), or (IV) below:

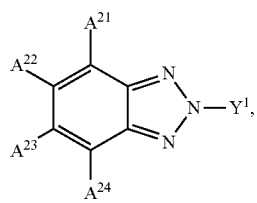 (IIIa)

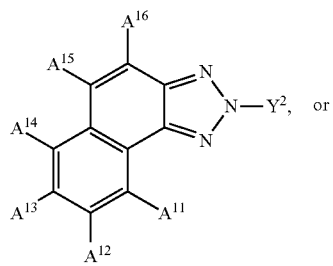 (IIIb)

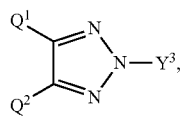 (IV)

wherein $Q^1$ and $Q^2$ are independently of each other hydrogen, $C_1$-$C_{24}$alkyl, or $C_6$-$C_{18}$aryl, which is optionally substituted by G;

$A^{21}$, $A^{22}$, $A^{23}$ and $A^{24}$ are independently of each other hydrogen, CN, halogen, $C_1$-$C_{24}$alkyl, $C_1$-$C_{24}$alkoxy, $C_1$-$C_{24}$alkylthio, $C_1$-$C_{24}$perfluoroalkyl, $C_6$-$C_{18}$aryl, which is optionally substituted by G; —$NR^{25}R^{26}$, —$CONR^{25}R^{26}$, or —$COOR^{27}$, or $C_2$-$C_{10}$heteroaryl, which is optionally substituted by G; especially a group of formula

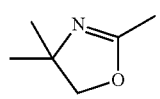 or , $A^{22}$ and $A^{23}$ are a group of formula

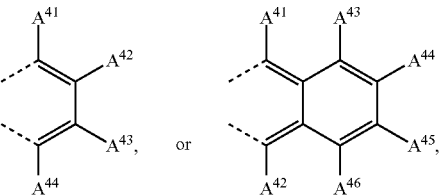

wherein $A^{41}$, $A^{42}$, $A^{43}$, $A^{44}$, $A^{45}$, $A^{46}$ and $A^{47}$ are independently of each other H, halogen, CN, $C_1$-$C_{24}$alkyl, $C_1$-$C_{24}$perfluoroalkyl, $C_1$-$C_{24}$alkoxy, $C_1$-$C_{24}$alkylthio, $C_6$-$C_{18}$aryl, which may optionally be substituted by G, —$NR^{25}R^{26}$, —$CONR^{25}R^{26}$, or —$COOR^{27}$, or $C_2$-$C_{10}$heteroaryl; especially

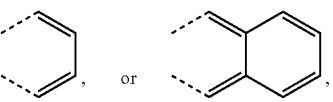

$A^{11}$, $A^{12}$, $A^{13}$, $A^{14}$, $A^{15}$ and $A^{16}$ are independently of each other H, CN, halogen, $C_1$-$C_{24}$alkyl, $C_1$-$C_{24}$perfluoroalkyl, $C_1$-$C_{24}$alkoxy, $C_1$-$C_{24}$alkylthio, $C_6$-$C_{18}$aryl, —$NR^{25}R^{26}$, —$CONR^{25}R^{26}$, or —$COOR^{27}$, or $C_2$-$C_{10}$heteroaryl, which is optionally substituted by G; wherein $E^1$ is O, S, or $NR^{25}$, $R^{25}$ and $R^{26}$ are independently of each other $C_6$-$C_{18}$aryl, $C_7$-$C_{18}$aralkyl, or $C_1$-$C_{24}$alkyl, $R^{27}$ is $C_1$-$C_{24}$alkyl, $C_6$-$C_{18}$aryl, or $C_7$-$C_{18}$aralkyl; and $Y^1$, $Y^2$ and $Y^3$ are independently of each other a group of formula

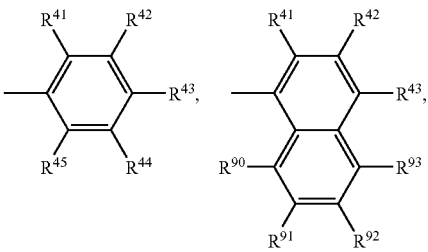

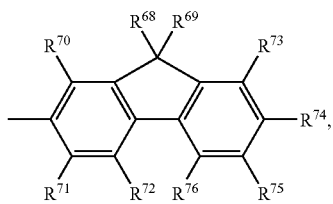

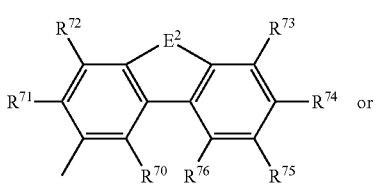

-continued

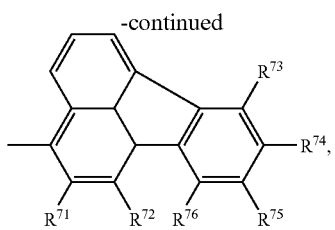

wherein
$R^{41}$ is the bond to $M^2$,
$R^{71}$ is the bond to $M^2$,
$R^{42}$ is hydrogen, or $C_1$-$C_{24}$alkyl, CN, $C_1$-$C_{24}$alkyl, which is substituted by F, halogen, especially F, $C_6$-$C_{18}$-aryl, $C_6$-$C_{18}$-aryl which is substituted by $C_1$-$C_{12}$alkyl, or $C_1$-$C_8$alkoxy,
$R^{43}$ is hydrogen, CN, halogen, especially F, $C_1$-$C_{24}$alkyl, which is substituted by F, $C_6$-$C_{18}$aryl, $C_6$-$C_{18}$aryl which is substituted by $C_1$-$C_{12}$alkyl, or $C_1$-$C_8$alkoxy, —CONR$^{25}$R$^{26}$, —COOR$^{27}$,

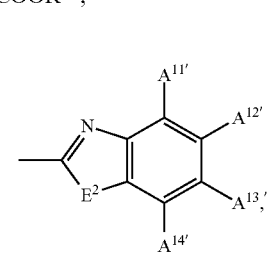

especially

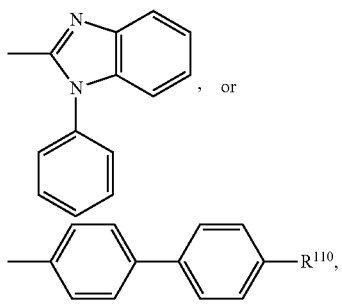

wherein
$E^2$ is —S—, —O—, or —NR$^{25'}$—, wherein $R^{25'}$ is $C_1$-$C_{24}$alkyl, or $C_6$-$C_{10}$aryl,
$R^{110}$ is H, CN, $C_1$-$C_{24}$alkyl, $C_1$-$C_{24}$alkoxy, $C_1$-$C_{24}$alkylthio, —NR$^{25}$R$^{26}$, —CONR$^{25}$R$^{26}$, or —COOR$^{27}$, or
$R^{42}$ and $R^{43}$ are a group of formula

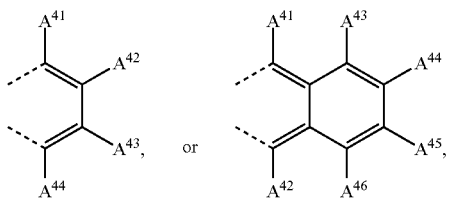

wherein $A^{41}$, $A^{42}$, $A^{43}$, $A^{44}$, $A^{45}$, $A^{46}$ and $A^{47}$ are independently of each other H, halogen, CN, $C_1$-$C_{24}$alkyl, $C_1$-$C_{24}$perfluoroalkyl, $C_1$-$C_{24}$alkoxy, $C_1$-$C_{24}$alkylthio, $C_6$-$C_{18}$aryl, which may optionally be substituted by G, —NR$^{25}$R$^{26}$, —CONR$^{25}$R$^{26}$, or —COOR$^{27}$, or $C_2$-$C_{10}$heteroaryl; especially

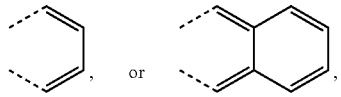

$R^{44}$ is hydrogen, CN or $C_1$-$C_{24}$alkyl, $C_1$-$C_{24}$alkyl, which is substituted by F, halogen, especially F, $C_6$-$C_{18}$-aryl, $C_6$-$C_{18}$-aryl which is substituted by $C_1$-$C_{12}$ alkyl, or $C_1$-$C_8$alkoxy,
$R^{45}$ is hydrogen, CN or $C_1$-$C_{24}$alkyl, $C_1$-$C_{24}$alkyl, which is substituted by F, halogen, especially F, $C_6$-$C_{18}$-aryl, $C_6$-$C_{18}$-aryl which is substituted by $C_1$-$C_{12}$ alkyl, or $C_1$-$C_8$alkoxy,
$A^{11'}$, $A^{12'}$, $A^{13'}$, and $A^{14'}$ are independently of each other H, halogen, CN, $C_1$-$C_{24}$alkyl, $C_1$-$C_{24}$alkoxy, $C_1$-$C_{24}$alkylthio, —NR$^{25}$R$^{26}$, —CONR$^{25}$R$^{26}$, or —COOR$^{27}$,
$R^{68}$ and $R^{69}$ are independently of each other $C_1$-$C_{24}$alkyl, especially $C_4$-$C_{12}$alkyl, especially hexyl, heptyl, 2-ethylhexyl, and octyl, which can be interrupted by one or two oxygen atoms,
$R^{70}$, $R^{72}$, $R^{73}$, $R^{74}$, $R^{75}$, $R^{76}$, $R^{90}$, $R^{91}$, $R^{92}$, and $R^{93}$ are independently of each other H, halogen, especially F, CN, $C_1$-$C_{24}$alkyl, $C_6$-$C_{10}$aryl, $C_1$-$C_{24}$alkoxy, $C_1$-$C_{24}$alkylthio, —NR$^{25}$R$^{26}$, —CONR$^{25}$R$^{26}$, or —COOR$^{27}$, wherein $R^{25}$, $R^{26}$ and $R^{27}$ are as defined above and G is $C_1$-$C_{18}$alkyl, —OR$^{305}$, —SR$^{305}$, —NR$^{305}$R$^{306}$, —CONR$^{305}$R$^{306}$, or —CN, wherein $R^{305}$ and $R^{306}$ are independently of each other $C_6$-$C_{18}$aryl; $C_6$-$C_{18}$aryl which is substituted by $C_1$-$C_{18}$alkyl, or $C_1$-$C_{18}$alkoxy; $C_1$-$C_{18}$alkyl, or $C_1$-$C_{18}$alkyl which is interrupted by —O—; or
$R^{305}$ and $R^{306}$ together form a five or six membered ring, in particular

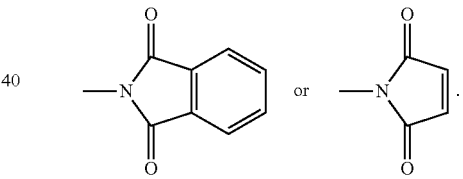

In said embodiment compounds are more preferred, wherein w=1, x=1, y=0, and z=0, and wherein w=1, x=0, y=1 and z=0, having a structure (Va), (Vb), (Vc), (Vd), (VIa), or (VIb) below:

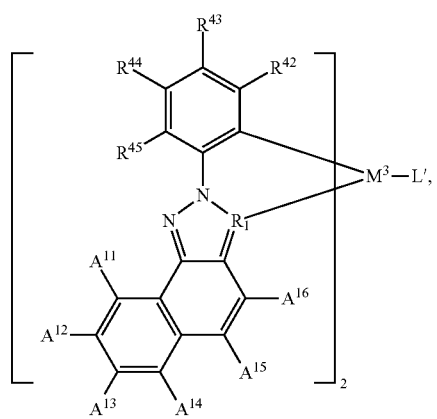

(Va)

-continued
(Vb) 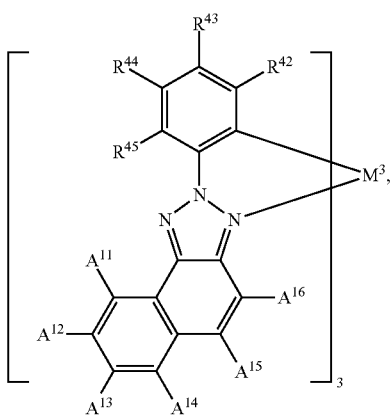
(Vc)
(Vd)
(Ve)
(Vf)
(VIa)
(VIb)
wherein
M³ is Rh, or Re, especially Ir,
Q¹ and Q² are independently of each other hydrogen, $C_1$-$C_{24}$alkyl, or $C_6$-$C_{18}$aryl,
L' is a bidentate ligand selected from
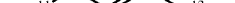

wherein $R^{11}$ and $R^{15}$ are independently of each other hydrogen, $C_1$-$C_8$alkyl, $C_6$-$C_{18}$aryl, $C_2$-$C_{10}$heteroaryl, or $C_1$-$C_8$perfluoroalkyl, $R^{12}$ and $R^{16}$ are independently of each other hydrogen, or $C_1$-$C_8$alkyl, and $R^{13}$ and $R^{17}$ are independently of each other hydrogen, $C_1$-$C_8$alkyl, $C_6$-$C_{18}$aryl, $C_2$-$C_{10}$heteroaryl, $C_1$-$C_8$perfluoroalkyl, or $C_1$-$C_8$alkoxy, and $R^{14}$ is $C_1$-$C_8$alkyl, $C_6$-$C_{10}$aryl, or $C_7$-$C_{11}$aralkyl, $R^{18}$ is $C_6$-$C_{10}$aryl, $R^{19}$ is $C_1$-$C_8$alkyl, $R^{20}$ is $C_1$-$C_8$alkyl, or $C_6$-$C_{10}$aryl, $R^{21}$ is hydrogen, $C_1$-$C_8$alkyl, or $C_1$-$C_8$alkoxy, which may be partially or fully fluorinated, $R^{22}$ and $R^{23}$ are independently of each other $C_n(H+F)_{2n+1}$, or $C_6(H+F)_5$, $R^{24}$ can be the same or different at each occurrence and is selected from H, or $C_n(H+F)_{2n+1}$, p is 2, or 3

$A^{11}$ is hydrogen, $A^{12}$ is hydrogen, $A^{13}$ is hydrogen, $A^{14}$ is hydrogen, or $C_6$-$C_{18}$aryl, $A^{15}$ is hydrogen, or $C_6$-$C_{18}$aryl, $A^{16}$ is hydrogen, $A^{21}$ is hydrogen, $A^{22}$ is hydrogen, or $C_6$-$C_{10}$aryl, $A^{23}$ is hydrogen, or $C_6$-$C_{10}$aryl, $A^{24}$ is hydrogen, $R^{42}$ is H, F, $C_1$-$C_4$alkyl, $C_1$-$C_8$alkoxy, or $C_1$-$C_4$perfluoroalkyl, $R^{43}$ is H, F, $C_1$-$C_4$alkyl, $C_1$-$C_4$perfluoroalkyl, $C_1$-$C_8$alkoxy, or $C_6$-$C_{10}$aryl, $R^{44}$ is H, F, $C_1$-$C_4$alkyl, $C_1$-$C_8$alkoxy, or $C_1$-$C_4$perfluoroalkyl, $R^{45}$ is H, F, $C_1$-$C_4$alkyl, $C_1$-$C_8$alkoxy, or $C_1$-$C_4$perfluoroalkyl and $R^{46}$ is $C_1$-$C_8$alkyl, $C_6$-$C_{18}$aryl, $C_1$-$C_8$alkoxy, or $C_6$-$C_{18}$aryl, which is substituted by $C_1$-$C_8$alkyl, or the bidentate ligand, L', is a ligand of formula (L″)

very especially a compound (X-1) to (X-47).

In another embodiment compounds are preferred having a structure ((VIIa), (VIIb), (VIIc), (VIId), (VIIIa), or (VIIIb) below:

(VIIa)

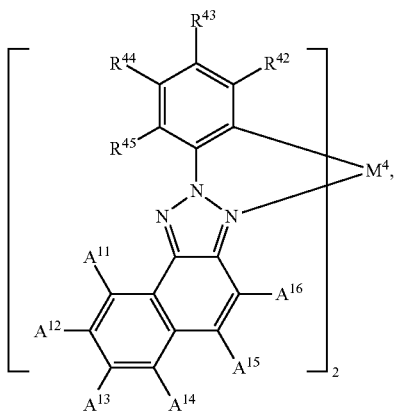

(VIIb)

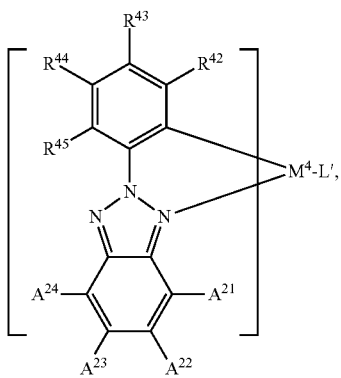

(VIIc)

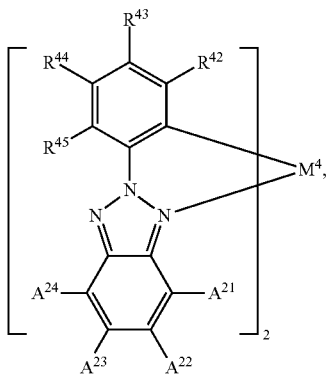

(VIId)

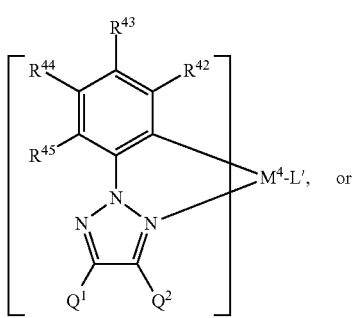

(VIIIa)

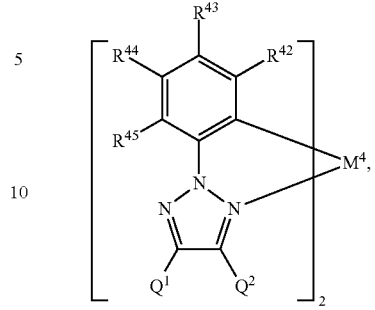

(VIIIb)

wherein $M^4$ is Pd, or Pt, and $Q^1, Q^2, L', A^{11}, A^{12}, A^{13}, A^{14}, A^{15}, A^{16}, A^{21}, A^{22}, A^{23}, A^{24}, R^{42}, R^{43}, R^{44}$ and $R^{45}$ are as defined above.

In case of the metal complex $(L^a)_2 IrL'$ three isomers can exist.

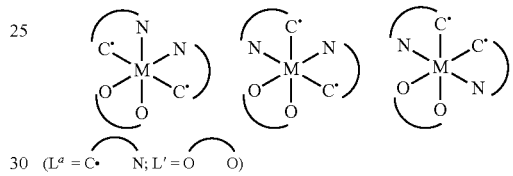

($L^a$ = C• ——— N; L' = O ——— O)

In some cases mixtures of isomers are obtained. Often the mixture can be used without isolating the individual isomers.

The at present most preferred compounds are listed below:

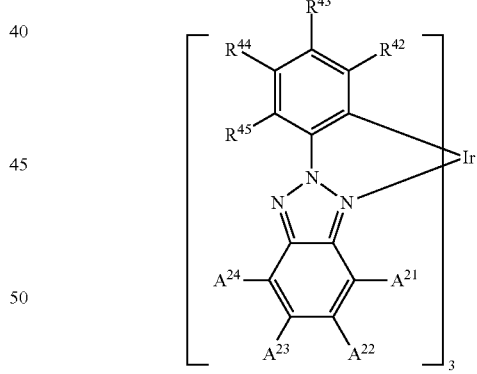

| Cpd. | $R^{45}$ | $R^{44}$ | $R^{43}$ | $R^{42}$ | $A^{24}$ | $A^{23}$ | $A^{22}$ | $A^{21}$ |
|---|---|---|---|---|---|---|---|---|
| A-1 | H | H | H | H | H | H | H | H |
| A-2 | F | H | H | H | H | H | H | H |
| A-3 | H | H | F | H | H | H | H | H |
| A-4 | F | H | F | H | H | H | H | H |
| A-5 | F | H | H | F | H | H | H | H |
| A-6 | H | H | $CF_3$ | H | H | H | H | H |
| A-7 | H | $CF_3$ | H | $CF_3$ | H | H | H | H |
| A-8 | $CF_3$ | H | H | H | H | H | H | H |
| A-9 | H | $CH_3$ | H | $CH_3$ | H | H | H | H |
| A-10 | H | H | $CH_3$ | H | H | H | H | H |
| A-11 | H | H | Ph | H | H | H | H | H |
| A-12 | H | H | OMe | H | H | H | H | H |
| A-13 | $CH_3$ | $CH_3$ | H | H | H | H | H | H |
| A-14 | $CH_3$ | H | $CH_3$ | H | H | H | H | H |

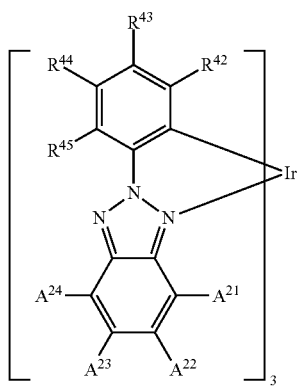

| Cpd. | R⁴⁵ | R⁴⁴ | R⁴³ | R⁴² | A²⁴ | A²³ | A²² | A²¹ |
|---|---|---|---|---|---|---|---|---|
| A-15 | H | H | Ph | H | H | H/Ph[1] | Ph/H[1] | H |
| A-16 | H | H | t-Bu | H | H | H | H | H |
| A-17 | H | [2] | H | H | H | H | H | H |

[1] mixture of isomers.
[2] 2,4,4-trimethylpent-2-yl.

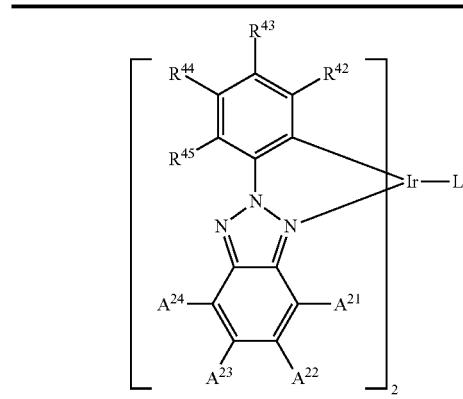

| Cpd. | L' | R⁴⁵ | R⁴⁴ | R⁴³ | R⁴² | A²⁴ | A²³ | A²² | A²¹ |
|---|---|---|---|---|---|---|---|---|---|
| B-1 | A[2] | H | H | H | H | H | H | H | H |
| B-2 | A[2] | F | H | H | H | H | H | H | H |
| B-3 | A[2] | H | H | F | H | H | H | H | H |
| B-4 | A[2] | F | H | F | H | H | H | H | H |
| B-5 | A[2] | F | H | H | F | H | H | H | H |
| B-6 | A[2] | H | H | CF₃ | H | H | H | H | H |
| B-7 | A[2] | H | CF₃ | H | CF₃ | H | H | H | H |
| B-8 | A[2] | CF₃ | H | H | H | H | H | H | H |
| B-9 | A[2] | H | CH₃ | H | CH₃ | H | H | H | H |
| B-10 | A[2] | H | H | CH₃ | H | H | H | H | H |
| B-11 | A[2] | H | H | Ph | H | H | H | H | H |
| B-12 | A[2] | H | H | OMe | H | H | H | H | H |
| B-13 | A[2] | CH₃ | CH₃ | H | H | H | H | H | H |
| B-14 | A[2] | CH₃ | H | CH₃ | H | H | H | H | H |
| B-15 | A[2] | H | H | Ph | H | H | H/Ph[1] | Ph/H[1] | H |
| B-16 | A[2] | H | t-Bu | H | H | H | H | H | H |
| B-17 | B[2] | H | H | H | H | H | H | H | H |
| B-18 | B[2] | F | F | H | H | H | H | H | H |
| B-19 | B[2] | H | H | F | H | H | H | H | H |
| B-20 | B[2] | F | H | F | H | H | H | H | H |
| B-21 | B[2] | F | F | H | H | F | H | H | H |
| B-22 | B[2] | H | H | H | CF₃ | H | H | H | H |
| B-23 | B[2] | H | H | CF₃ | H | CF₃ | H | H | H |
| B-24 | B[2] | CF₃ | CF₃ | H | H | H | H | H | H |

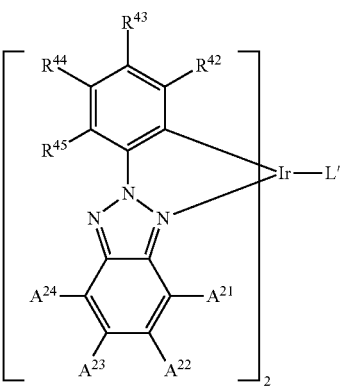

| Cpd. | L' | R⁴⁵ | R⁴⁴ | R⁴³ | R⁴² | A²⁴ | A²³ | A²² | A²¹ |
|---|---|---|---|---|---|---|---|---|---|
| B-25 | B[2] | H | H | CH₃ | H | CH₃ | H | H | H |
| B-26 | B[2] | H | H | CH₃ | H | H | H | H | H |
| B-27 | B[2] | H | H | Ph | H | H | H | H | H |
| B-28 | B[2] | H | H | OMe | H | H | H | H | H |
| B-29 | B[2] | CH₃ | CH₃ | CH₃ | H | H | H | H | H |
| B-30 | B[2] | CH₃ | CH₃ | H | CH₃ | H | H | H | H |
| B-31 | B[2] | H | H | H | Ph | H | H | H/Ph[1] | Ph/H[1] |
| B-32 | B[2] | H | H | t-Bu | H | H | H | H | H |
| B-33 | C[2] | H | H | H | H | H | H | H | H |
| B-34 | C[2] | F | H | H | H | H | H | H | H |
| B-35 | C[2] | H | H | F | H | H | H | H | H |
| B-36 | C[2] | F | H | F | H | H | H | H | H |
| B-37 | C[2] | F | H | H | F | H | H | H | H |
| B-38 | C[2] | H | H | CF₃ | H | H | H | H | H |
| B-39 | C[2] | H | CF₃ | H | CF₃ | H | H | H | H |
| B-40 | C[2] | CF₃ | H | H | H | H | H | H | H |
| B-41 | C[2] | H | CH₃ | H | CH₃ | H | H | H | H |
| B-42 | C[2] | H | H | CH₃ | H | H | H | H | H |
| B-43 | C[2] | H | H | Ph | H | H | H | H | H |
| B-44 | C[2] | H | H | OMe | H | H | H | H | H |
| B-45 | C[2] | CH₃ | CH₃ | H | H | H | H | H | H |
| B-46 | C[2] | CH₃ | H | CH₃ | H | H | H | H | H |
| B-47 | C[2] | H | H | Ph | H | H | H/Ph[1] | Ph/H[1] | H |
| B-48 | C[2] | H | t-Bu | H | H | H | H | H | H |
| B-49 | D[2] | H | H | H | H | H | H | H | H |
| B-50 | D[2] | F | H | H | H | H | H | H | H |
| B-51 | D[2] | H | H | F | H | H | H | H | H |
| B-52 | D[2] | F | H | F | H | H | H | H | H |
| B-53 | D[2] | F | H | H | F | H | H | H | H |
| B-54 | D[2] | H | H | CF₃ | H | H | H | H | H |
| B-55 | D[2] | H | CF₃ | H | CF₃ | H | H | H | H |
| B-56 | D[2] | CF₃ | H | H | H | H | H | H | H |
| B-57 | D[2] | H | CH₃ | H | CH₃ | H | H | H | H |
| B-58 | D[2] | H | H | CH₃ | H | H | H | H | H |
| B-59 | D[2] | H | H | Ph | H | H | H | H | H |
| B-60 | D[2] | H | H | OMe | H | H | H | H | H |
| B-61 | D[2] | CH₃ | CH₃ | H | H | H | H | H | H |
| B-62 | D[2] | CH₃ | H | CH₃ | H | H | H | H | H |
| B-63 | D[2] | H | H | Ph | H | H | H/Ph[1] | Ph/H[1] | H |
| B-64 | D[2] | H | t-Bu | H | H | H | H | H | H |
| B-65 | A | H | [3] | H | H | H | H | H | H |

-continued

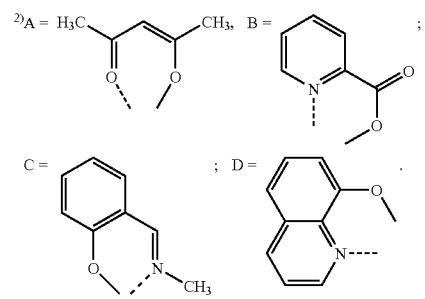

| Cpd. | L' | R45 | R44 | R43 | R42 | A24 | A23 | A22 | A21 |
|---|---|---|---|---|---|---|---|---|---|
| B-66 | B | H | 3) | H | H | H | H | H | H |
| B-67 | C | H | 3) | H | H | H | H | H | H |
| B-68 | D | H | 3) | H | H | H | H | H | H |

1) mixture of isomers.

2) A = H₃C―C(O)=C(CH₃)―O―  ,  B = pyridine-2-carboxylate;

C = 2-methoxybenzylidene-N-methylamine ;  D = 8-methoxyquinoline.

3) 2,4,4-trimethylpent-2-yl.

[Structure with Q1, Q2, R42-R45, Ir-L']

| Cpd. | R45 | R44 | R43 | R42 | Q1 | Q2 |
|---|---|---|---|---|---|---|
| C-1 | H | H | H | H | H | H |
| C-2 | F | H | H | H | H | H |
| C-3 | H | H | F | H | H | H |
| C-4 | H | H | F | F | H | H |
| C-5 | F | H | H | F | H | H |
| C-6 | H | H | CF₃ | H | H | H |
| C-7 | H | CF₃ | H | CF₃ | H | H |
| C-8 | CF₃ | H | H | H | H | H |
| C-9 | H | CH₃ | H | CH₃ | H | H |
| C-10 | H | H | CH₃ | H | H | H |
| C-11 | H | H | Ph | H | H | H |
| C-12 | H | H | Ome | H | H | H |
| C-13 | CH₃ | CH₃ | H | H | H | H |

-continued

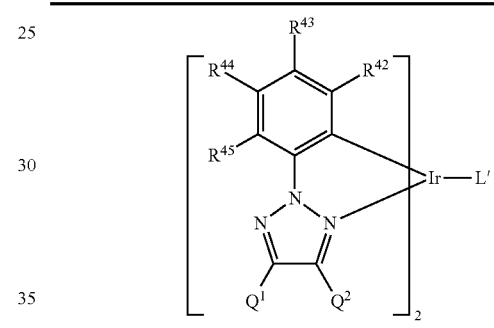

| Cpd. | R45 | R44 | R43 | R42 | Q1 | Q2 |
|---|---|---|---|---|---|---|
| C-14 | CH₃ | H | CH₃ | H | H | H |
| C-15 | H | H | Ph | H | H/Ph¹⁾ | Ph/H¹⁾ |
| C-16 | H | H | t-Bu | H | H | H |

1) mixture of isomers.

[Structure with Q1, Q2, R42-R45, Ir-L']

| Cpd. | L' | R45 | R44 | R43 | R42 | Q1 | Q2 |
|---|---|---|---|---|---|---|---|
| D-1 | A²⁾ | H | H | H | H | H | H |
| D-2 | A²⁾ | F | H | H | H | H | H |
| D-3 | A²⁾ | H | H | F | H | H | H |
| D-4 | A²⁾ | F | H | F | H | H | H |
| D-5 | A²⁾ | F | H | H | F | H | H |
| D-6 | A²⁾ | H | H | CF₃ | H | H | H |
| D-7 | A²⁾ | H | CF₃ | H | CF₃ | H | H |
| D-8 | A²⁾ | CF₃ | H | H | H | H | H |
| D-9 | A²⁾ | H | CH₃ | H | CH₃ | H | H |
| D-10 | A²⁾ | H | H | CH₃ | H | H | H |
| D-11 | A²⁾ | H | H | Ph | H | H | H |
| D-12 | A²⁾ | H | H | OMe | H | H | H |
| D-13 | A²⁾ | CH₃ | CH₃ | H | H | H | H |
| D-14 | A²⁾ | CH₃ | H | CH₃ | H | H | H |
| D-15 | A²⁾ | H | H | Ph | H | H/Ph¹⁾ | Ph/H¹⁾ |
| D-16 | A²⁾ | H | t-Bu | H | H | H | H |
| D-17 | B²⁾ | H | H | H | H | H | H |
| D-18 | B²⁾ | F | H | H | H | H | H |
| D-19 | B²⁾ | H | H | F | H | H | H |
| D-20 | B²⁾ | F | H | F | H | H | H |
| D-21 | B²⁾ | F | H | H | F | H | H |
| D-22 | B²⁾ | H | H | CF₃ | H | H | H |
| D-23 | B²⁾ | H | CF₃ | H | CF₃ | H | H |
| D-24 | B²⁾ | CF₃ | H | H | H | H | H |
| D-25 | B²⁾ | H | CH₃ | H | CH₃ | H | H |
| D-26 | B²⁾ | H | H | CH₃ | H | H | H |
| D-27 | 6²⁾ | H | H | Ph | H | H | H |
| D-28 | B²⁾ | H | H | OMe | H | H | H |
| D-29 | B²⁾ | CH₃ | CH₃ | H | H | H | H |
| D-30 | B²⁾ | CH₃ | H | CH₃ | H | H | H |
| D-31 | B²⁾ | H | H | Ph | H | H/Ph¹⁾ | Ph/H¹⁾ |
| D-32 | B²⁾ | H | t-Bu | H | H | H | H |
| D-33 | C²⁾ | H | H | H | H | H | H |
| D-34 | C²⁾ | F | H | H | H | H | H |
| D-35 | C²⁾ | H | H | F | H | H | H |

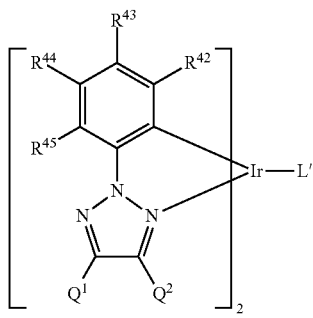
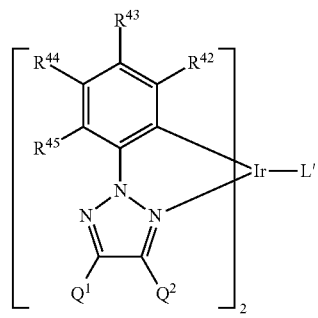

| Cpd. | L' | R45 | R44 | R43 | R42 | Q1 | Q2 |
|---|---|---|---|---|---|---|---|
| D-36 | C[2] | F | H | F | H | H | H |
| D-37 | C[2] | F | H | H | F | H | H |
| D-38 | C[2] | H | H | CF$_3$ | H | H | H |
| D-39 | C[2] | H | CF$_3$ | H | CF$_3$ | H | H |
| D-40 | C[2] | CF$_3$ | H | H | H | H | H |
| D-41 | C[2] | H | CH$_3$ | H | CH$_3$ | H | H |
| D-42 | C[2] | H | H | CH$_3$ | H | H | H |
| D-43 | C[2] | H | H | Ph | H | H | H |
| D-44 | C[2] | H | H | OMe | H | H | H |
| D-45 | C[2] | CH$_3$ | CH$_3$ | H | H | H | H |
| D-46 | C[2] | CH$_3$ | H | CH$_3$ | H | H | H |
| D-47 | C[2] | H | H | Ph | H | H/Ph[1] | Ph/H[1] |
| D-48 | C[2] | H | t-Bu | H | H | H | H |
| D-49 | D[2] | H | H | H | H | H | H |
| D-50 | D[2] | F | H | H | H | H | H |
| D-51 | D[2] | H | H | F | H | H | H |
| D-52 | D[2] | F | H | F | H | H | H |
| D-53 | D[2] | F | H | H | F | H | H |
| D-54 | D[2] | H | H | CF$_3$ | H | H | H |
| D-55 | D[2] | H | CF$_3$ | H | CF$_3$ | H | H |
| D-56 | D[2] | CF$_3$ | H | H | H | H | H |
| D-57 | D[2] | H | CH$_3$ | H | CH$_3$ | H | H |
| D-58 | D[2] | H | H | CH$_3$ | H | H | H |
| D-59 | D[2] | H | H | Ph | H | H | H |
| D-60 | D[2] | H | H | OMe | H | H | H |
| D-61 | D[2] | CH$_3$ | CH$_3$ | H | H | H | H |
| D-62 | D[2] | CH$_3$ | H | CH$_3$ | H | H | H |
| D-63 | D[2] | H | H | Ph | H | H/Ph[1] | Ph/H[1] |
| D-64 | D[2] | H | t-Bu | H | H | H | H |
| D-65 | E[2] | H | H | H | H | H | H |
| D-66 | E[2] | F | H | H | H | H | H |
| D-67 | E[2] | H | H | F | H | H | H |

| Cpd. | L' | R45 | R44 | R43 | R42 | Q1 | Q2 |
|---|---|---|---|---|---|---|---|
| D-68 | E[2] | F | H | F | H | H | H |
| D-69 | E[2] | F | H | H | F | H | H |
| D-70 | E[2] | H | H | CF$_3$ | H | H | H |
| D-71 | E[2] | H | CF$_3$ | H | CF$_3$ | H | H |
| D-72 | E[2] | CF$_3$ | H | H | H | H | H |
| D-73 | E[2] | H | CH$_3$ | H | CH$_3$ | H | H |
| D-74 | E[2] | H | H | CH$_3$ | H | H | H |
| D-75 | E[2] | H | H | Ph | H | H | H |
| D-76 | E[2] | H | H | OMe | H | H | H |
| D-77 | E[2] | CH$_3$ | CH$_3$ | H | H | H | H |
| D-78 | E[2] | CH$_3$ | H | CH$_3$ | H | H | H |
| D-79 | E[2] | H | H | Ph | H | H/Ph[1] | Ph/H[1] |
| D-80 | E[2] | H | t-Bu | H | H | H | H |

[1] mixture of isomers.

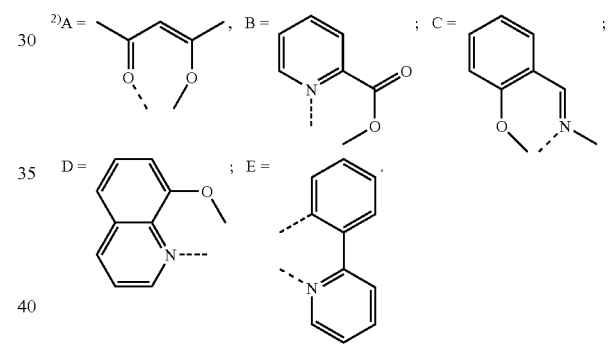

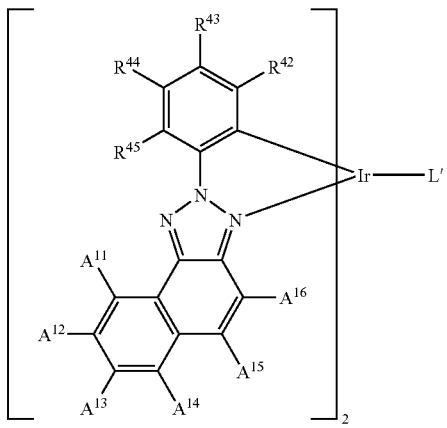

| Cpd. | L' | R45 | R44 | R43 | R42 | A11 | A12 | A13 | A14 | A15 | A16 |
|---|---|---|---|---|---|---|---|---|---|---|---|
| E-1 | A[2] | H | H | CH$_3$ | H | H | H | H | H | H | H |
| E-2 | A[2] | H | H | H | H | H | H | H | H | H | H |
| E-3 | A[2] | F | H | H | H | H | H | H | H | H | H |

-continued

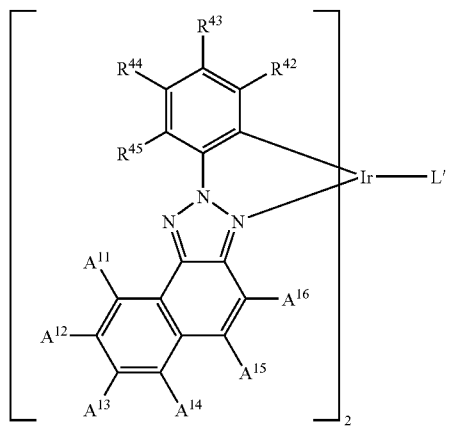

| Cpd. | L' | R45 | R44 | R43 | R42 | A11 | A12 | A13 | A14 | A15 | A16 |
|---|---|---|---|---|---|---|---|---|---|---|---|
| E-4 | A[2)] | H | H | F | H | H | H | H | H | H | H |
| E-5 | A[2)] | F | H | F | H | H | H | H | H | H | H |
| E-6 | A[2)] | F | H | H | F | H | H | H | H | H | H |
| E-7 | A[2)] | H | H | CF$_3$ | H | H | H | H | H | H | H |
| E-8 | A[2)] | H | CF$_3$ | H | CF$_3$ | H | H | H | H | H | H |
| E-9 | A[2)] | CF$_3$ | H | H | H | H | H | H | H | H | H |
| E-10 | A[2)] | H | CH$_3$ | H | CH$_3$ | H | H | H | H | H | H |
| E-11 | A[2)] | H | t-Bu | H | H | H | H | H | H | H | H |
| E-12 | A[2)] | H | H | Ph | H | H | H | H | H | H | H |
| E-13 | A[2)] | H | H | OMe | H | H | H | H | H | H | H |
| E-14 | A[2)] | CH$_3$ | CH$_3$ | H | H | H | H | H | H | H | H |
| E-15 | A[2)] | CH$_3$ | H | CH$_3$ | H | H | H | H | H | H | H |
| E-16 | A[2)] | H | H | Ph | H | H | H | H | H/Ph[1)] | Ph/H[1)] | H |
| E-17 | B[2)] | H | H | CH$_3$ | H | H | H | H | H | H | H |
| E-18 | B[2)] | H | H | H | H | H | H | H | H | H | H |
| E-19 | B[2)] | F | H | H | H | H | H | H | H | H | H |
| E-20 | B[2)] | H | H | F | H | H | H | H | H | H | H |
| E-21 | B[2)] | F | H | F | H | H | H | H | H | H | H |
| E-22 | B[2)] | F | H | H | F | H | H | H | H | H | H |
| E-23 | B[2)] | H | H | CF$_3$ | H | H | H | H | H | H | H |
| E-24 | B[2)] | H | CF$_3$ | H | CF$_3$ | H | H | H | H | H | H |
| E-25 | B[2)] | CF$_3$ | H | H | H | H | H | H | H | H | H |
| E-26 | B[2)] | H | CH$_3$ | H | CH$_3$ | H | H | H | H | H | H |
| E-27 | B[2)] | H | t-Bu | H | H | H | H | H | H | H | H |
| E-28 | B[2)] | H | H | Ph | H | H | H | H | H | H | H |
| E-29 | B[2)] | H | H | OMe | H | H | H | H | H | H | H |
| E-30 | B[2)] | CH$_3$ | CH$_3$ | H | H | H | H | H | H | H | H |
| E-31 | B[2)] | CH$_3$ | H | CH$_3$ | H | H | H | H | H | H | H |
| E-32 | B[2)] | H | H | Ph | H | H | H | H | H/Ph[1)] | Ph/H[1)] | H |
| E-33 | C[2)] | H | H | CH$_3$ | H | H | H | H | H | H | H |
| E-34 | C[2)] | H | H | H | H | H | H | H | H | H | H |
| E-35 | C[2)] | F | H | H | H | H | H | H | H | H | H |
| E-36 | C[2)] | H | H | F | H | H | H | H | H | H | H |
| E-37 | C[2)] | F | H | F | H | H | H | H | H | H | H |
| E-38 | C[2)] | F | H | H | F | H | H | H | H | H | H |
| E-39 | C[2)] | H | H | CF$_3$ | H | H | H | H | H | H | H |
| E-40 | C[2)] | H | CF$_3$ | H | CF$_3$ | H | H | H | H | H | H |
| E-41 | C[2)] | CF$_3$ | H | H | H | H | H | H | H | H | H |
| E-42 | C[2)] | H | CH$_3$ | H | CH$_3$ | H | H | H | H | H | H |
| E-43 | C[2)] | H | t-Bu | H | H | H | H | H | H | H | H |
| E-44 | C[2)] | H | H | Ph | H | H | H | H | H | H | H |
| E-45 | C[2)] | H | H | OMe | H | H | H | H | H | H | H |
| E-46 | C[2)] | CH$_3$ | CH$_3$ | H | H | H | H | H | H | H | H |
| E-47 | C[2)] | CH$_3$ | H | CH$_3$ | H | H | H | H | H | H | H |
| E-48 | C[2)] | H | H | Ph | H | H | H | H | H/Ph[1)] | Ph/H[1)] | H |
| E-49 | D[2)] | H | H | CH$_3$ | H | H | H | H | H | H | H |
| E-50 | D[2)] | H | H | H | H | H | H | H | H | H | H |
| E-51 | D[2)] | F | H | H | H | H | H | H | H | H | H |
| E-52 | D[2)] | H | H | F | H | H | H | H | H | H | H |
| E-53 | D[2)] | F | H | F | H | H | H | H | H | H | H |
| E-54 | D[2)] | F | H | H | F | H | H | H | H | H | H |
| E-55 | D[2)] | H | H | CF$_3$ | H | H | H | H | H | H | H |
| E-56 | D[2)] | H | CF$_3$ | H | CF$_3$ | H | H | H | H | H | H |
| E-57 | D[2)] | CF$_3$ | H | H | H | H | H | H | H | H | H |
| E-58 | D[2)] | H | CH$_3$ | H | CH$_3$ | H | H | H | H | H | H |
| E-59 | D[2)] | H | t-Bu | H | H | H | H | H | H | H | H |
| E-60 | D[2)] | H | H | Ph | H | H | H | H | H | H | H |

-continued

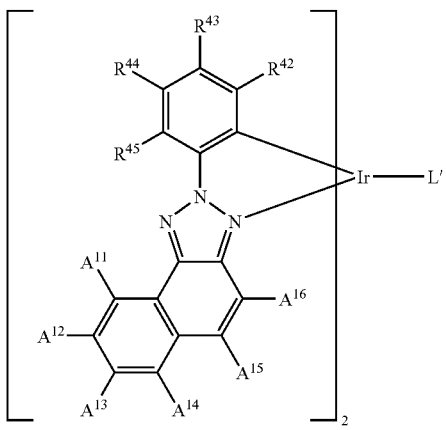

| Cpd. | L' | R45 | R44 | R43 | R42 | A11 | A12 | A13 | A14 | A15 | A16 |
|---|---|---|---|---|---|---|---|---|---|---|---|
| E-61 | D[2)] | H | H | OMe | H | H | H | H | H | H | H |
| E-62 | D[2)] | CH3 | CH3 | H | H | H | H | H | H | H | H |
| E-63 | D[2)] | CH3 | H | CH3 | H | H | H | H | H | H | H |
| E-64 | D[2)] | H | H | Ph | H | H | H | H | H/Ph[1)] | Ph/H[1)] | H |
| E-65 | E[2)] | H | H | H | H | H | H | H | H | E-65 | E[2)] |
| E-66 | E[2)] | F | H | H | H | H | H | H | H | E-66 | E[2)] |
| E-67 | E[2)] | H | H | F | H | H | H | H | H | E-67 | E[2)] |
| E-68 | E[2)] | F | H | F | H | H | H | H | H | E-68 | E[2)] |
| E-69 | E[2)] | F | H | H | F | H | H | H | H | E-69 | E[2)] |
| E-70 | E[2)] | H | H | CF3 | H | H | H | H | H | E-70 | E[2)] |
| E-71 | E[2)] | H | CF3 | H | CF3 | H | H | H | H | E-71 | E[2)] |
| E-72 | E[2)] | CF3 | H | H | H | H | H | H | H | E-72 | E[2)] |
| E-73 | E[2)] | H | CH3 | H | CH3 | H | H | H | H | E-73 | E[2)] |
| E-74 | E[2)] | H | H | CH3 | H | H | H | H | H | E-74 | E[2)] |
| E-75 | E[2)] | H | H | Ph | H | H | H | H | H | E-75 | E[2)] |
| E-76 | E[2)] | H | H | OMe | H | H | H | H | H | E-76 | E[2)] |
| E-77 | E[2)] | CH3 | CH3 | H | H | H | H | H | H | E-77 | E[2)] |
| E-78 | E[2)] | CH3 | H | CH3 | H | H | H | H | H | E-78 | E[2)] |
| E-79 | E[2)] | H | H | Ph | H | H | H/Ph[1)] | Ph/H[1)] | H | E-79 | E[2)] |
| E-80 | E[2)] | H | t-Bu | H | H | H | H | H | H | E-80 | E[2)] |
| E-81 | E[2)] | H | [3)] | H | H | H | H | H | H | E-81 | E[2)] |

[1)] mixture of isomers.

[2)] A = 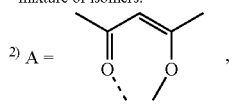,

B = 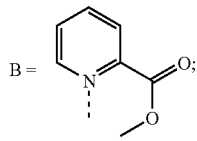;

C = 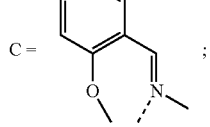;

D = 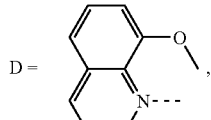;

E = 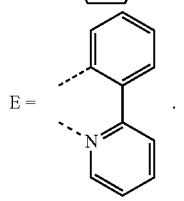.

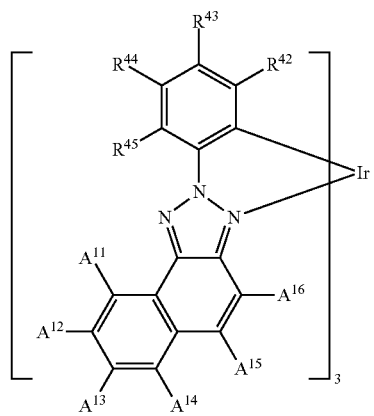

| Cpd. | R45 | R44 | R43 | R42 | A11 | A12 | A13 | A14 | A15 | A16 |
|---|---|---|---|---|---|---|---|---|---|---|
| F-1 | H | H | H | H | H | H | H | H | H | H |
| F-2 | F | H | H | H | H | H | H | H | H | H |
| F-3 | H | H | F | H | H | H | H | H | H | H |
| F-4 | F | H | F | H | H | H | H | H | H | H |
| F-5 | F | H | H | F | H | H | H | H | H | H |
| F-6 | H | H | CF3 | H | H | H | H | H | H | H |
| F-7 | H | CF3 | H | CF3 | H | H | H | H | H | H |
| F-8 | CF3 | H | H | H | H | H | H | H | H | H |
| F-9 | H | CH3 | H | CH3 | H | H | H | H | H | H |
| F-10 | H | H | CH3 | H | H | H | H | H | H | H |
| F-11 | H | H | Ph | H | H | H | H | H | H | H |
| F-12 | H | H | OMe | H | H | H | H | H | H | H |
| F-13 | CH3 | CH3 | H | H | H | H | H | H | H | H |
| F-14 | CH3 | H | CH3 | H | H | H | H | H | H | H |
| F-15 | H | H | Ph | H | H | H | H | H | Ph | H |
| F-16 | H | H | t-Bu | H | H | H | H | H | H | H |

1) mixture of isomers.

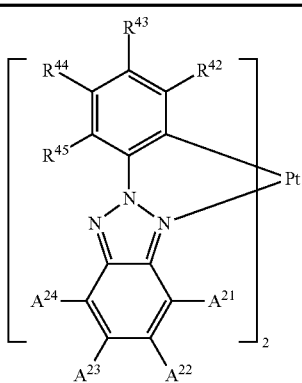

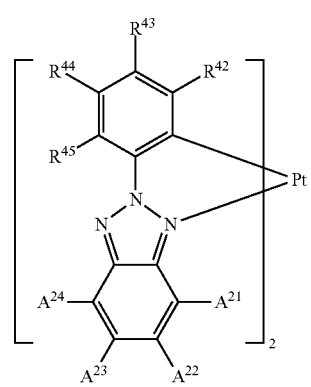

| Cpd. | R45 | R44 | R43 | R42 | A24 | A23 | A22 | A21 |
|---|---|---|---|---|---|---|---|---|
| G-1 | H | H | H | H | H | H | H | H |
| G-2 | F | H | H | H | H | H | H | H |
| G-3 | H | H | F | H | H | H | H | H |
| G-4 | F | H | F | H | H | H | H | H |
| G-5 | F | H | H | F | H | H | H | H |
| G-6 | H | H | CF3 | H | H | H | H | H |
| G-7 | H | CF3 | H | CF3 | H | H | H | H |
| G-8 | CF3 | H | H | H | H | H | H | H |
| G-9 | H | CH3 | H | CH3 | H | H | H | H |
| G-10 | H | H | CH3 | H | H | H | H | H |
| G-11 | H | H | Ph | H | H | H | H | H |
| G-12 | H | H | OMe | H | H | H | H | H |
| G-13 | CH3 | CH3 | H | H | H | H | H | H |
| G-14 | CH3 | H | CH3 | H | H | H | H | H |
| G-15 | H | H | Ph | H | H | H/Ph[1] | Ph/H[1] | H |
| G-16 | H | H | t-Bu | H | H | H | H | H |

1) mixture of isomers.

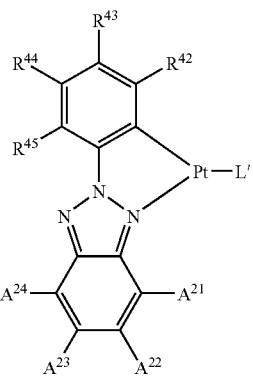

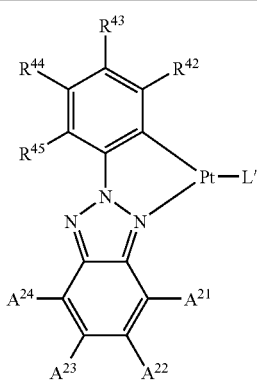

| Cpd. | L' | R45 | R44 | R43 | R42 | A24 | A23 | A22 | A21 |
|---|---|---|---|---|---|---|---|---|---|
| H-1 | A[2)] | H | H | H | H | H | H | H | H |
| H-2 | A[2)] | F | H | H | H | H | H | H | H |
| H-3 | A[2)] | H | H | F | H | H | H | H | H |
| H-4 | A[2)] | F | F | H | H | H | H | H | H |
| H-5 | A[2)] | F | H | H | F | H | H | H | H |
| H-6 | A[2)] | H | H | CF3 | H | H | H | H | H |
| H-7 | A[2)] | H | CF3 | H | CF3 | H | H | H | H |
| H-8 | A[2)] | CF3 | H | H | H | H | H | H | H |
| H-9 | A[2)] | H | CH3 | H | CH3 | H | H | H | H |
| H-10 | A[2)] | H | H | CH3 | H | H | H | H | H |
| H-11 | A[2)] | H | H | Ph | H | H | H | H | H |
| H-12 | A[2)] | H | H | OMe | H | H | H | H | H |
| H-13 | A[2)] | CH3 | CH3 | H | H | H | H | H | H |
| H-14 | A[2)] | CH3 | H | CH3 | H | H | H | H | H |
| H-15 | A[2)] | H | H | Ph | H | H | H/Ph[1)] | Ph/H[1)] | H |
| H-16 | A[2)] | H | t-Bu | H | H | H | H | H | H |
| H-17 | B[2)] | H | H | H | H | H | H | H | H |
| H-18 | B[2)] | F | F | H | H | H | H | H | H |
| H-19 | B[2)] | H | H | H | F | H | H | H | H |
| H-20 | B[2)] | F | F | H | F | H | H | H | H |
| H-21 | B[2)] | F | F | H | H | F | H | H | H |
| H-22 | B[2)] | H | H | H | CF3 | H | H | H | H |
| H-23 | B[2)] | H | H | CF3 | H | CF3 | H | H | H |
| H-24 | B[2)] | CF3 | CF3 | H | H | H | H | H | H |
| H-25 | B[2)] | H | H | CH3 | CH3 | H | H | H | H |
| H-26 | B[2)] | H | H | H | CH3 | H | H | H | H |
| H-27 | B[2)] | H | H | H | Ph | H | H | H | H |
| H-28 | B[2)] | H | H | H | OMe | H | H | H | H |
| H-29 | B[2)] | CH3 | CH3 | CH3 | H | H | H | H | H |
| H-30 | B[2)] | CH3 | CH3 | H | CH3 | H | H | H | H |
| H-31 | B[2)] | H | H | H | Ph | H | H | H/Ph[1)] | Ph/H[1)] |
| H-32 | B[2)] | H | H | t-Bu | H | H | H | H | H |
| H-33 | C[2)] | H | H | H | H | H | H | H | H |
| H-34 | C[2)] | F | H | H | H | H | H | H | H |
| H-35 | C[2)] | H | H | F | H | H | H | H | H |
| H-36 | C[2)] | F | F | H | H | H | H | H | H |
| H-37 | C[2)] | F | H | H | F | H | H | H | H |
| H-38 | C[2)] | H | H | CF3 | H | H | H | H | H |
| H-39 | C[2)] | H | CF3 | H | CF3 | H | H | H | H |
| H-40 | C[2)] | CF3 | H | H | H | H | H | H | H |
| H-41 | C[2)] | H | CH3 | H | CH3 | H | H | H | H |
| H-42 | C[2)] | H | H | CH3 | H | H | H | H | H |
| H-43 | C[2)] | H | H | Ph | H | H | H | H | H |
| H-44 | C[2)] | H | H | OMe | H | H | H | H | H |
| H-45 | C[2)] | CH3 | CH3 | H | H | H | H | H | H |
| H-46 | C[2)] | CH3 | H | CH3 | H | H | H | H | H |
| H-47 | C[2)] | H | H | Ph | H | H | H/Ph[1)] | Ph/H[1)] | H |
| H-48 | C[2)] | H | t-Bu | H | H | H | H | H | H |
| H-49 | D[2)] | H | H | H | H | H | H | H | H |
| H-50 | D[2)] | F | H | H | H | H | H | H | H |
| H-51 | D[2)] | H | H | F | H | H | H | H | H |
| H-52 | D[2)] | F | F | H | H | H | H | H | H |
| H-53 | D[2)] | F | H | H | F | H | H | H | H |
| H-54 | D[2)] | H | H | CF3 | H | H | H | H | H |
| H-55 | D[2)] | H | CF3 | H | CF3 | H | H | H | H |
| H-56 | D[2)] | CF3 | H | H | H | H | H | H | H |
| H-57 | D[2)] | H | CH3 | H | CH3 | H | H | H | H |
| H-58 | D[2)] | H | H | CH3 | H | H | H | H | H |
| H-59 | D[2)] | H | H | Ph | H | H | H | H | H |
| H-60 | D[2)] | H | H | OMe | H | H | H | H | H |
| H-61 | D[2)] | CH3 | CH3 | H | H | H | H | H | H |
| H-62 | D[2)] | CH3 | H | CH3 | H | H | H | H | H |
| H-63 | D[2)] | H | H | Ph | H | H | H/Ph[1)] | Ph/H[1)] | H |
| H-64 | D[2)] | H | t-Bu | H | H | H | H | H | H |
| H-65 | A | H | [3)] | H | H | H | H | H | H |
| H-66 | B | H | [3)] | H | H | H | H | H | H |
| H-67 | C | H | [3)] | H | H | H | H | H | H |
| H-68 | D | H | [3)] | H | H | H | H | H | H |
| H-69 | E[2)] | H | H | H | H | H | H | H | H |
| H-70 | E[2)] | F | H | H | H | H | H | H | H |
| H-71 | E[2)] | H | H | F | H | H | H | H | H |
| H-72 | E[2)] | F | F | H | H | H | H | H | H |
| H-73 | E[2)] | F | H | H | F | H | H | H | H |
| H-74 | E[2)] | H | H | CF3 | H | H | H | H | H |
| H-75 | E[2)] | H | CF3 | H | CF3 | H | H | H | H |
| H-76 | E[2)] | CF3 | H | H | H | H | H | H | H |
| H-77 | E[2)] | H | CH3 | H | CH3 | H | H | H | H |
| H-78 | E[2)] | H | H | CH3 | H | H | H | H | H |
| H-79 | E[2)] | H | H | Ph | H | H | H | H | H |
| H-80 | E[2)] | H | H | OMe | H | H | H | H | H |
| H-81 | E[2)] | CH3 | CH3 | H | H | H | H | H | H |
| H-82 | E[2)] | CH3 | H | CH3 | H | H | H | H | H |
| H-83 | E[2)] | H | H | Ph | H | H | H/Ph[1)] | Ph/H[1)] | H |
| H-84 | E[2)] | H | t-Bu | H | H | H | H | H | H |
| H-85 | E[2)] | H | [3)] | H | H | H | H | H | H |

[1)]mixture of isomers.

[2)] A = 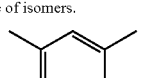 ,

B = 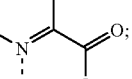 ;

C = 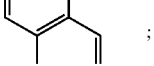 ;

-continued

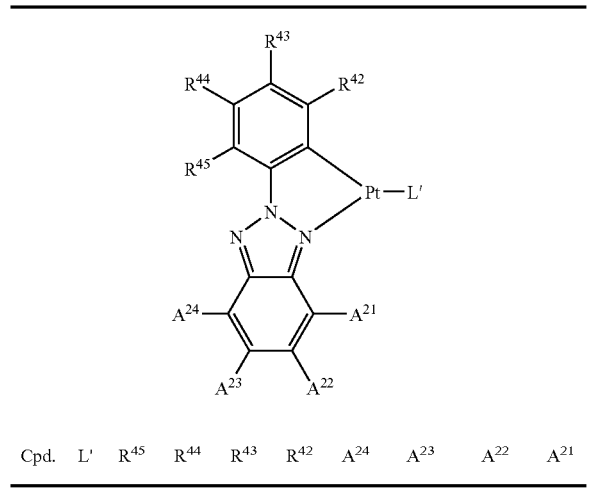

| Cpd. | L' | R45 | R44 | R43 | R42 | A24 | A23 | A22 | A21 |
|------|----|----|-----|-----|-----|-----|-----|-----|-----|

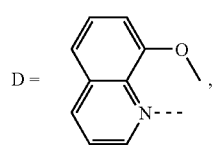

D =

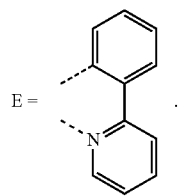

E =

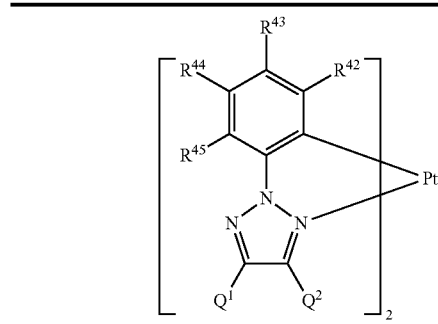

| Cpd. | R45 | R44 | R43 | R42 | Q1 | Q2 |
|------|-----|-----|-----|-----|----|----|
| I-1  | H   | H   | H   | H   | H  | H  |
| I-2  | F   | H   | H   | H   | H  | H  |
| I-3  | H   | H   | F   | H   | H  | H  |
| I-4  | F   | H   | F   | H   | H  | H  |
| I-5  | F   | H   | H   | F   | H  | H  |
| I-6  | H   | H   | CF3 | H   | H  | H  |
| I-7  | H   | CF3 | H   | CF3 | H  | H  |
| I-8  | CF3 | H   | H   | H   | H  | H  |
| I-9  | H   | CH3 | H   | CH3 | H  | H  |
| I-10 | H   | H   | CH3 | H   | H  | H  |
| I-11 | H   | H   | Ph  | H   | H  | H  |
| I-12 | H   | H   | Ome | H   | H  | H  |
| I-13 | CH3 | CH3 | H   | H   | H  | H  |
| I-14 | CH3 | H   | CH3 | H   | H  | H  |
| I-15 | H   | H   | Ph  | H   | H/Ph[1)] | Ph/H[1)] |
| I-16 | H   | H   | t-Bu | H  | H  | H  |

[1)]mixture of isomers.

| Cpd. | L' | R45 | R44 | R43 | R42 | Q1 | Q2 |
|------|----|----|-----|-----|-----|----|----|
| J-1  | A[2)] | H | H | H | H | H | H |
| J-2  | A[2)] | F | H | H | H | H | H |
| J-3  | A[2)] | H | H | F | H | H | H |
| J-4  | A[2)] | F | H | F | H | H | H |
| J-5  | A[2)] | F | H | H | F | H | H |
| J-6  | A[2)] | H | H | CF3 | H | H | H |
| J-7  | A[2)] | H | CF3 | H | CF3 | H | H |
| J-8  | A[2)] | CF3 | H | H | H | H | H |
| J-9  | A[2)] | H | CH3 | H | CH3 | H | H |
| J-10 | A[2)] | H | H | CH3 | H | H | H |
| J-11 | A[2)] | H | H | Ph | H | H | H |
| J-12 | A[2)] | H | H | OMe | H | H | H |
| J-13 | A[2)] | CH3 | CH3 | H | H | H | H |
| J-14 | A[2)] | CH3 | H | CH3 | H | H | H |
| J-15 | A[2)] | H | H | Ph | H | H/Ph[1)] | Ph/H[1)] |
| J-16 | A[2)] | H | t-Bu | H | H | H | H |
| J-17 | B[2)] | H | H | H | H | H | H |
| J-18 | B[2)] | F | H | H | H | H | H |
| J-19 | B[2)] | H | H | F | H | H | H |
| J-20 | B[2)] | F | H | F | H | H | H |
| J-21 | B[2)] | F | H | H | F | H | H |
| J-22 | B[2)] | H | H | CF3 | H | H | H |
| J-23 | B[2)] | H | CF3 | H | CF3 | H | H |
| J-24 | B[2)] | CF3 | H | H | H | H | H |
| J-25 | B[2)] | H | CH3 | H | CH3 | H | H |
| J-26 | B[2)] | H | H | CH3 | H | H | H |
| J-27 | B[2)] | H | H | Ph | H | H | H |
| J-28 | B[2)] | H | H | OMe | H | H | H |
| J-29 | B[2)] | CH3 | CH3 | H | H | H | H |
| J-30 | B[2)] | CH3 | H | CH3 | H | H | H |
| J-31 | B[2)] | H | H | Ph | H | H/Ph[1)] | Ph/H[1)] |
| J-32 | B[2)] | H | t-Bu | H | H | H | H |
| J-33 | C[2)] | H | H | H | H | H | H |
| J-34 | C[2)] | F | H | H | H | H | H |
| J-35 | C[2)] | H | H | F | H | H | H |
| J-36 | C[2)] | F | H | F | H | H | H |
| J-37 | C[2)] | F | H | H | F | H | H |
| J-38 | C[2)] | H | H | CF3 | H | H | H |
| J-39 | C[2)] | H | CF3 | H | CF3 | H | H |
| J-40 | C[2)] | CF3 | H | H | H | H | H |
| J-41 | C[2)] | H | CH3 | H | CH3 | H | H |
| J-42 | C[2)] | H | H | CH3 | H | H | H |
| J-43 | C[2)] | H | H | Ph | H | H | H |
| J-44 | C[2)] | H | H | OMe | H | H | H |
| J-45 | C[2)] | CH3 | CH3 | H | H | H | H |
| J-46 | C[2)] | CH3 | H | CH3 | H | H | H |
| J-47 | C[2)] | H | H | Ph | H | H/Ph[1)] | Ph/H[1)] |
| J-48 | C[2)] | H | t-Bu | H | H | H | H |
| J-49 | D[2)] | H | H | H | H | H | H |
| J-50 | D[2)] | F | H | H | H | H | H |
| J-51 | D[2)] | H | H | F | H | H | H |
| J-52 | D[2)] | F | H | F | H | H | H |
| J-53 | D[2)] | F | H | H | F | H | H |
| J-54 | D[2)] | H | H | CF3 | H | H | H |
| J-55 | D[2)] | H | CF3 | H | CF3 | H | H |
| J-56 | D[2)] | CF3 | H | H | H | H | H |
| J-57 | D[2)] | H | CH3 | H | CH3 | H | H |
| J-58 | D[2)] | H | H | CH3 | H | H | H |
| J-59 | D[2)] | H | H | Ph | H | H | H |
| J-60 | D[2)] | H | H | OMe | H | H | H |
| J-61 | D[2)] | CH3 | CH3 | H | H | H | H |
| J-62 | D[2)] | CH3 | H | CH3 | H | H | H |
| J-63 | D[2)] | H | H | Ph | H | H/Ph[1)] | Ph/H[1)] |

-continued

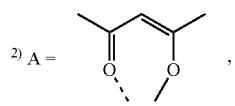

| Cpd. | L' | R45 | R44 | R43 | R42 | Q1 | Q2 |
|---|---|---|---|---|---|---|---|
| J-64 | D[2] | H | t-Bu | H | H | H | H |
| J-65 | E[2] | H | H | H | H | H | H |
| J-66 | E[2] | F | H | H | H | H | H |
| J-67 | E[2] | H | H | F | H | H | H |
| J-68 | E[2] | F | H | F | H | H | H |
| J-69 | E[2] | F | H | H | F | H | H |
| J-70 | E[2] | H | H | $CF_3$ | H | H | H |
| J-71 | E[2] | H | $CF_3$ | H | $CF_3$ | H | H |
| J-72 | E[2] | $CF_3$ | H | H | H | H | H |
| J-73 | E[2] | H | $CH_3$ | H | $CH_3$ | H | H |
| J-74 | E[2] | H | H | $CH_3$ | H | H | H |
| J-75 | E[2] | H | H | Ph | H | H | H |
| J-76 | E[2] | H | H | OMe | H | H | H |
| J-77 | E[2] | $CH_3$ | $CH_3$ | H | H | H | H |
| J-78 | E[2] | $CH_3$ | H | $CH_3$ | H | H | H |
| J-79 | E[2] | H | H | Ph | H | H/Ph[1] | Ph/H[1] |
| J-80 | E[2] | H | t-Bu | H | H | H | H |

[1] mixture of isomers.

[2] A = 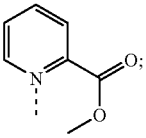,

B = 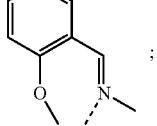;

C = 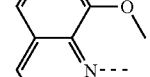;

D = 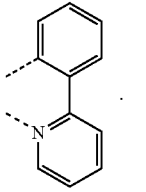,

E = 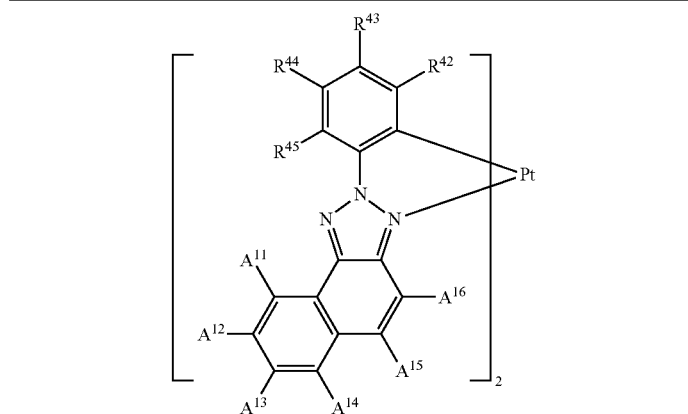.

[3] 2,4,4-trimethylpent-2-yl.

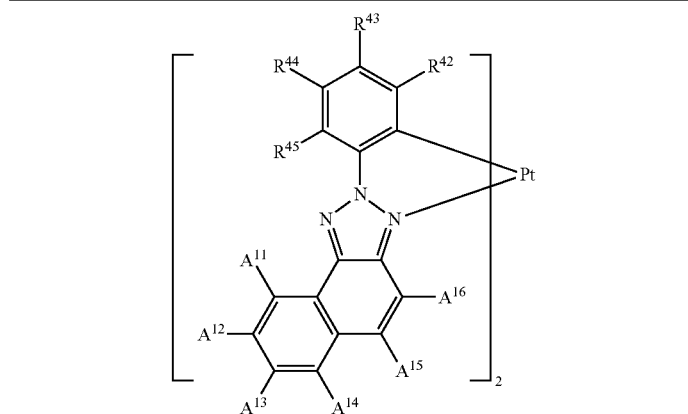

| Cpd. | R45 | R44 | R43 | R42 | A11 | A12 | A13 | A14 | A15 | A16 |
|---|---|---|---|---|---|---|---|---|---|---|
| K-1 | H | H | H | H | H | H | H | H | H | H |
| K-2 | F | H | H | H | H | H | H | H | H | H |
| K-3 | H | H | F | H | H | H | H | H | H | H |
| K-4 | F | H | F | H | H | H | H | H | H | H |
| K-5 | F | H | H | F | H | H | H | H | H | H |
| K-6 | H | H | $CF_3$ | H | H | H | H | H | H | H |

-continued

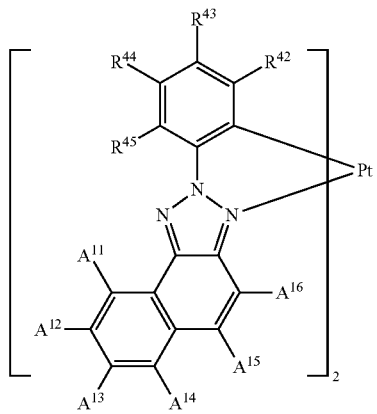

| Cpd. | R45 | R44 | R43 | R42 | A11 | A12 | A13 | A14 | A15 | A16 |
|---|---|---|---|---|---|---|---|---|---|---|
| K-7 | H | CF$_3$ | H | CF$_3$ | H | H | H | H | H | H |
| K-8 | CF$_3$ | H | H | H | H | H | H | H | H | H |
| K-9 | H | CH$_3$ | H | CH$_3$ | H | H | H | H | H | H |
| K-10 | H | H | CH$_3$ | H | H | H | H | H | H | H |
| K-11 | H | H | Ph | H | H | H | H | H | H | H |
| K-12 | H | H | OMe | H | H | H | H | H | H | H |
| K-13 | CH$_3$ | CH$_3$ | H | H | H | H | H | H | H | H |
| K-14 | CH$_3$ | H | CH$_3$ | H | H | H | H | H | H | H |
| K-15 | H | H | Ph | H | H | H | H | H | Ph | H |
| K-16 | H | H | t-Bu | H | H | H | H | H | H | H |

[1]mixture of isomers.

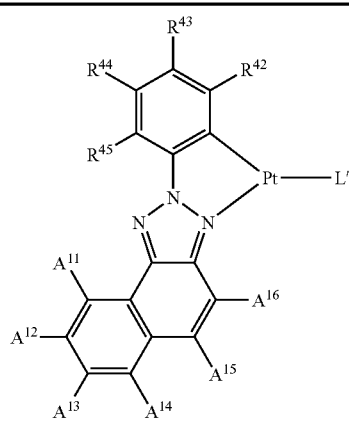

| Cpd. | L' | R45 | R44 | R43 | R42 | A11 | A12 | A13 | A14 | A15 | A16 |
|---|---|---|---|---|---|---|---|---|---|---|---|
| L-1 | A[2] | H | H | CH$_3$ | H | H | H | H | H | H | H |
| L-2 | A[2] | H | H | H | H | H | H | H | H | H | H |
| L-3 | A[2] | F | H | H | H | H | H | H | H | H | H |
| L-4 | A[2] | H | H | F | H | H | H | H | H | H | H |
| L-5 | A[2] | F | H | F | H | H | H | H | H | H | H |
| L-6 | A[2] | F | H | H | F | H | H | H | H | H | H |
| L-7 | A[2] | H | H | CF$_3$ | H | H | H | H | H | H | H |
| L-8 | A[2] | H | CF$_3$ | H | CF$_3$ | H | H | H | H | H | H |
| L-9 | A[2] | CF$_3$ | H | H | H | H | H | H | H | H | H |
| L-10 | A[2] | H | CH$_3$ | CH$_3$ | H | H | H | H | H | H | H |
| L-11 | A[2] | H | t-Bu | H | H | H | H | H | H | H | H |
| L-12 | A[2] | H | H | Ph | H | H | H | H | H | H | H |
| L-13 | A[2] | H | H | OMe | H | H | H | H | H | H | H |
| L-14 | A[2] | CH$_3$ | CH$_3$ | H | H | H | H | H | H | H | H |

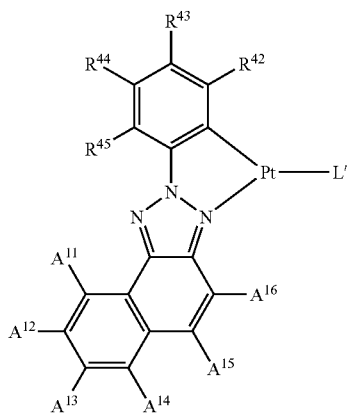

| Cpd. | L' | R⁴⁵ | R⁴⁴ | R⁴³ | R⁴² | A¹¹ | A¹² | A¹³ | A¹⁴ | A¹⁵ | A¹⁶ |
|---|---|---|---|---|---|---|---|---|---|---|---|
| L-15 | A²⁾ | CH₃ | H | CH₃ | H | H | H | H | H | H | H |
| L-16 | A²⁾ | H | H | Ph | H | H | H | H | H/Ph¹⁾ | Ph/H¹⁾ | H |
| L-17 | B²⁾ | H | H | CH₃ | H | H | H | H | H | H | H |
| L-18 | B²⁾ | H | H | H | H | H | H | H | H | H | H |
| L-19 | B²⁾ | F | H | H | H | H | H | H | H | H | H |
| L-20 | B²⁾ | H | H | F | H | H | H | H | H | H | H |
| L-21 | B²⁾ | F | H | F | H | H | H | H | H | H | H |
| L-22 | B²⁾ | F | H | H | F | H | H | H | H | H | H |
| L-23 | B²⁾ | H | H | CF₃ | H | H | H | H | H | H | H |
| L-24 | B²⁾ | H | CF₃ | H | CF₃ | H | H | H | H | H | H |
| L-25 | B²⁾ | CF₃ | H | H | H | H | H | H | H | H | H |
| L-26 | B²⁾ | H | CH₃ | H | CH₃ | H | H | H | H | H | H |
| L-27 | B²⁾ | H | t-Bu | H | H | H | H | H | H | H | H |
| L-28 | B²⁾ | H | H | Ph | H | H | H | H | H | H | H |
| L-29 | B²⁾ | H | H | OMe | H | H | H | H | H | H | H |
| L-30 | B²⁾ | CH₃ | CH₃ | H | H | H | H | H | H | H | H |
| L-31 | B²⁾ | CH₃ | H | CH₃ | H | H | H | H | H | H | H |
| L-32 | B²⁾ | H | H | Ph | H | H | H | H | H/Ph¹⁾ | Ph/H¹⁾ | H |
| L-33 | C²⁾ | H | H | CH₃ | H | H | H | H | H | H | H |
| L-34 | C²⁾ | H | H | H | H | H | H | H | H | H | H |
| L-35 | C²⁾ | F | H | H | H | H | H | H | H | H | H |
| L-36 | C²⁾ | H | H | F | H | H | H | H | H | H | H |
| L-37 | C²⁾ | F | H | F | H | H | H | H | H | H | H |
| L-38 | C²⁾ | F | H | H | F | H | H | H | H | H | H |
| L-39 | C²⁾ | H | H | CF₃ | H | H | H | H | H | H | H |
| L-40 | C²⁾ | H | CF₃ | H | CF₃ | H | H | H | H | H | H |
| L-41 | C²⁾ | CF₃ | H | H | H | H | H | H | H | H | H |
| L-42 | C²⁾ | H | CH₃ | H | CH₃ | H | H | H | H | H | H |
| L-43 | C²⁾ | H | t-Bu | H | H | H | H | H | H | H | H |
| L-44 | C²⁾ | H | H | Ph | H | H | H | H | H | H | H |
| L-45 | C²⁾ | H | H | OMe | H | H | H | H | H | H | H |
| L-46 | C²⁾ | CH₃ | CH₃ | H | H | H | H | H | H | H | H |
| L-47 | C²⁾ | CH₃ | H | CH₃ | H | H | H | H | H | H | H |
| L-48 | C²⁾ | H | H | Ph | H | H | H | H | H/Ph¹⁾ | Ph/H¹⁾ | H |
| L-49 | D²⁾ | H | H | CH₃ | H | H | H | H | H | H | H |
| L-50 | D²⁾ | H | H | H | H | H | H | H | H | H | H |
| L-51 | D²⁾ | F | H | H | H | H | H | H | H | H | H |
| L-52 | D²⁾ | H | H | F | H | H | H | H | H | H | H |
| L-53 | D²⁾ | F | H | F | H | H | H | H | H | H | H |
| L-54 | D²⁾ | F | H | H | F | H | H | H | H | H | H |
| L-55 | D²⁾ | H | H | CF₃ | H | H | H | H | H | H | H |
| L-56 | D²⁾ | H | CF₃ | H | CF₃ | H | H | H | H | H | H |
| L-57 | D²⁾ | CF₃ | H | H | H | H | H | H | H | H | H |
| L-58 | D²⁾ | H | CH₃ | H | CH₃ | H | H | H | H | H | H |
| L-59 | D²⁾ | H | t-Bu | H | H | H | H | H | H | H | H |
| L-60 | D²⁾ | H | H | Ph | H | H | H | H | H | H | H |

-continued
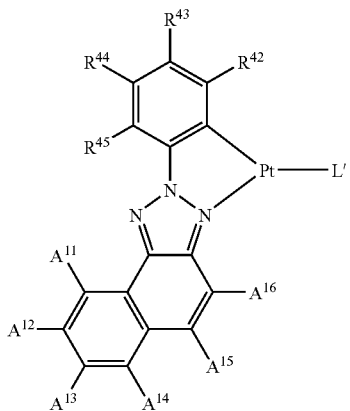
| Cpd. | L' | R45 | R44 | R43 | R42 | A11 | A12 | A13 | A14 | A15 | A16 |
|---|---|---|---|---|---|---|---|---|---|---|---|
| L-61 | D[2)] | H | H | OMe | H | H | H | H | H | H | H |
| L-62 | D[2)] | CH$_3$ | CH$_3$ | H | H | H | H | H | H | H | H |
| L-63 | D[2)] | CH$_3$ | H | CH$_3$ | H | H | H | H | H | H | H |
| L-64 | D[2)] | H | H | Ph | H | H | H | H | H/Ph[1)] | Ph/H[1)] | H |
[1)] mixture of isomers.
[2)] A = 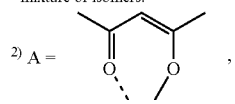,
B = 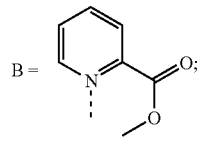;
C = 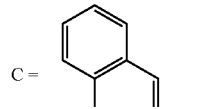;
D = 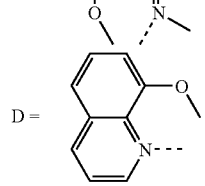;
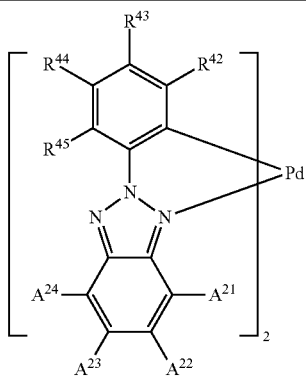
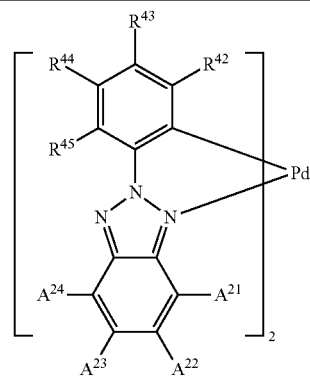
| Cpd. | R45 | R44 | R43 | R42 | A24 | A23 | A22 | A21 |
|---|---|---|---|---|---|---|---|---|
| M-1 | H | H | H | H | H | H | H | H |
| M-2 | F | H | H | H | H | H | H | H |
| Cpd. | R45 | R44 | R43 | R42 | A24 | A23 | A22 | A21 |
|---|---|---|---|---|---|---|---|---|
| M-3 | H | H | F | H | H | H | H | H |
| M-4 | F | H | F | H | H | H | H | H |

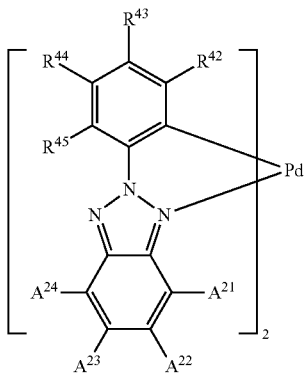

| Cpd. | R45 | R44 | R43 | R42 | A24 | A23 | A22 | A21 |
|---|---|---|---|---|---|---|---|---|
| M-5 | F | H | H | F | H | H | H | H |
| M-6 | H | H | CF3 | H | H | H | H | H |
| M-7 | H | CF3 | H | CF3 | H | H | H | H |
| M-8 | CF3 | H | H | H | H | H | H | H |
| M-9 | H | CH3 | H | CH3 | H | H | H | H |
| M-10 | H | H | CH3 | H | H | H | H | H |
| M-11 | H | H | Ph | H | H | H | H | H |
| M-12 | H | H | OMe | H | H | H | H | H |
| M-13 | CH3 | CH3 | H | H | H | H | H | H |
| M-14 | CH3 | H | CH3 | H | H | H | H | H |
| M-15 | H | H | Ph | H | H | H/Ph[1)] | Ph/H[1)] | H |
| M-16 | H | H | t-Bu | H | H | H | H | H |

[1)]mixture of isomers.

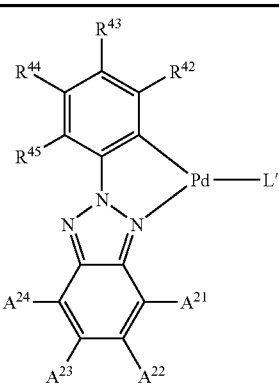

| Cpd. | L' | R45 | R44 | R43 | R42 | A24 | A23 | A22 | A21 |
|---|---|---|---|---|---|---|---|---|---|
| N-1 | A[2)] | H | H | H | H | H | H | H | H |
| N-2 | A[2)] | F | H | H | H | H | H | H | H |
| N-3 | A[2)] | H | H | F | H | H | H | H | H |
| N-4 | A[2)] | F | F | H | H | H | H | H | H |
| N-5 | A[2)] | F | H | H | F | H | H | H | H |
| N-6 | A[2)] | H | H | CF3 | H | H | H | H | H |
| N-7 | A[2)] | H | CF3 | H | CF3 | H | H | H | H |
| N-8 | A[2)] | CF3 | H | H | H | H | H | H | H |
| N-9 | A[2)] | H | CH3 | H | CH3 | H | H | H | H |
| N-10 | A[2)] | H | H | CH3 | H | H | H | H | H |
| N-11 | A[2)] | H | H | Ph | H | H | H | H | H |
| N-12 | A[2)] | H | H | OMe | H | H | H | H | H |
| N-13 | A[2)] | CH3 | CH3 | H | H | H | H | H | H |
| N-14 | A[2)] | CH3 | H | CH3 | H | H | H | H | H |
| N-15 | A[2)] | H | H | Ph | H | H | H/Ph[1)] | Ph/H[1)] | H |
| N-16 | A[2)] | H | H | t-Bu | H | H | H | H | H |
| N-17 | B[2)] | H | H | H | H | H | H | H | H |
| N-18 | B[2)] | F | F | H | H | H | H | H | H |
| N-19 | B[2)] | H | H | F | H | H | H | H | H |
| N-20 | B[2)] | F | F | H | F | H | H | H | H |
| N-21 | B[2)] | F | F | H | H | F | H | H | H |

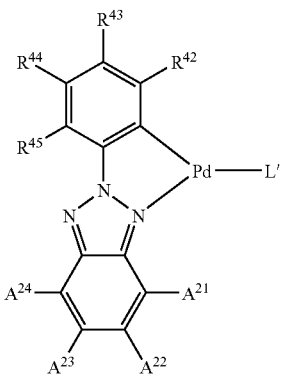

| Cpd. | L' | R45 | R44 | R43 | R42 | A24 | A23 | A22 | A21 |
|---|---|---|---|---|---|---|---|---|---|
| N-22 | B[2)] | H | H | H | CF3 | H | H | H | H |
| N-23 | B[2)] | H | CF3 | H | CF3 | H | H | H | H |
| N-24 | B[2)] | CF3 | CF3 | H | H | H | H | H | H |
| N-25 | B[2)] | H | H | CH3 | CH3 | H | H | H | H |
| N-26 | B[2)] | H | H | H | CH3 | H | H | H | H |
| N-27 | B[2)] | H | H | H | Ph | H | H | H | H |
| N-28 | B[2)] | H | H | H | OMe | H | H | H | H |
| N-29 | B[2)] | CH3 | CH3 | CH3 | H | H | H | H | H |
| N-30 | B[2)] | CH3 | CH3 | H | CH3 | H | H | H | H |
| N-31 | B[2)] | H | H | H | Ph | H | H | H/Ph[1)] | Ph/H[1)] |
| N-32 | B[2)] | H | H | t-Bu | H | H | H | H | H |
| N-33 | C[2)] | H | H | H | H | H | H | H | H |
| N-34 | C[2)] | F | H | H | H | H | H | H | H |
| N-35 | C[2)] | H | H | F | H | H | H | H | H |
| N-36 | C[2)] | F | F | H | H | H | H | H | H |
| N-37 | C[2)] | F | H | H | F | H | H | H | H |
| N-38 | C[2)] | H | H | CF3 | H | H | H | H | H |
| N-39 | C[2)] | H | CF3 | H | CF3 | H | H | H | H |
| N-40 | C[2)] | CF3 | H | H | H | H | H | H | H |
| N-41 | C[2)] | H | CH3 | H | CH3 | H | H | H | H |
| N-42 | C[2)] | H | H | CH3 | H | H | H | H | H |
| N-43 | C[2)] | H | H | Ph | H | H | H | H | H |
| N-44 | C[2)] | H | H | OMe | H | H | H | H | H |
| N-45 | C[2)] | CH3 | CH3 | H | H | H | H | H | H |
| N-46 | C[2)] | CH3 | H | CH3 | H | H | H | H | H |
| N-47 | C[2)] | H | H | Ph | H | H | H/Ph[1)] | Ph/H[1)] | H |
| N-48 | C[2)] | H | t-Bu | H | H | H | H | H | H |
| N-49 | D[2)] | H | H | H | H | H | H | H | H |
| N-50 | D[2)] | F | H | H | H | H | H | H | H |
| N-51 | D[2)] | H | H | F | H | H | H | H | H |
| N-52 | D[2)] | F | F | H | H | H | H | H | H |
| N-53 | D[2)] | F | H | H | F | H | H | H | H |
| N-54 | D[2)] | H | H | CF3 | H | H | H | H | H |
| N-55 | D[2)] | H | CF3 | H | CF3 | H | H | H | H |
| N-56 | D[2)] | CF3 | H | H | H | H | H | H | H |
| N-57 | D[2)] | H | CH3 | H | CH3 | H | H | H | H |
| N-58 | D[2)] | H | H | CH3 | H | H | H | H | H |
| N-59 | D[2)] | H | H | Ph | H | H | H | H | H |
| N-60 | D[2)] | H | H | OMe | H | H | H | H | H |
| N-61 | D[2)] | CH3 | CH3 | H | H | H | H | H | H |
| N-62 | D[2)] | CH3 | H | CH3 | H | H | H | H | H |
| N-63 | D[2)] | H | H | Ph | H | H | H/Ph[1)] | Ph/H[1)] | H |
| N-64 | D[2)] | H | t-Bu | H | H | H | H | H | H |
| N-65 | A | H | | [3)] | | H | H | H | H |
| N-66 | B | H | | [3)] | | H | H | H | H |
| N-67 | C | H | | [3)] | | H | H | H | H |
| N-68 | D | H | | [3)] | | H | H | H | H |
| N-69 | E[2)] | H | H | H | H | H | H | H | H |
| N-70 | E[2)] | F | H | H | H | H | H | H | H |
| N-71 | E[2)] | H | H | F | H | H | H | H | H |
| N-72 | E[2)] | F | F | H | H | H | H | H | H |
| N-73 | E[2)] | F | H | H | F | H | H | H | H |
| N-74 | E[2)] | H | H | CF3 | H | H | H | H | H |
| N-75 | E[2)] | H | CF3 | H | CF3 | H | H | H | H |
| N-76 | E[2)] | CF3 | H | H | H | H | H | H | H |

-continued

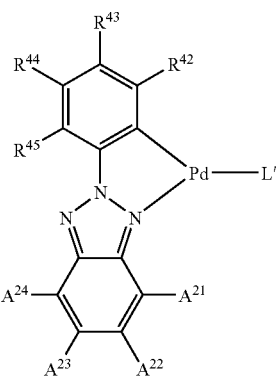

| Cpd. | L' | R45 | R44 | R43 | R42 | A24 | A23 | A22 | A21 |
|---|---|---|---|---|---|---|---|---|---|
| N-77 | E[2)] | H | CH3 | H | CH3 | H | H | H | H |
| N-78 | E[2)] | H | H | CH3 | H | H | H | H | H |
| N-79 | E[2)] | H | H | Ph | H | H | H | H | H |
| N-80 | E[2)] | H | H | OMe | H | H | H | H | H |
| N-81 | E[2)] | CH3 | CH3 | H | H | H | H | H | H |
| N-82 | E[2)] | CH3 | H | CH3 | H | H | H | H | H |
| N-83 | E[2)] | H | H | Ph | H | H | H/Ph[1)] | Ph/H[1)] | H |
| N-84 | E[2)] | H | t-Bu | H | H | H | H | H | H |
| N-85 | E[2)] | H | [3)] | H | H | H | H | H | H |

[1)]mixture of isomers.

[2)] A = 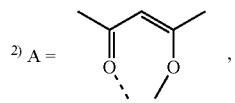,

B = 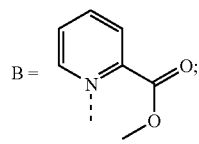;

C = 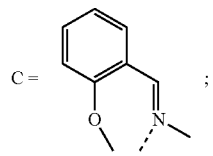;

D = 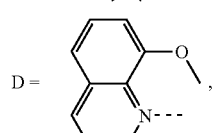,

E = 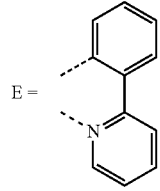.

[3)]2,4,4-trimethylpent-2-yl.

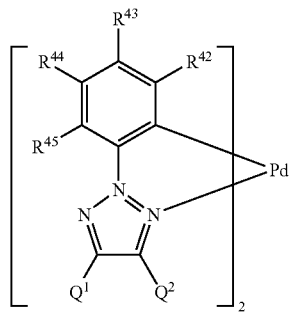

| Cpd. | R45 | R44 | R43 | R42 | Q1 | Q2 |
|---|---|---|---|---|---|---|
| O-1 | H | H | H | H | H | H |
| O-2 | F | H | H | H | H | H |
| O-3 | H | H | F | H | H | H |
| O-4 | F | H | F | H | H | H |
| O-5 | F | H | H | F | H | H |
| O-6 | H | H | CF3 | H | H | H |
| O-7 | H | CF3 | H | CF3 | H | H |
| O-8 | CF3 | H | H | H | H | H |
| O-9 | H | CH3 | H | CH3 | H | H |
| O-10 | H | H | CH3 | H | H | H |
| O-11 | H | H | Ph | H | H | H |
| O-12 | H | H | Ome | H | H | H |
| O-13 | CH3 | CH3 | H | H | H | H |
| O-14 | CH3 | H | CH3 | H | H | H |
| O-15 | H | H | Ph | H | H/Ph[1)] | Ph/H[1)] |
| O-16 | H | H | t-Bu | H | H | H |

[1)]mixture of isomers.

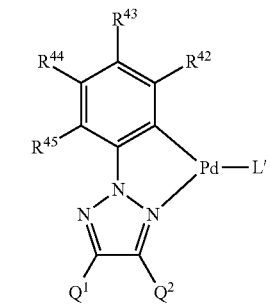

| Cpd. | L' | R45 | R44 | R43 | R42 | Q1 | Q2 |
|---|---|---|---|---|---|---|---|
| P-1 | A[2)] | H | H | H | H | H | H |
| P-2 | A[2)] | F | H | H | H | H | H |
| P-3 | A[2)] | H | H | F | H | H | H |
| P-4 | A[2)] | F | H | F | H | H | H |
| P-5 | A[2)] | F | H | H | F | H | H |
| P-6 | A[2)] | H | H | CF3 | H | H | H |
| P-7 | A[2)] | H | CF3 | H | CF3 | H | H |
| P-8 | A[2)] | CF3 | H | H | H | H | H |
| P-9 | A[2)] | H | CH3 | H | CH3 | H | H |
| P-10 | A[2)] | H | H | CH3 | H | H | H |
| P-11 | A[2)] | H | H | Ph | H | H | H |
| P-12 | A[2)] | H | H | OMe | H | H | H |
| P-13 | A[2)] | CH3 | CH3 | H | H | H | H |
| P-14 | A[2)] | CH3 | H | CH3 | H | H | H |
| P-15 | A[2)] | H | H | Ph | H | H/Ph[1)] | Ph/H[1)] |
| P-16 | A[2)] | H | t-Bu | H | H | H | H |
| P-17 | B[2)] | H | H | H | H | H | H |
| P-18 | B[2)] | F | H | H | H | H | H |
| P-19 | B[2)] | H | H | F | H | H | H |
| P-20 | B[2)] | F | H | F | H | H | H |
| P-21 | B[2)] | F | H | H | F | H | H |
| P-22 | B[2)] | H | H | CF3 | H | H | H |
| P-23 | B[2)] | H | CF3 | H | CF3 | H | H |

-continued

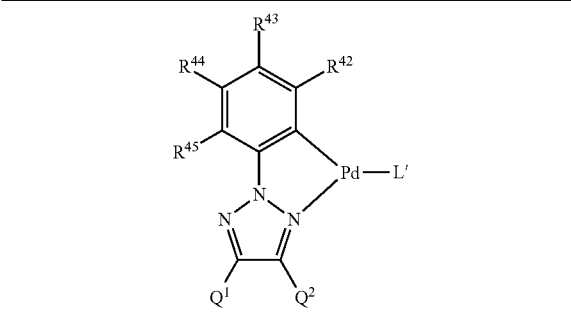

| Cpd. | L' | R45 | R44 | R43 | R42 | Q1 | Q2 |
|---|---|---|---|---|---|---|---|
| P-24 | B[2)] | CF3 | H | H | H | H | H |
| P-25 | B[2)] | H | CH3 | H | CH3 | H | H |
| P-26 | B[2)] | H | H | CH3 | H | H | H |
| P-27 | B[2)] | H | H | Ph | H | H | H |
| P-28 | B[2)] | H | H | OMe | H | H | H |
| P-29 | B[2)] | CH3 | CH3 | H | H | H | H |
| P-30 | B[2)] | CH3 | H | CH3 | H | H | H |
| P-31 | B[2)] | H | H | Ph | H | H/Ph[1)] | Ph/H[1)] |
| P-32 | B[2)] | H | t-Bu | H | H | H | H |
| P-33 | C[2)] | H | H | H | H | H | H |
| P-34 | C[2)] | F | H | H | H | H | H |
| P-35 | C[2)] | H | H | F | H | H | H |
| P-36 | C[2)] | F | H | F | H | H | H |
| P-37 | C[2)] | F | H | H | F | H | H |
| P-38 | C[2)] | H | H | CF3 | H | H | H |
| P-39 | C[2)] | H | CF3 | H | CF3 | H | H |
| P-40 | C[2)] | CF3 | H | H | H | H | H |
| P-41 | C[2)] | H | CH3 | H | CH3 | H | H |
| P-42 | C[2)] | H | H | CH3 | H | H | H |
| P-43 | C[2)] | H | H | Ph | H | H | H |
| P-44 | C[2)] | H | H | OMe | H | H | H |
| P-45 | C[2)] | CH3 | CH3 | H | H | H | H |
| P-46 | C[2)] | CH3 | H | CH3 | H | H | H |
| P-47 | C[2)] | H | H | Ph | H | H/Ph[1)] | Ph/H[1)] |
| P-48 | C[2)] | H | t-Bu | H | H | H | H |
| P-49 | D[2)] | H | H | H | H | H | H |
| P-50 | D[2)] | F | H | H | H | H | H |
| P-51 | D[2)] | H | H | F | H | H | H |
| P-52 | D[2)] | F | H | F | H | H | H |
| P-53 | D[2)] | F | H | H | F | H | H |
| P-54 | D[2)] | H | H | CF3 | H | H | H |
| P-55 | D[2)] | H | CF3 | H | CF3 | H | H |
| P-56 | D[2)] | CF3 | H | H | H | H | H |
| P-57 | D[2)] | H | CH3 | H | CH3 | H | H |
| P-58 | D[2)] | H | H | CH3 | H | H | H |
| P-59 | D[2)] | H | H | Ph | H | H | H |
| P-60 | D[2)] | H | H | OMe | H | H | H |
| P-61 | D[2)] | CH3 | CH3 | H | H | H | H |
| P-62 | D[2)] | CH3 | H | CH3 | H | H | H |
| P-63 | D[2)] | H | H | Ph | H | H/Ph[1)] | Ph/H[1)] |
| P-64 | D[2)] | H | t-Bu | H | H | H | H |
| P-65 | E[2)] | H | H | H | H | H | H |
| P-66 | E[2)] | F | H | H | H | H | H |
| P-67 | E[2)] | H | H | F | H | H | H |
| P-68 | E[2)] | F | H | F | H | H | H |
| P-69 | E[2)] | F | H | H | F | H | H |
| P-70 | E[2)] | H | H | CF3 | H | H | H |
| P-71 | E[2)] | H | CF3 | H | CF3 | H | H |
| P-72 | E[2)] | CF3 | H | H | H | H | H |
| P-73 | E[2)] | H | CH3 | H | CH3 | H | H |
| P-74 | E[2)] | H | H | CH3 | H | H | H |
| P-75 | E[2)] | H | H | Ph | H | H | H |
| P-76 | E[2)] | H | H | OMe | H | H | H |
| P-77 | E[2)] | CH3 | CH3 | H | H | H | H |

-continued

| Cpd. | L' | R45 | R44 | R43 | R42 | Q1 | Q2 |
|---|---|---|---|---|---|---|---|
| P-78 | E[2)] | CH3 | H | CH3 | H | H | H |
| P-79 | E[2)] | H | H | Ph | H | H/Ph[1)] | Ph/H[1)] |
| P-80 | E[2)] | H | t-Bu | H | H | H | H |

[1)] mixture of isomers.

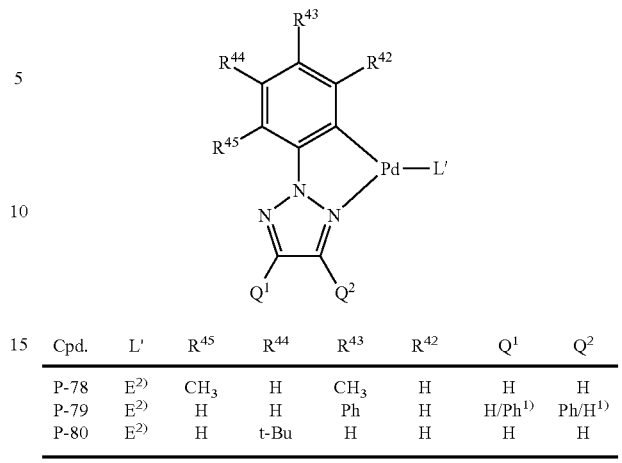

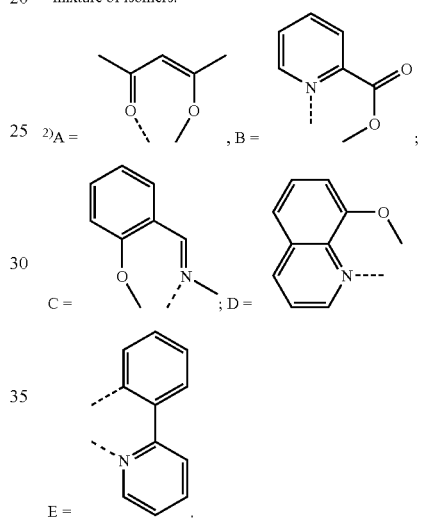

| Cpd. | R45 | R44 | R43 | R42 | A11 | A12 | A13 | A14 | A15 | A16 |
|---|---|---|---|---|---|---|---|---|---|---|
| Q-1 | H | H | H | H | H | H | H | H | H | H |
| Q-2 | F | H | H | H | H | H | H | H | H | H |
| Q-3 | H | H | F | H | H | H | H | H | H | H |
| Q-4 | F | H | F | H | H | H | H | H | H | H |
| Q-5 | F | H | H | F | H | H | H | H | H | H |
| Q-6 | H | H | CF3 | H | H | H | H | H | H | H |

-continued

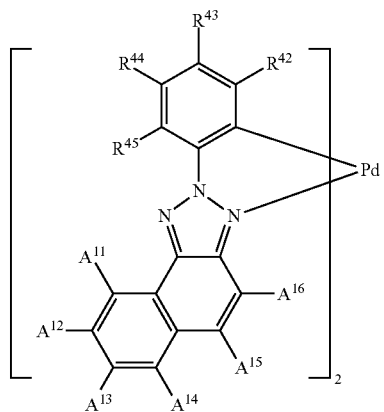

| Cpd. | R45 | R44 | R43 | R42 | A11 | A12 | A13 | A14 | A15 | A16 |
|---|---|---|---|---|---|---|---|---|---|---|
| Q-7 | H | CF3 | H | CF3 | H | H | H | H | H | H |
| Q-8 | CF3 | H | H | H | H | H | H | H | H | H |
| Q-9 | H | CH3 | H | CH3 | H | H | H | H | H | H |
| Q-10 | H | H | CH3 | H | H | H | H | H | H | H |
| Q-11 | H | H | Ph | H | H | H | H | H | H | H |
| Q-12 | H | H | OMe | H | H | H | H | H | H | H |
| Q-13 | CH3 | CH3 | H | H | H | H | H | H | H | H |
| Q-14 | CH3 | H | CH3 | H | H | H | H | H | H | H |
| Q-15 | H | H | Ph | H | H | H | H | H | Ph | H |
| Q-16 | H | H | t-Bu | H | H | H | H | H | H | H |

1) mixture of isomers.

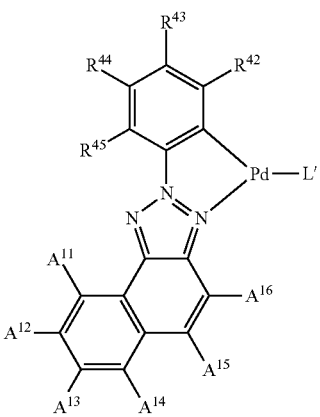

| Cpd. | L' | R45 | R44 | R43 | R42 | A11 | A12 | A13 | A14 | A15 | A16 |
|---|---|---|---|---|---|---|---|---|---|---|---|
| R-1 | A2) | H | H | CH3 | H | H | H | H | H | H | H |
| R-2 | A2) | H | H | H | H | H | H | H | H | H | H |
| R-3 | A2) | F | H | H | H | H | H | H | H | H | H |
| R-4 | A2) | H | H | H | F | H | H | H | H | H | H |
| R-5 | A2) | F | H | F | H | H | H | H | H | H | H |
| R-6 | A2) | F | H | H | F | H | H | H | H | H | H |
| R-7 | A2) | H | H | CF3 | H | H | H | H | H | H | H |
| R-8 | A2) | H | CF3 | H | CF3 | H | H | H | H | H | H |
| R-9 | A2) | CF3 | H | H | H | H | H | H | H | H | H |
| R-10 | A2) | H | CH3 | H | CH3 | H | H | H | H | H | H |
| R-11 | A2) | H | t-Bu | H | H | H | H | H | H | H | H |
| R-12 | A2) | H | H | H | Ph | H | H | H | H | H | H |
| R-13 | A2) | H | H | OMe | H | H | H | H | H | H | H |
| R-14 | A2) | CH3 | CH3 | H | H | H | H | H | H | H | H |
| R-15 | A2) | CH3 | H | CH3 | H | H | H | H | H | H | H |
| R-16 | A2) | H | H | Ph | H | H | H | H | H/Ph1) | Ph/H1) | H |
| R-17 | B2) | H | H | CH3 | H | H | H | H | H | H | H |
| R-18 | B2) | H | H | H | H | H | H | H | H | H | H |
| R-19 | B2) | F | H | H | H | H | H | H | H | H | H |
| R-20 | B2) | H | H | H | F | H | H | H | H | H | H |
| R-21 | B2) | F | H | F | H | H | H | H | H | H | H |
| R-22 | B2) | F | H | H | F | H | H | H | H | H | H |
| R-23 | B2) | H | H | CF3 | H | H | H | H | H | H | H |
| R-24 | B2) | H | CF3 | H | CF3 | H | H | H | H | H | H |
| R-25 | B2) | CF3 | H | H | H | H | H | H | H | H | H |
| R-26 | B2) | H | CH3 | CH3 | H | H | H | H | H | H | H |
| R-27 | B2) | H | t-Bu | H | H | H | H | H | H | H | H |
| R-28 | B2) | H | H | Ph | H | H | H | H | H | H | H |
| R-29 | B2) | H | H | OMe | H | H | H | H | H | H | H |
| R-30 | B2) | CH3 | CH3 | H | H | H | H | H | H | H | H |
| R-31 | B2) | CH3 | H | CH3 | H | H | H | H | H | H | H |
| R-32 | B2) | H | H | Ph | H | H | H | H | H/Ph1) | Ph/H1) | H |
| R-33 | C2) | H | H | CH3 | H | H | H | H | H | H | H |
| R-34 | C2) | H | H | H | H | H | H | H | H | H | H |
| R-35 | C2) | F | H | H | H | H | H | H | H | H | H |
| R-36 | C2) | H | H | H | F | H | H | H | H | H | H |
| R-37 | C2) | F | H | F | H | H | H | H | H | H | H |
| R-38 | C2) | F | H | H | F | H | H | H | H | H | H |
| R-39 | C2) | H | H | CF3 | H | H | H | H | H | H | H |
| R-40 | C2) | H | CF3 | H | CF3 | H | H | H | H | H | H |
| R-41 | C2) | CF3 | H | H | H | H | H | H | H | H | H |
| R-42 | C2) | H | CH3 | H | CH3 | H | H | H | H | H | H |
| R-43 | C2) | H | t-Bu | H | H | H | H | H | H | H | H |
| R-44 | C2) | H | H | Ph | H | H | H | H | H | H | H |
| R-45 | C2) | H | H | OMe | H | H | H | H | H | H | H |
| R-46 | C2) | CH3 | CH3 | H | H | H | H | H | H | H | H |
| R-47 | C2) | CH3 | H | CH3 | H | H | H | H | H | H | H |
| R-48 | C2) | H | H | Ph | H | H | H | H | H/Ph1) | Ph/H1) | H |
| R-49 | D2) | H | H | CH3 | H | H | H | H | H | H | H |
| R-50 | D2) | H | H | H | H | H | H | H | H | H | H |
| R-51 | D2) | F | H | H | H | H | H | H | H | H | H |
| R-52 | D2) | H | H | H | F | H | H | H | H | H | H |
| R-53 | D2) | F | H | F | H | H | H | H | H | H | H |
| R-54 | D2) | F | H | H | F | H | H | H | H | H | H |
| R-55 | D2) | H | H | CF3 | H | H | H | H | H | H | H |
| R-56 | D2) | H | CF3 | H | CF3 | H | H | H | H | H | H |
| R-57 | D2) | CF3 | H | H | H | H | H | H | H | H | H |
| R-58 | D2) | H | CH3 | H | CH3 | H | H | H | H | H | H |
| R-59 | D2) | H | t-Bu | H | H | H | H | H | H | H | H |
| R-60 | D2) | H | H | Ph | H | H | H | H | H | H | H |
| R-61 | D2) | H | H | OMe | H | H | H | H | H | H | H |
| R-62 | D2) | CH3 | CH3 | H | H | H | H | H | H | H | H |
| R-63 | D2) | CH3 | H | CH3 | H | H | H | H | H | H | H |
| R-64 | D2) | H | H | Ph | H | H | H | H | H/Ph1) | Ph/H1) | H |
| R-65 | D2) | H | H | CH3 | H | H | H | H | H | H | H |

-continued

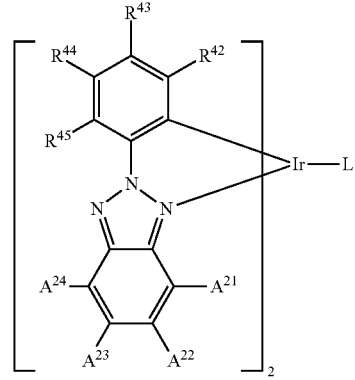

| Cpd. | L' | R45 | R44 | R43 | R42 | A11 | A12 | A13 | A14 | A15 | A16 |
|---|---|---|---|---|---|---|---|---|---|---|---|
| R-66 | D[2)] | H | H | H | H | H | H | H | H | H | H |
| R-67 | D[2)] | F | H | H | H | H | H | H | H | H | H |
| R-68 | D[2)] | H | H | F | H | H | H | H | H | H | H |
| R-69 | D[2)] | F | H | F | H | H | H | H | H | H | H |
| R-70 | D[2)] | F | H | H | F | H | H | H | H | H | H |
| R-71 | D[2)] | H | H | CF3 | H | H | H | H | H | H | H |
| R-72 | D[2)] | H | CF3 | H | CF3 | H | H | H | H | H | H |
| R-73 | D[2)] | CF3 | H | H | H | H | H | H | H | H | H |
| R-74 | D[2)] | H | CH3 | H | CH3 | H | H | H | H | H | H |
| R-75 | D[2)] | H | t-Bu | H | H | H | H | H | H | H | H |
| R-76 | D[2)] | H | H | Ph | H | H | H | H | H | H | H |
| R-77 | D[2)] | H | H | OMe | H | H | H | H | H | H | H |
| R-78 | D[2)] | CH3 | CH3 | H | H | H | H | H | H | H | H |
| R-79 | D[2)] | CH3 | H | CH3 | H | H | H | H | H | H | H |
| R-80 | D[2)] | H | H | Ph | H | H | H | H | H/Ph[1)] | Ph/H[1)] | H |

[1)]mixture of isomers.

[2)]A = 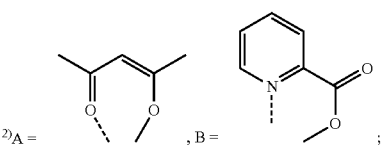, B = 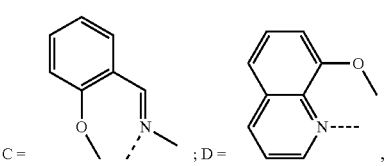

C = 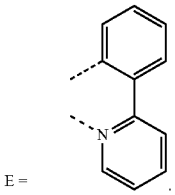; D =

E =

| Cpd. | L' | R45 | R44 | R43 | R42 | A24 | A23 | A22 | A21 |
|---|---|---|---|---|---|---|---|---|---|
| S-1 | A[2)] | H | H | H | H | H | H | H | H |
| S-2 | A[2)] | F | H | H | H | H | H | H | H |
| S-3 | A[2)] | H | H | F | H | H | H | H | H |
| S-4 | A[2)] | F | H | F | H | H | H | H | H |
| S-5 | A[2)] | F | H | H | F | H | H | H | H |
| S-6 | A[2)] | H | H | CF3 | H | H | H | H | H |
| S-7 | A[2)] | H | CF3 | H | CF3 | H | H | H | H |
| S-8 | A[2)] | CF3 | H | H | H | H | H | H | H |
| S-9 | A[2)] | H | CH3 | H | CH3 | H | H | H | H |
| S-10 | A[2)] | H | H | CH3 | H | H | H | H | H |
| S-11 | A[2)] | H | H | Ph | H | H | H | H | H |
| S-12 | A[2)] | H | H | OMe | H | H | H | H | H |
| S-13 | A[2)] | CH3 | CH3 | H | H | H | H | H | H |
| S-14 | A[2)] | CH3 | H | CH3 | H | H | H | H | H |
| S-15 | A[2)] | H | H | Ph | H | H/Ph[1)] | Ph/H[1)] | H | H |
| S-16 | A[2)] | H | t-Bu | H | H | H | H | H | H |
| S-17 | B[2)] | H | H | H | H | H | H | H | H |
| S-18 | B[2)] | F | F | H | H | H | H | H | H |
| S-19 | B[2)] | H | H | F | H | H | H | H | H |
| S-20 | B[2)] | F | F | H | F | H | H | H | H |
| S-21 | B[2)] | F | F | H | H | F | H | H | H |
| S-22 | B[2)] | H | H | H | CF3 | H | H | H | H |
| S-23 | B[2)] | H | H | CF3 | H | CF3 | H | H | H |
| S-24 | B[2)] | CF3 | CF3 | H | H | H | H | H | H |
| S-25 | B[2)] | H | H | CH3 | H | CH3 | H | H | H |
| S-26 | B[2)] | H | H | H | CH3 | H | H | H | H |
| S-27 | B[2)] | H | H | H | Ph | H | H | H | H |
| S-28 | B[2)] | H | H | H | OMe | H | H | H | H |
| S-29 | B[2)] | CH3 | CH3 | CH3 | H | H | H | H | H |
| S-30 | B[2)] | CH3 | CH3 | H | CH3 | H | H | H | H |
| S-31 | B[2)] | H | H | H | Ph | H | H/Ph[1)] | Ph/H[1)] | H |
| S-32 | B[2)] | H | H | t-Bu | H | H | H | H | H |
| S-33 | C[2)] | H | H | H | H | H | H | H | H |
| S-34 | C[2)] | F | H | H | H | H | H | H | H |
| S-35 | C[2)] | H | H | F | H | H | H | H | H |
| S-36 | C[2)] | F | H | F | H | H | H | H | H |
| S-37 | C[2)] | F | H | H | F | H | H | H | H |
| S-38 | C[2)] | H | H | CF3 | H | H | H | H | H |
| S-39 | C[2)] | H | CF3 | H | CF3 | H | H | H | H |
| S-40 | C[2)] | CF3 | H | H | H | H | H | H | H |
| S-41 | C[2)] | H | CH3 | H | CH3 | H | H | H | H |
| S-42 | C[2)] | H | H | CH3 | H | H | H | H | H |
| S-43 | C[2)] | H | H | Ph | H | H | H | H | H |
| S-44 | C[2)] | H | H | OMe | H | H | H | H | H |
| S-45 | C[2)] | CH3 | CH3 | H | H | H | H | H | H |
| S-46 | C[2)] | CH3 | H | CH3 | H | H | H | H | H |
| S-47 | C[2)] | H | H | Ph | H | H/Ph[1)] | Ph/H[1)] | H | H |
| S-48 | C[2)] | H | t-Bu | H | H | H | H | H | H |
| S-49 | D[2)] | H | H | H | H | H | H | H | H |
| S-50 | D[2)] | F | H | H | H | H | H | H | H |
| S-51 | D[2)] | H | H | F | H | H | H | H | H |

| Cpd. | | R45 | R44 | R43 | R42 | A24 | A23 | A22 | A21 |
|---|---|---|---|---|---|---|---|---|---|
| S-52 | D[2)] | F | H | F | H | H | H | H | H |
| S-53 | D[2)] | F | H | H | F | H | H | H | H |
| S-54 | D[2)] | H | H | CF3 | H | H | H | H | H |
| S-55 | D[2)] | H | CF3 | H | CF3 | H | H | H | H |
| S-56 | D[2)] | CF3 | H | H | H | H | H | H | H |
| S-57 | D[2)] | H | CH3 | H | CH3 | H | H | H | H |
| S-58 | D[2)] | H | H | CH3 | H | H | H | H | H |
| S-59 | D[2)] | H | H | Ph | H | H | H | H | H |
| S-60 | D[2)] | H | H | OMe | H | H | H | H | H |
| S-61 | D[2)] | CH3 | CH3 | H | H | H | H | H | H |
| S-62 | D[2)] | CH3 | H | CH3 | H | H | H | H | H |
| S-63 | D[2)] | H | H | Ph | H | H/Ph[1)] | Ph/H[1)] | H | H |
| S-64 | D[2)] | H | t-Bu | H | H | H | H | H | H |
| S-65 | A | H | [3)] | H | H | H | H | H | H |
| S-66 | B | H | [3)] | H | H | H | H | H | H |
| S-67 | C | H | [3)] | H | H | H | H | H | H |
| S-68 | D | H | [3)] | H | H | H | H | H | H |

[1)]mixture of isomers.

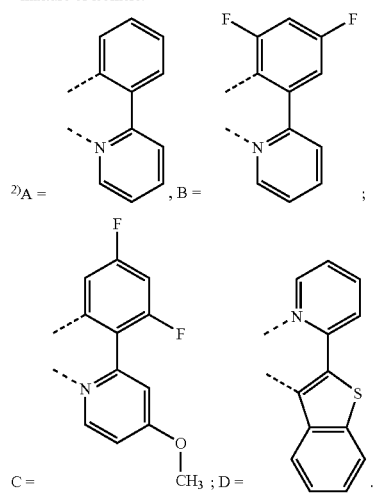

[2)] A = , B = ; C = ; D = .

[3)] 2,4,4-trimethylpent-2-yl.

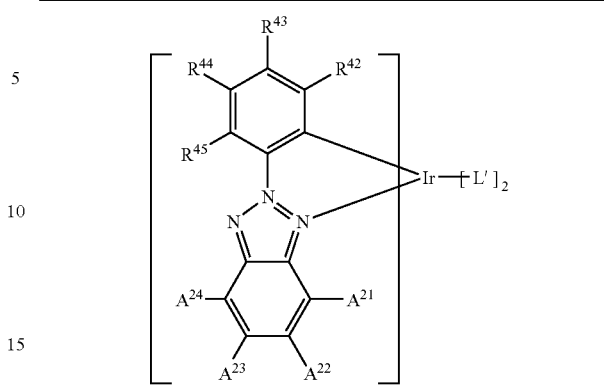

| Cpd. | L' | R45 | R44 | R43 | R42 | A24 | A23 | A22 | A21 |
|---|---|---|---|---|---|---|---|---|---|
| T-1 | A[2)] | H | H | H | H | H | H | H | H |
| T-2 | A[2)] | F | H | H | H | H | H | H | H |
| T-3 | A[2)] | H | H | F | H | H | H | H | H |
| T-4 | A[2)] | F | F | H | H | H | H | H | H |
| T-5 | A[2)] | F | H | H | F | H | H | H | H |
| T-6 | A[2)] | H | H | CF3 | H | H | H | H | H |
| T-7 | A[2)] | H | CF3 | H | CF3 | H | H | H | H |
| T-8 | A[2)] | CF3 | H | H | H | H | H | H | H |
| T-9 | A[2)] | H | CH3 | H | CH3 | H | H | H | H |
| T-10 | A[2)] | H | H | CH3 | H | H | H | H | H |
| T-11 | A[2)] | H | H | Ph | H | H | H | H | H |
| T-12 | A[2)] | H | H | OMe | H | H | H | H | H |
| T-13 | A[2)] | CH3 | CH3 | H | H | H | H | H | H |
| T-14 | A[2)] | CH3 | H | CH3 | H | H | H | H | H |
| T-15 | A[2)] | H | H | Ph | H | H | H/Ph[1)] | Ph/H[1)] | H |
| T-16 | A[2)] | H | t-Bu | H | H | H | H | H | H |
| T-17 | B[2)] | H | H | H | H | H | H | H | H |
| T-18 | B[2)] | F | F | H | H | H | H | H | H |
| T-19 | B[2)] | H | H | H | F | H | H | H | H |
| T-20 | B[2)] | F | H | H | H | H | H | H | H |
| T-21 | B[2)] | F | F | H | H | F | H | H | H |
| T-22 | B[2)] | H | H | H | CF3 | H | H | H | H |
| T-23 | B[2)] | H | H | CF3 | H | CF3 | H | H | H |
| T-24 | B[2)] | CF3 | CF3 | H | H | H | H | H | H |
| T-25 | B[2)] | H | H | CH3 | H | CH3 | H | H | H |
| T-26 | B[2)] | H | H | H | CH3 | H | H | H | H |
| T-27 | B[2)] | H | H | H | Ph | H | H | H | H |
| T-28 | B[2)] | H | H | H | OMe | H | H | H | H |
| T-29 | B[2)] | CH3 | CH3 | CH3 | H | H | H | H | H |
| T-30 | B[2)] | CH3 | CH3 | H | CH3 | H | H | H | H |
| T-31 | B[2)] | H | H | H | Ph | H | H/Ph[1)] | Ph/H[1)] | H |
| T-32 | B[2)] | H | H | t-Bu | H | H | H | H | H |
| T-33 | C[2)] | H | H | H | H | H | H | H | H |
| T-34 | C[2)] | F | H | H | H | H | H | H | H |
| T-35 | C[2)] | H | H | F | H | H | H | H | H |
| T-36 | C[2)] | F | H | F | H | H | H | H | H |
| T-37 | C[2)] | F | H | H | F | H | H | H | H |
| T-38 | C[2)] | H | H | CF3 | H | H | H | H | H |
| T-39 | C[2)] | H | CF3 | H | CF3 | H | H | H | H |
| T-40 | C[2)] | CF3 | H | H | H | H | H | H | H |
| T-41 | C[2)] | H | CH3 | H | CH3 | H | H | H | H |
| T-42 | C[2)] | H | H | CH3 | H | H | H | H | H |
| T-43 | C[2)] | H | H | Ph | H | H | H | H | H |
| T-44 | C[2)] | H | H | OMe | H | H | H | H | H |
| T-45 | C[2)] | CH3 | CH3 | H | H | H | H | H | H |
| T-46 | C[2)] | CH3 | H | CH3 | H | H | H | H | H |
| T-47 | C[2)] | H | H | Ph | H | H | H/Ph[1)] | Ph/H[1)] | H |
| T-48 | C[2)] | H | t-Bu | H | H | H | H | H | H |
| T-49 | D[2)] | H | H | H | H | H | H | H | H |
| T-50 | D[2)] | F | H | H | H | H | H | H | H |
| T-51 | D[2)] | H | H | F | H | H | H | H | H |
| T-52 | D[2)] | F | H | F | H | H | H | H | H |
| T-53 | D[2)] | F | H | H | F | H | H | H | H |
| T-54 | D[2)] | H | H | CF3 | H | H | H | H | H |
| T-55 | D[2)] | H | CF3 | H | CF3 | H | H | H | H |
| T-56 | D[2)] | CF3 | H | H | H | H | H | H | H |
| T-57 | D[2)] | H | CH3 | H | CH3 | H | H | H | H |
| T-58 | D[2)] | H | H | CH3 | H | H | H | H | H |
| T-59 | D[2)] | H | H | Ph | H | H | H | H | H |
| T-60 | D[2)] | H | H | OMe | H | H | H | H | H |
| T-61 | D[2)] | CH3 | CH3 | H | H | H | H | H | H |
| T-62 | D[2)] | CH3 | H | CH3 | H | H | H | H | H |

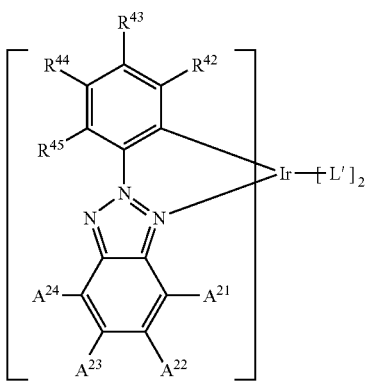

| Cpd. | L' | R45 | R44 | R43 | R42 | A24 | A23 | A22 | A21 |
|---|---|---|---|---|---|---|---|---|---|
| T-63 | D[2)] | H | H | Ph | H | H | H/Ph[1)] | Ph/H[1)] | H |
| T-64 | D[2)] | H | t-Bu | H | H | H | H | H | H |
| T-65 | A | H | [3)] | H | H | H | H | H | H |
| T-66 | B | H | [3)] | H | H | H | H | H | H |
| T-67 | C | H | [3)] | H | H | H | H | H | H |
| T-68 | D | H | [3)] | H | H | H | H | H | H |

[1)] mixture of isomers.

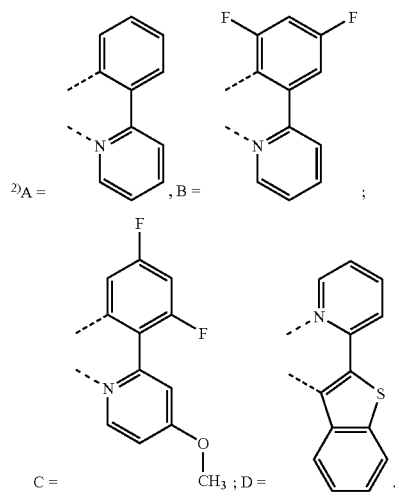

[2)] A = , B = ;
C = , D =

The metal complexes of the present invention can be prepared according to usual methods known in the prior art. A convenient one-step method for preparing iridium metal complexes of formula $Ir(L^a)_3$ comprises reacting commercially available iridium trichloride hydrate with an excess of $L^aH$ in the presence of 3 equivalents silver trifluoroacetate and optionally in the presence of a solvent (such as halogen based solvents, alcohol based solvents, ether based solvents, ester based solvents, ketone based solvents, nitrile based solvents, and water).

The tris-cyclometalated iridium complexes are isolated and purified by conventional methods. In some cases mixtures of isomers are obtained. Often the mixture can be used without isolating the individual isomers.

The iridium metal complexes of formula $Ir(L^a)_2L'$ can, for example be prepared by first preparing an intermediate iridium dimer of formula

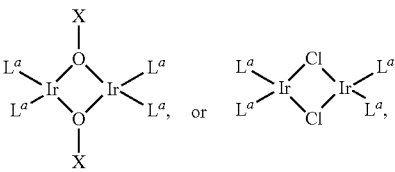

wherein X is H, methyl, or ethyl, and $L^a$ is as defined above, and then addition of HL'. The iridium dimers can generally be prepared by first reacting iridium trichloride hydrate with $HL^a$ and adding NaX and by reacting iridium trichloride hydrate with $HL^a$ in a suitable solvent, such as 2-ethoxyethanol.

Halogen is fluorine, chlorine, bromine and iodine.

$C_1$-$C_{24}$alkyl is a branched or unbranched radical such as for example methyl, ethyl, propyl, isopropyl, n-butyl, sec-butyl, isobutyl, tert-butyl, 2-ethylbutyl, n-pentyl, isopentyl, 1-methylpentyl, 1,3-dimethylbutyl, n-hexyl, 1-methylhexyl, n-heptyl, isoheptyl, 1,1,3,3-tetramethylbutyl, 1-methylheptyl, 3-methylheptyl, n-octyl, 2-ethylhexyl, 1,1,3-trimethylhexyl, 1,1,3,3-tetramethylpentyl, nonyl, decyl, undecyl, 1-methylundecyl, dodecyl, 1,1,3,3,5,5-hexamethylhexyl, tridecyl, tetradecyl, pentadecyl, hexadecyl, heptadecyl, octadecyl, icosyl or docosyl.

$C_1$-$C_{24}$perfluoroalkyl is a branched or unbranched radical such as for example $-CF_3$, $-CF_2CF_3$, $-CF_2CF_2CF_3$, $-CF(CF_3)_2$, $-(CF_2)_3CF_3$, and $-C(CF_3)_3$.

$C_1$-$C_{24}$alkoxy radicals are straight-chain or branched alkoxy radicals, e.g. methoxy, ethoxy, n-propoxy, isopropoxy, n-butoxy, sec-butoxy, tert-butoxy, amyloxy, isoamyloxy or tert-amyloxy, heptyloxy, octyloxy, isooctyloxy, nonyloxy, decyloxy, undecyloxy, dodecyloxy, tetradecyloxy, pentadecyloxy, hexadecyloxy, heptadecyloxy and octadecyloxy.

$C_2$-$C_{24}$alkenyl radicals are straight-chain or branched alkenyl radicals, such as e.g. vinyl, allyl, methallyl, isopropenyl, 2-butenyl, 3-butenyl, isobutenyl, n-penta-2,4-dienyl, 3-methyl-but-2-enyl, n-oct-2-enyl, n-dodec-2-enyl, isododecenyl, n-dodec-2-enyl or n-octadec-4-enyl.

$C_{2-24}$alkynyl is straight-chain or branched and preferably $C_{2-8}$alkynyl, which may be unsubstituted or substituted, such as, for example, ethynyl, 1-propyn-3-yl, 1-butyn-4-yl, 1-pentyn-5-yl, 2-methyl-3-butyn-2-yl, 1,4-pentadiyn-3-yl, 1,3-pentadiyn-5-yl, 1-hexyn-6-yl, cis-3-methyl-2-penten-4-yn-1-yl, trans-3-methyl-2-penten-4-yn-1-yl, 1,3-hexadiyn-5-yl, 1-octyn-8-yl, 1-nonyn-9-yl, 1-decyn-10-yl, or 1-tetracosyn-24-yl.

$C_4$-$C_{18}$cycloalkyl, especially $C_5$-$C_{12}$cycloalkyl, is preferably $C_5$-$C_{12}$cycloalkyl or said cycloalkyl substituted by one to three $C_1$-$C_4$alkyl groups, such as, for example, cyclopentyl, methylcyclopentyl, dimethylcyclopentyl, cyclohexyl, methylcyclohexyl, dimethylcyclohexyl, trimethylcyclohexyl, tert-butylcyclohexyl, cycloheptyl, cyclooctyl, cyclononyl, cyclodecyl, cyclododecyl, 1-adamantyl, or 2-adamantyl. Cyclohexyl, 1-adamantyl and cyclopentyl are most preferred.

Examples of $C_4$-$C_{18}$cycloalkyl, which is interrupted by S, O, or $NR^{25}$, are piperidyl, piperazinyl and morpholinyl.

$C_2$-$C_{24}$alkenyl is for example vinyl, allyl, butenyl, pentenyl, hexenyl, heptenyl, or octenyl.

Aryl is usually $C_6$-$C_{30}$aryl, preferably $C_6$-$C_{24}$aryl, which optionally can be substituted, such as, for example, phenyl, 4-methylphenyl, 4-methoxyphenyl, naphthyl, biphenylyl, 2-fluorenyl, phenanthryl, anthryl, tetracyl, pentacyl, hexacyl, terphenylyl or quadphenylyl; or phenyl substituted by one to three $C_1$-$C_4$alkyl groups, for example o-, m- or p-methylphenyl, 2,3-dimethylphenyl, 2,4-dimethylphenyl, 2,5-dimethylphenyl, 2,6-dimethylphenyl, 3,4-dimethylphenyl, 3,5-dimethylphenyl, 2-methyl-6-ethylphenyl, 4-tert-butylphenyl, 2-ethylphenyl or 2,6-diethylphenyl.

$C_7$-$C_{24}$aralkyl radicals are preferably $C_7$-$C_{15}$aralkyl radicals, which may be substituted, such as, for example, benzyl, 2-benzyl-2-propyl, β-phenethyl, α-methylbenzyl, α,α-dimethylbenzyl, ω-phenyl-butyl, ω-phenyl-octyl, ω-phenyl-dodecyl; or phenyl-$C_1$-$C_4$alkyl substituted on the phenyl ring by one to three $C_1$-$C_4$alkyl groups, such as, for example, 2-methylbenzyl, 3-methylbenzyl, 4-methylbenzyl, 2,4-dimethylbenzyl, 2,6-dimethylbenzyl or 4-tert-butylbenzyl. or 3-methyl-5-(1',1',3',3'-tetramethyl-butyl)benzyl.

Heteroaryl is typically $C_2$-$C_{26}$heteroaryl, i.e. a ring with five to seven ring atoms or a condensed rig system, wherein nitrogen, oxygen or sulfur are the possible hetero atoms, and is typically an unsaturated heterocyclic radical with five to 30 atoms having at least six conjugated π-electrons such as thienyl, benzo[b]thienyl, dibenzo[b,d]thienyl, thianthrenyl, furyl, furfuryl, 2H-pyranyl, benzofuranyl, isobenzofuranyl, dibenzofuranyl, phenoxythienyl, pyrrolyl, imidazolyl, pyrazolyl, pyridyl, bipyridyl, triazinyl, pyrimidinyl, pyrazinyl, pyridazinyl, indolizinyl, isoindolyl, indolyl, indazolyl, purinyl, quinolizinyl, chinolyl, isochinolyl, phthalazinyl, naphthyridinyl, chinoxalinyl, chinazolinyl, cinnolinyl, pteridinyl, carbazolyl, carbolinyl, benzotriazolyl, benzoxazolyl, phenanthridinyl, acridinyl, perimidinyl, phenanthrolinyl, phenazinyl, isothiazolyl, phenothiazinyl, isoxazolyl, furazanyl or phenoxazinyl, which can be unsubstituted or substituted.

$C_6$-$C_{18}$cycloalkoxy is, for example, cyclopentyloxy, cyclohexyloxy, cycloheptyloxy or cyclooctyloxy, or said cycloalkoxy substituted by one to three $C_1$-$C_4$alkyl, for example, methylcyclopentyloxy, dimethylcyclopentyloxy, methylcyclohexyloxy, dim ethylcyclohexyloxy, trim ethylcyclohexyloxy, or tert-butylcyclohexyloxy.

$C_6$-$C_{24}$aryloxy is typically phenoxy or phenoxy substituted by one to three $C_1$-$C_4$alkyl groups, such as, for example o-, m- or p-methylphenoxy, 2,3-dimethylphenoxy, 2,4-dimethylphenoxy, 2,5-dimethylphenoxy, 2,6-dimethylphenoxy, 3,4-dimethylphenoxy, 3,5-dimethylphenoxy, 2-methyl-6-ethylphenoxy, 4-tert-butylphenoxy, 2-ethylphenoxy or 2,6-diethylphenoxy.

$C_6$-$C_{24}$aralkoxy is typically phenyl-$C_1$-$C_9$alkoxy, such as, for example, benzyloxy, α-methylbenzyloxy, α,α-dimethylbenzyloxy or 2-phenylethoxy.

$C_1$-$C_{24}$alkylthio radicals are straight-chain or branched alkylthio radicals, such as e.g. methylthio, ethylthio, propylthio, isopropylthio, n-butylthio, isobutylthio, pentylthio, isopentylthio, hexylthio, heptylthio, octylthio, decylthio, tetradecylthio, hexadecylthio or octadecylthio.

$C_1$-$C_{24}$alkylselenium and $C_1$-$C_{24}$alkyltellurium are $C_1$-$C_{24}$alkylSe— and $C_1$-$C_{24}$alkylTe—, respectively.

Examples of a five or six membered ring formed by $R^9$ and $R^{10}$ and $R^{25}$ and $R^{26}$, respectively are heterocycloalkanes or heterocycloalkenes having from 3 to 5 carbon atoms which can have one additional hetero atom selected from nitrogen, oxygen and sulfur, for example

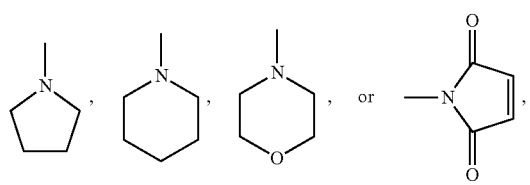

which can be part of a bicyclic system, for example

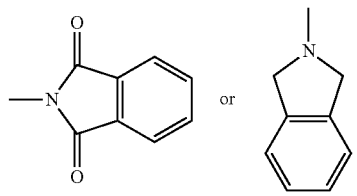

Possible substituents of the above-mentioned groups are $C_1$-$C_8$alkyl, a hydroxyl group, a mercapto group, $C_1$-$C_8$alkoxy, $C_1$-$C_8$alkylthio, halogen, halo-$C_1$-$C_8$alkyl, a cyano group, an aldehyde group, a ketone group, a carboxyl group, an ester group, a carbamoyl group, an amino group, a nitro group or a silyl group.

The term "haloalkyl" means groups given by partially or wholly substituting the above-mentioned alkyl group with halogen, such as trifluoromethyl etc. The "aldehyde group, ketone group, ester group, carbamoyl group and amino group" include those substituted by an $C_1$-$C_{24}$alkyl group, a $C_4$-$C_{18}$cycloalkyl group, an $C_6$-$C_{30}$aryl group, an $C_7$-$C_{24}$aralkyl group or a heterocyclic group, wherein the alkyl group, the cycloalkyl group, the aryl group, the aralkyl group and the heterocyclic group may be unsubstituted or substituted. The term "silyl group" means a group of formula —$SiR^{105}R^{106}R^{107}$, wherein $R^{105}$, $R^{106}$ and $R^{107}$ are independently of each other a $C_1$-$C_8$alkyl group, in particular a $C_1$-$C_4$ alkyl group, a $C_6$-$C_{24}$aryl group or a $C_7$-$C_{12}$aralkyl group, such as a trimethylsilyl group.

If a substituent occurs more than one time in a group, it can be different in each occurrence.

The present invention is also directed to an electronic device comprising the metal complex and its fabrication process. The electronic device can comprise at least one organic active material positioned between two electrical contact layers, wherein at least one of the layers of the device includes the metallic complex compound. The electronic device can comprise an anode layer (a), a cathode layer (e), and an active layer (c). Adjacent to the anode layer (a) is an optional hole-injecting/transport layer (b), and adjacent to the cathode layer (e) is an optional electron-injection/transport layer (d). Layers (b) and (d) are examples of charge transport layers.

The active layer (c) can comprise at least approximately 1 weight percent of metal complex previously described.

In some embodiments, the active layer (c) may be substantially 100% of the metal complex because a host charge transporting material, such as $Alq_3$ is not needed. By "substantially 100%" it is meant that the metal complex is the only material in the layer, with the possible exception of impurities or adventitious by-products from the process to form the layer. Still, in some embodiments, the metal complex may be a dopant within a host material, which is typically used to aid charge transport within the active layer (c). The active layer (c), including any of the metal complexes, can be a small molecule active material.

The device may include a support or substrate (not shown) adjacent to the anode layer (a) or the cathode layer (e). Most frequently, the support is adjacent the anode layer (a). The support can be flexible or rigid, organic or inorganic. Generally, glass or flexible organic films are used as a support. The anode layer (a) is an electrode that is more efficient for injecting holes compared to the cathode layer (e). The anode can include materials containing a metal, mixed metal, alloy, metal oxide or mixed-metal oxide. Suitable metal elements within the anode layer (a) can include the Groups 4, 5, 6, and 8-11 transition metals. If the anode layer (a) is to be light transmitting, mixed-metal oxides of Groups 12, 13 and 14 metals, such as indium-tin-oxide, may be used. Some non-limiting, specific examples of materials for anode layer (a) include indium-tin-oxide ("ITO"), aluminum-tin-oxide, gold, silver, copper, nickel, and selenium.

The anode layer (a) may be formed by a chemical or physical vapor deposition process or spin-cast process. Chemical vapor deposition may be performed as a plasma-enhanced chemical vapor deposition ("PECVD") or metal organic chemical vapor deposition ("MOCVD").

Physical vapor deposition can include all forms of sputtering (e.g., ion beam sputtering), e-beam evaporation, and resistance evaporation.

Specific forms of physical vapor deposition include rf magnetron sputtering or inductively-coupled plasma physical vapor deposition ("ICP-PVD"). These deposition techniques are well-known within the semiconductor fabrication arts.

A hole-transport layer (b) may be adjacent the anode. Both hole transporting small molecule compounds and polymers can be used.

Commonly used hole transporting molecules, in addition to N,N'-diphenyl-N,N'-bis(3-nnethylphenyl)-[1,1'-biphenyl]-4,4'-diamine (TPD) and bis[4-(N,N-diethylamino)-2-methylphenyl] (4-methylphenyl)methane (MPMP), include: polyvinyl-carbazol, 1,1-bis[(di-4-tolylamino)phenyl]cyclohexane (TAPC); N,N'-bis(4-methylphenyl)-N,N'-bis(4-ethylphenyl)-[1,1'-(3,3'-dimethyl)biphenyl]-4,4'-diamine (ETPD); tetrakis-(3-methylphenyl)-N,N,N',N'-2,5-phenylenediamine (PDA); a-phenyl-4-N,N-diphenylaminostyrene (TPS); p-(diethylamino)benzaldehyde diphenylhydrazone (DEH); triphenylamine (TPA); 1-phenyl-3-[p-(diethylamino)styryl]-5-[p-(diethylamino)phenyl] pyrazoline (PPR or DEASP); 1,2-trans-bis(9H-carbazol-9-yl)cyclobutane (DCZB); N,N,N',N'-tetrakis(4-methylphenyl)-(1,1'-biphenyl)-4,4'-diamine (TTB); and porphyrinic compounds, such as copper phthalocyanine.

Commonly used hole transporting polymers are polyvinylcarbazole, (phenylmethyl) polysilane, poly(3,4-ethylendioxythiophene) (PEDOT), and polyaniline. Hole-transporting polymers can be obtained by doping hole-transporting molecules such as those mentioned above into polymers such as polystyrene and polycarbonate.

The hole-injection/transport layer (b) can be formed using any conventional means, including spin-coating, casting, and printing, such as gravure printing. The layer can also be applied by ink jet printing, thermal patterning, or chemical or physical vapor deposition.

Usually, the anode layer (a) and the hole-injection/transport layer (b) are patterned during the same lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet-chemical or dry-etching techniques. Other processes for patterning that are well known in the art can also be used. When the electronic devices are located within an array, the anode layer (a) and hole injection/transport layer (b) typically are formed into substantially parallel strips having lengths that extend in substantially the same direction.

The active layer (c) may comprise the metal complexes described herein. The particular material chosen may depend on the specific application, potentials used during operation, or other factors. The active layer (c) may comprise a host material capable of transporting electrons and/or holes, doped with an emissive material that may trap electrons, holes, and/or excitons, such that excitons relax from the emissive material via a photoemissive mechanism. Active layer (c) may comprise a single material that combines transport and emissive properties. Whether the emissive material is a dopant or a major constituent, the active layer may comprise other materials, such as dopants that tune the emission of the emissive material. Active layer (c) may include a plurality of emissive materials capable of, in combination, emitting a desired spectrum of light. Examples of phosphorescent emissive materials include the metal complexes of the present invention. Examples of fluorescent emissive materials include DCM and DMQA. Examples of host materials include $Alq_3$, CBP and mCP. Examples of emissive and host materials are disclosed in U.S. Pat. No. 6,303,238, which is incorporated by reference in its entirety.

The active layer (c) can be applied from solutions by any conventional technique, including spin coating, casting, and printing. The active organic materials can be applied directly by vapor deposition processes, depending upon the nature of the materials.

Optional layer (d) can function both to facilitate electron injection/transport, and also serve as a buffer layer or confinement layer to prevent quenching reactions at layer interfaces. More specifically, layer (d) may promote electron mobility and reduce the likelihood of a quenching reaction if layers (c) and (e) would otherwise be in direct contact. Examples of materials for optional layer (d) include metal-cheated oxinoid compounds (e.g., $Alq_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like; azole compounds (e.g., 2-(4-biphenylyl)-5-(4-t-butylphenyl)-1,3,4-oxadiazole ("PBD") or the like, 3-(4-biphenylyl)-4-phenyl-5-(4-t-butylphenyl)-1,2,4-triazole ("TAZ") or the like; other similar compounds; or any one or more combinations thereof. Alternatively, optional layer (d) may be inorganic and comprise BaO, LiF, $Li_2O$, or the like.

The electron injection/transport layer (d) can be formed using any conventional means, including spin-coating, casting, and printing, such as gravure printing. The layer can also be applied by ink jet printing, thermal patterning, or chemical or physical vapor deposition.

The cathode layer (e) is an electrode that is particularly efficient for injecting electrons or negative charge carriers. The cathode layer (e) can be any metal or nonmetal having a lower work function than the first electrical contact layer (in this case, the anode layer (a)). Materials for the second electrical contact layer can be selected from alkali metals of Group 1 (e.g., Li, Na, K, Rb, Cs), the Group 2 (alkaline earth) metals, the Group 12 metals, the rare earths, the lanthanides (e.g., Ce, Sm, Eu, or the like), and the actinides. Materials, such as aluminum, indium, calcium, barium, yttrium, and magnesium, and combinations thereof, may also be used. Li-containing organometallic compounds, LiF, and $Li_2O$ can also be deposited between the organic layer and the cathode layer to lower the operating voltage. Specific non-limiting examples of materials for the cathode layer (e) include barium, lithium, cerium, cesium, europium, rubidium, yttrium, magnesium, or samarium.

The cathode layer (e) is usually formed by a chemical or physical vapor deposition process. In general, the cathode layer will be patterned, as discussed above in reference to the anode layer (a) and optional hole injecting layer (b). If the device lies within an array, the cathode layer (e) may be patterned into substantially parallel strips, where the lengths of the cathode layer strips extend in substantially the same direction and substantially perpendicular to the lengths of the anode layer strips.

Electronic elements called pixels are formed at the cross points (where an anode layer strip intersects a cathode layer strip when the array is seen from a plan or top view).

In other embodiments, additional layer (s) may be present within organic electronic devices. For example, a layer (not shown) between the hole injecting layer (b) and the active layer (c) may facilitate positive charge transport, band-gap matching of the layers, function as a protective layer, or the like. Similarly, additional layers (not shown) between the electron injecting layer (d) and the cathode layer (e) may facilitate negative charge transport, band-gap matching between the layers, function as a protective layer, or the like. Layers that are known in the art can be used. Some or all of the layers may be surface treated to increase charge carrier transport efficiency. The choice of materials for each of the component layers may be determined by balancing the goals of providing a device with high device efficiency with the cost of manufacturing, manufacturing complexities, or potentially other factors.

The charge transport layers (b) and (d) are generally of the same type as the active layer (c). More specifically, if the active layer (c) has a small molecule compound, then the charge transport layers (b) and (d), if either or both are present, can have a different small molecule compound. If the active layer (c) has a polymer, the charge transport layers (b) and (d), if either or both are present, can also have a different polymer. Still, the active layer (c) may be a small molecule compound, and any of its adjacent charge transport layers may be polymers.

Each functional layer may be made up of more than one layer. For example, the cathode layer may comprise a layer of a Group 1 metal and a layer of aluminum. The Group 1 metal may lie closer to the active layer (c), and the aluminum may help to protect the Group 1 metal from environmental contaminants, such as water.

Although not meant to limit, the different layers may have the following range of thicknesses: inorganic anode layer (a), usually no greater than approximately 500 nm, for example, approximately 50-200 nm; optional hole-injecting layer (b), usually no greater than approximately 100 nm, for example, approximately 50-200 nm; active layer (c), usually no greater than approximately 100 nm, for example, approximately 10-80 nm; optional electron-injecting layer (d), usually no greater than approximately 100 nm, for example, approximately 10-80 nm; and cathode layer (e), usually no greater than approximately 1000 nm, for example, approximately 30-500 nm. If the anode layer (a) or the cathode layer (e) needs to transmit at least some light, the thickness of such layer may not exceed approximately 100 nm.

The location of the electron-hole recombination zone in the device, and thus the emission spectrum of the device, can be affected by the relative thickness of each layer. For example, when a potential light-emitting compound, such as $Alq_3$ is used in the electron transport layer (d), the electron-hole recombination zone can lie within the $Alq_3$ layer.

The emission would then be that of $Alq_3$, and not a desired sharp emission. Thus, the thickness of the electron-transport layer should be chosen so that the electron-hole recombination zone lies within the light-emitting layer (i.e., active layer (c)). The desired ratio of layer thicknesses can depend on the exact nature of the materials used.

The efficiency of the devices made with metal complexes can be further improved by optimizing the other layers in the device. For example, more efficient cathodes such as Ca, Ba, Mg/Ag, or LiF/Al can be used. Shaped substrates and hole transport materials that result in a reduction in operating voltage or increase quantum efficiency are also applicable. Additional layers can also be added to tailor the energy levels of the various layers and facilitate electroluminescence.

Depending upon the application of the electronic device, the active layer (c) can be a light-emitting layer that is activated by a signal (such as in a light-emitting diode) or a layer of material that responds to radiant energy and generates a signal with or without an applied potential (such as detectors or voltaic cells). Examples of electronic devices that may respond to radiant energy are selected from photoconductive cells, photoresistors, photoswitches, phototransistors, and phototubes, and photovoltaic cells. After reading this specification, skilled artisans will be capable of selecting material (s) that for their particular applications.

In OLEDs, electrons and holes, injected from the cathode (e) and anode (a) layers, respectively, into the photoactive layer (c), form negative and positively charged polarons in the active layer (c). These polarons migrate under the influence of the applied electric field, forming a polaron exciton with an oppositely charged species and subsequently undergoing radiative recombination. A sufficient potential difference between the anode and cathode, usually less than approximately 20 volts, and in some instances no greater than approximately 5 volts, may be applied to the device. The actual potential difference may depend on the use of the device in a larger electronic component. In many embodiments, the anode layer (a) is biased to a positive voltage and the cathode layer (e) is at substantially ground potential or zero volts during the operation of the electronic device. A battery or other power source (s) may be electrically connected to the electronic device as part of a circuit.

In other embodiments, the phosphorus-containing metal complex compound can be used as a charge transport material in layer (b) or (d).

The compound does not need to be in a solid matrix diluent (e.g., host charge transport material) when used in layer (b) (c), or (d) in order to be effective. A layer greater than approximately 1% by weight of the metal complex compound, based on the total weight of the layer, and up to substantially 100% of the complex compound can be used as the active layer (c). Additional materials can be present in the active layer (c) with the complex compound. For example, a fluorescent dye may be present to alter the color of emission.

A diluent may also be added. The diluent can be a polymeric material, such as poly(N-vinyl carbazole) and polysilane. It can also be a small molecule, such as 4,4'-N,N'-dicarbazole biphenyl or tertiary aromatic amines. When a diluent is used, the complex compound is generally present in a small amount, usually less than 20% by weight, preferably less than 10% by weight, based on the total weight of the layer.

The metallic complexes may be used in applications other than electronic devices. For example, the complexes may be used as catalysts or indicators (e.g., oxygen-sensitive indicators, phosphorescent indicators in bioassays, or the like).

The following examples illustrate certain features and advantages of the present invention. They are intended to be illustrative of the invention, but not limiting. All percentages are by weight, unless otherwise indicated.

EXAMPLES

Example 1

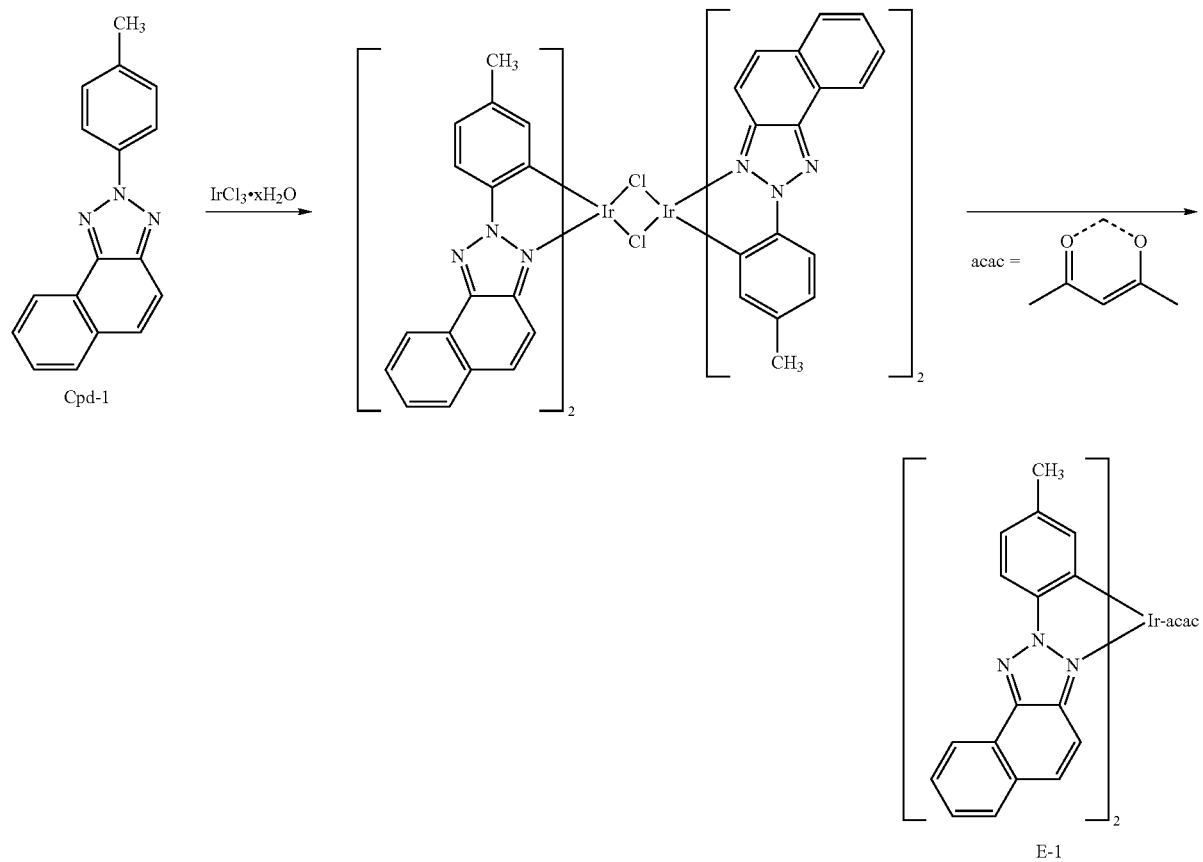

0.46 g (1.78 mmol) of Cpd-1 and 0.35 g (0.99 mmol) iridium(III) chloride hydrate (54%) are dissolved in 10 ml 2-ethoxyethanol and 3 ml water. The reaction mixture is heated to 120° C. for 23 h. The orange product is filtered off and is washed with ethanol and acetone. To the crude product 0.15 g (1.50 mmol) of acetyl acetone, 0.40 (3.76 mmol) sodium carbonate and 15 ml 2-ethoxyethanol are added. The reaction mixture is heated for 20 h at 120° C. The product is filtered off and is washed with water and diethyl ether. A column chromatography on silica gel with toluene and a second column chromatography on silica gel with hexane/ethyl acetate 20/1 leads to the desired product E-1.

Example 2 a) To a solution of 30.7 g (0.283 mmol) phenylhydrazine in 200 ml ethanol 20.0 g (0.142 mmol) 1-fluor-2-nitrobenzene is added dropwise. The reaction mixture is stirred for 27 h and then poured into water. The water phase is extracted with dichloromethane. The organic phase is dried with magnesium sulphate and the solvent is removed in vacuum. The product

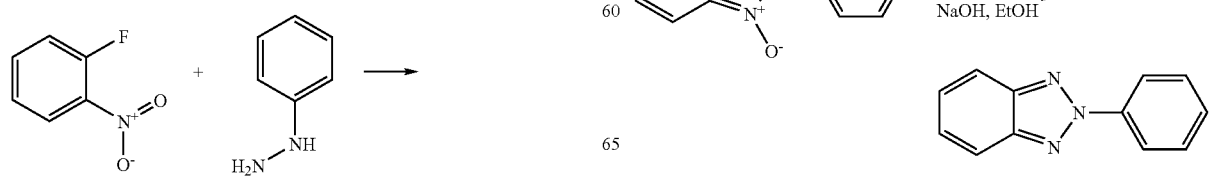

b) 31.0 g (0.136 mol) of the product of example 2a) are refluxed in 200 ml ethanol. To this solution 54.6 (1.36 mol) sodium hydroxide are added. 61.5 g (0.300 mol) sodium dithionite are added. The reaction mixture is refluxed for 27 h. Dichloromethane is added and the organic phase is washed with water. The organic phase is dried with magnesium sulphate and the solvent is removed in vacuum. The product is crystallized two times from ethanol and then from i-propanol (yield: 5.30 g (20%)).

Example 3

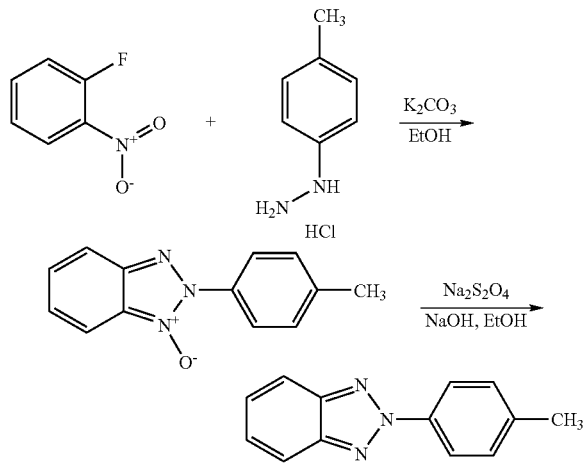

a) To 5.62 g (35.4 mmol) 4-methyl-phenylhydrazine hydrochloride in 120 ml ethanol 4.90 g (35.4 mmol) potassium carbonate are added. The reaction mixture is refluxed and 5.00 g (35.4 mmol) 1-fluor-2-nitrobenzene are added. After 43 h the reaction mixture is diluted with water and diethyl ether. The organic phase is separated and dried with magnesium sulphate. The solvent is removed in vacuum.

b) Example 3b) correspond to example 2b), except that the product of example 3a) is used.

Example 4

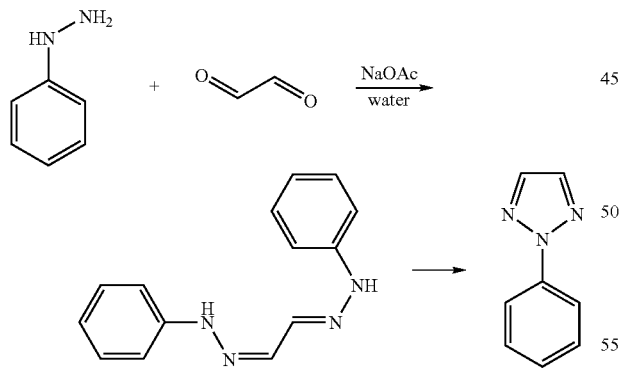

a) To a solution of 22.6 (0.276 mol) sodium acetate in 250 ml water 15.7 g (0.145 mmol) phenylhydrazine are added. To this solution 10 g (68.9 mmol) of a 40% solution of glyoxal in water are added. After stirring this reaction mixture for 4 h the product is filtered off and washed with water (yield: 16.5 g (100%)).

b.) 6.25 g (26.2 mmol) of the product of example 4a are added to a solution of 16.4 g (65.5 mmol) of CuSO$_4$ in 70 ml water. The reaction mixture is stirred for 17 h at 80° C. The product is removed from the water and is transferred to a water steam distillation apparatus. To the distillate sodium chloride is added until saturation. The water phase is extracted with diethyl ether. The organic phase is washed with 10% HCl and water. The organic phase is dried with MgSO$_4$ and the solvent is removed in vacuum.

Example 5

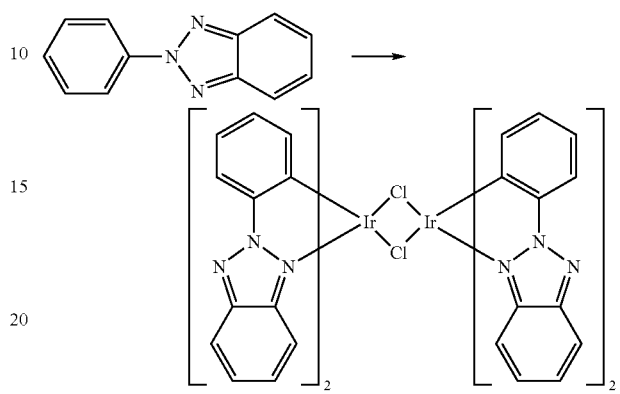

1.60 g (8.20 mmol) 2-phenyl-benzotriazole and 0.61 g (2.04 mmol) of IrCl$_3$ hydrate are refluxed for 20 h at 150° C. in 160 ml 2-ethoxyethanol/water (3:1). After cooling the reaction mixture to room temperature the orange solid is filtered off and washed with 15 ml of ethanol giving 0.93 g of the chloro-bridged dimer after drying.

Example 6

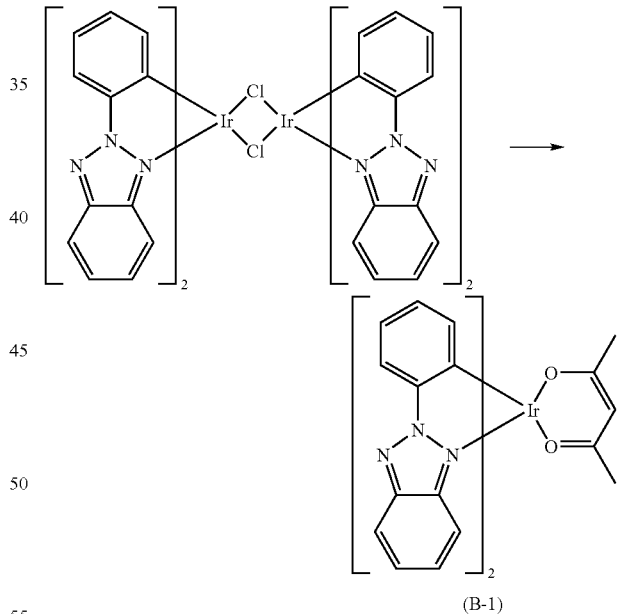

(B-1)

0.271 g (0.219 mmol) of the chloro-bridged dimer prepared according to example 5 are stirred in the presence of 0.080 g (0.800 mmol) acetyl acetonate and 0.270 g (2.55 mmol) sodium carbonate in 18 ml of 2-ethoxyethanol for 2 h at 140° C. After cooling to room temperature the suspension is filtered, and the solid washed twice with dichloromethane. After removal of the solvents, the product is dissolved in dichloromethane and insoluble material filtered off. The homogeneous solution is concentrated under vacuum till precipitation initiated. After filtration 0.219 g of product is isolated (Melting point: 308° C.-318° C.)

Example 7

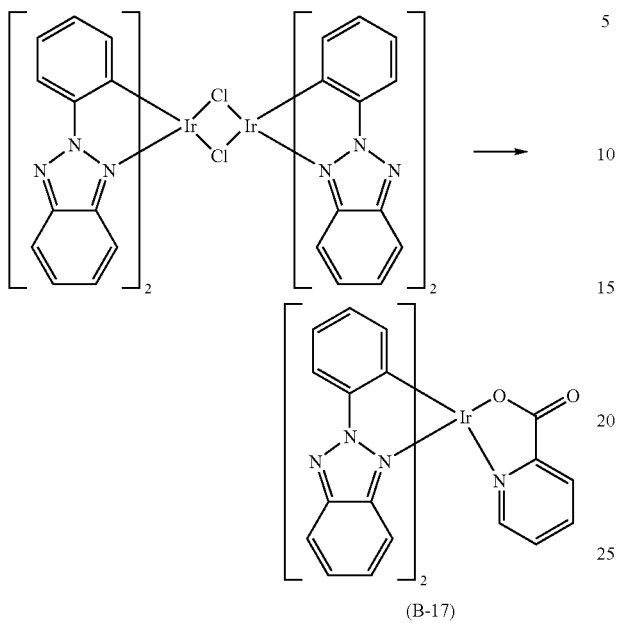

(B-17)

0.150 g (0.122 mmol) of the chloro-bridged dimmer prepared according to example 5 are stirred in the presence of 0.030 g (0.244 mmol) picolinic acid in 2.90 ml of dichloromethane for 18 h at reflux. After cooling to room temperature the solution is diluted with dichloromethane and dropped onto hexane. The yellow suspension is filtered, and the solid washed with hexane. Then, the product is dissolved in dichloromethane and covered with a layer of hexane. After filtration, the solid is washed with hexane yielding 98.9 mg orange crystals (Melting point: 225.1° C.).

Example 8

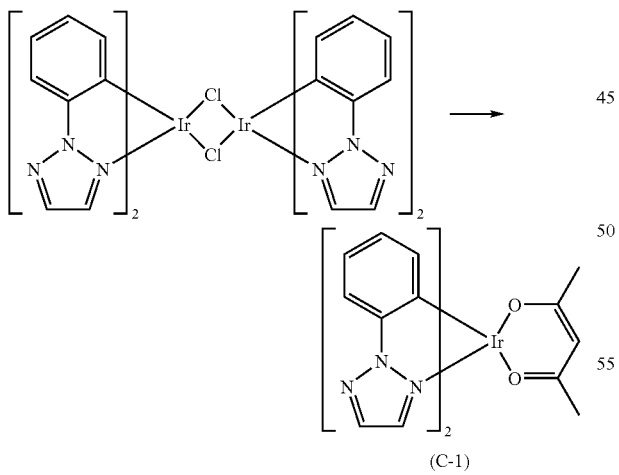

(C-1)

0.150 g (0.145 mmol) of the corresponding chloro-bridged dimer prepared according to the procedure of example 5 are stirred in the presence of 0.036 g (0.363 mmol) acetyl acetonate and 0.17 g (1.60 mmol) sodium carbonate in 3 ml of 2-ethoxyethanol for 15 h at 100° C. After cooling to room temperature the suspension is diluted with dichloromethane. The solution is extracted twice with water. The organic layer is dried over sodium sulfate and filtered and the solvent evaporated. The yellow solid is dissolved in dichloromethane and dropped onto hexane. After filtration, the solid is washed with hexane yielding 123.9 mg of yellow crystals (Melting point: 311.3° C.).

Example 9

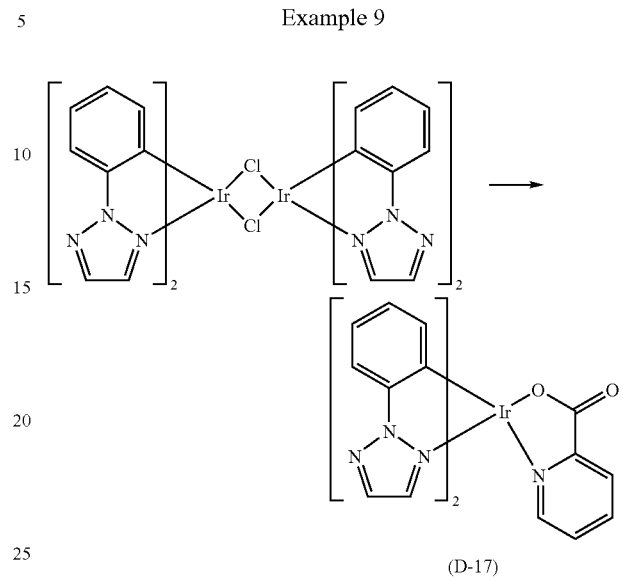

(D-17)

0.150 g (0.145 mmol) of the corresponding chloro-bridged dimer prepared according to the procedure of example 5 are stirred in the presence of 0.036 g (0.291 mmol) picolinic acid in 3.50 ml of dichloromethane for 20 h at reflux. After cooling to room temperature the solution is diluted with dichloromethane and dropped onto hexane. The yellow suspension is filtered, and the solid washed with hexane. Then, the product is dissolved in dichloromethane and covered with a layer of hexane. Finally, the solid formed is filtered off and washed with hexane yielding 124 mg of yellow crystals (Melting point: 164.7° C.).

Example 10

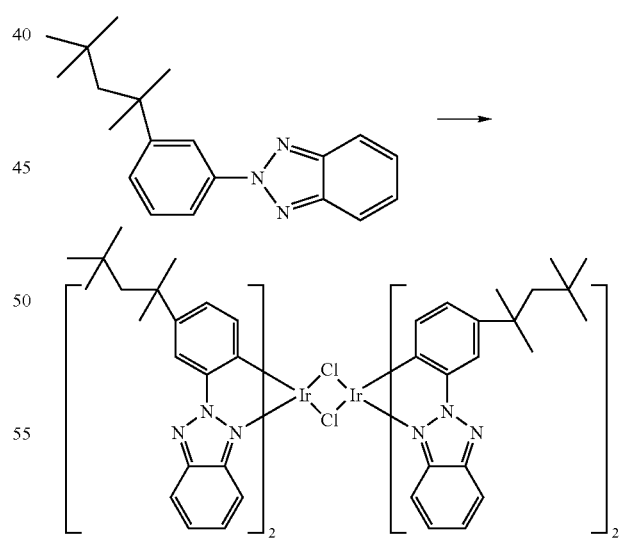

0.970 g (3.15 mmol) 2-[3-(1,1,3,3-Tetramethyl-butyl)-phenyl]-benzotriazole and 0.450 g (1.50 mmol) of $IrCl_3$ hydrate are refluxed for 20 h at 150° C. in 20 ml 2-ethoxyethanol/water (3:1). After cooling to room temperature the orange solid is filtered off, washed with 4 ml of ethanol and 6 ml of hexane giving 0.84 g of the chloro-bridged dimer after drying.

Example 11

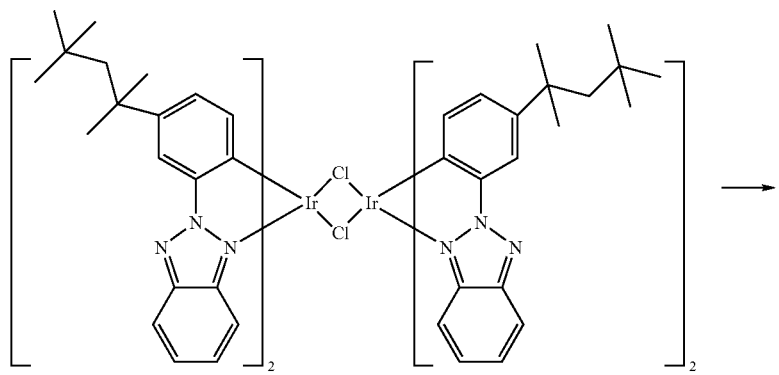

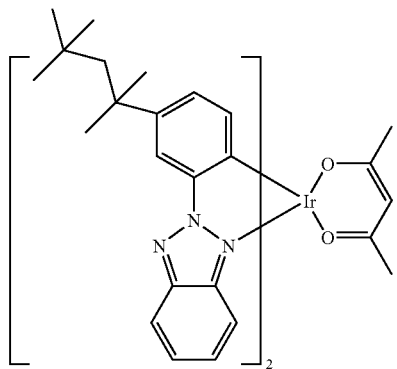

(A-17)

0.084 g (0.05 mmol) of the chloro-bridged dimer prepared according to example 6 are stirred in the presence of 0.013 g (0.125 mmol) acetyl acetonate and 0.055 g (0.50 mmol) sodium carbonate in 2 ml 2-ethoxyethanol for 18 h at 140° C. After cooling to room temperature the suspension is diluted with dichloromethane, washed twice with water, dried, filtered and the solvent evaporated. The solid residue is purified by flash chromatography yielding 0.075 g of the product as an orange powder (Melting point: 268° C.).

Example 12

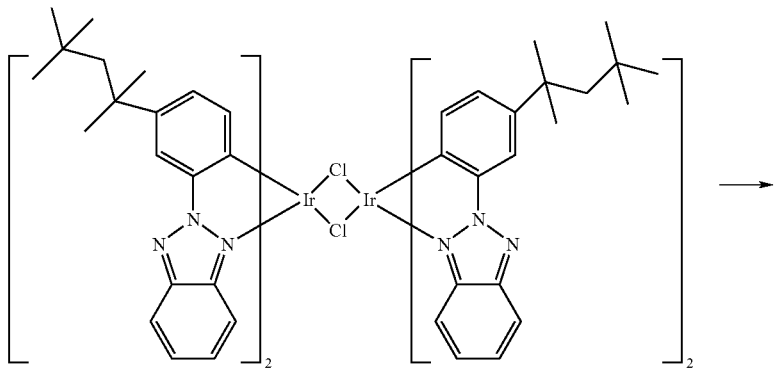

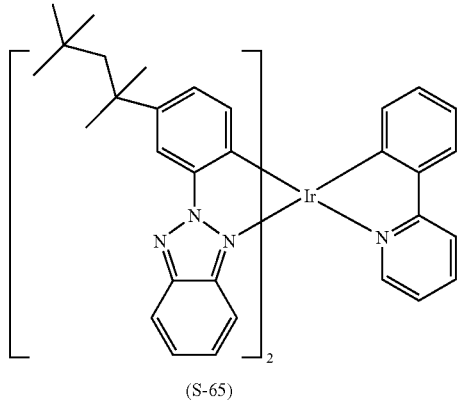

(S-65)

0.084 g (0.05 mmol) of the chloro-bridged dimer prepared according to example 10 are stirred in the presence of 0.029 g (0.13 mmol) silver trifluoromethane sulfonate in 4 ml acetone for 2 h at 55° C. After cooling to room temperature 0.016 g (0.11 mmol) 2-phenylpyridine was added and the reaction was stirred for another 16 h at 55° C. The orange suspension is cooled to room temperature, diluted with dichloromethane, washed twice with water, dried, filtered and evaporated to dryness. The solid residue is purified by flash chromatography yielding 0.064 g of the product as an orange powder (Melting point: 280° C.).

Example 13

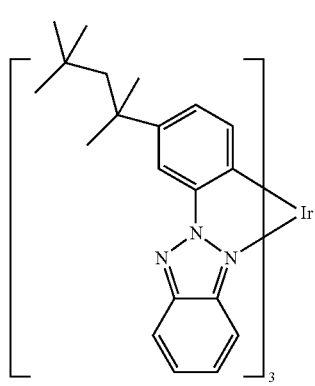

(A-17)

0.61 g (2.0 mmol) of 2-[3-(1,1,3,3-Tetramethyl-butyl)-phenyl]-2-benzotriazole and 0.16 g IrCl₃ hydrate (0.6 mmol) are reacted under standard conditions. The raw product is purified by flash chromatography yielding 0.057 g of the product as yellow powder (Melting point: 316° C.).

Example 14

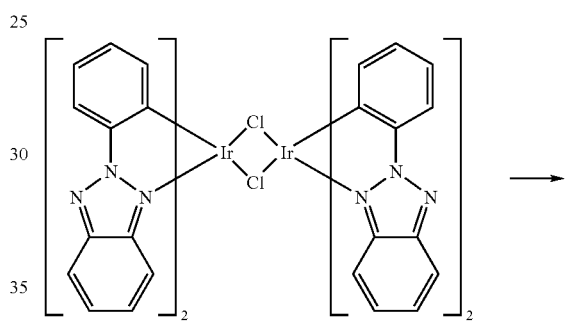

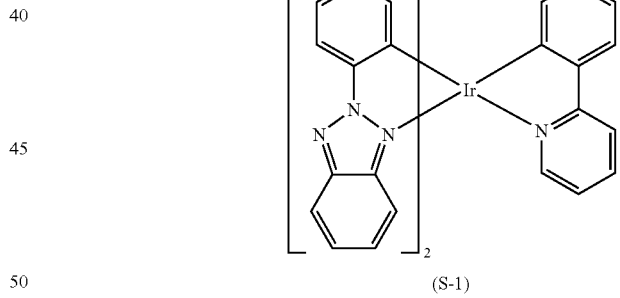

(S-1)

0.062 g (0.05 mmol) of the chloro-bridged dimer prepared according to example 5 is stirred in the presence of 0.016 g (0.80 mmol) 2-phenylpyridine and 0.290 g (0.13 mmol) silver trifluoromethane sulfonate in 5 ml ethylene glycol for 18 h at 180° C. After cooling to room temperature the suspension is diluted with dichloromethane, washed twice with water, dried, filtered and evaporated to dryness. The solid residue is purified by flash chromatography yielding 0.01 g of the product as an orange powder.

Application Example 1

An organic luminescence device having a single organic layer is prepared in the following manner: On a glass substrate, a 100 nm thick ITO film is formed by sputtering and subsequently patterned. Onto the oxygen-plasma treated ITO film a 80 nm thick hole-injection layer using PEDOT:PSS (Baytron P) is formed by spin-coating followed by heating at 200° C. (5 minutes). A solution of 5 mg of compound B-1 (Example 6) and 95 mg of polyfluorene (average molecular weight 140 000) in 10 g of toluene are applied by spin coating (2000 rpm.; 10 seconds) to obtain a thickness of 80 nm. After the thus-treated substrate has been set in a vacuum deposition chamber, a cathode having a two-layer electrode structure is formed by depositing 50 nm barium followed by 100 nm aluminum. When the device is driven at a current density of 1 mA/cm$^2$ (at 8V), it shows a clear bright white emission (CIE 0.30, 0.33) with an efficacy of 0.7 cd/A.

The invention claimed is:

1. A compound of formula (VIa), (VIb), (VIIa), (VIIb), (VIIc), (VIId), (VIIIa) or (VIIIb)

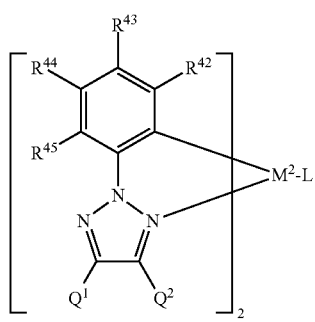
(VIa)

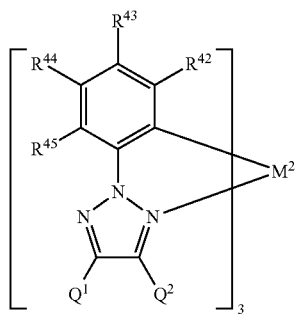
(VIb)

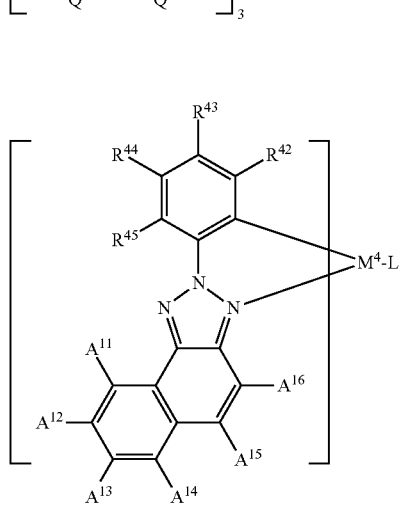
(VIIa)

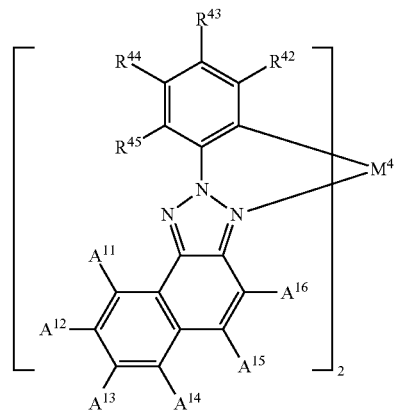
(VIIb)

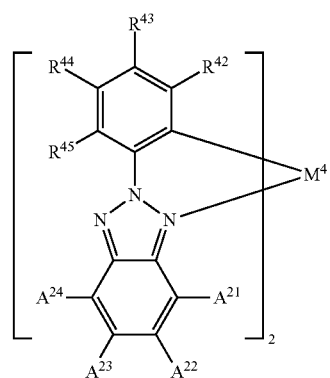
(VIIc)

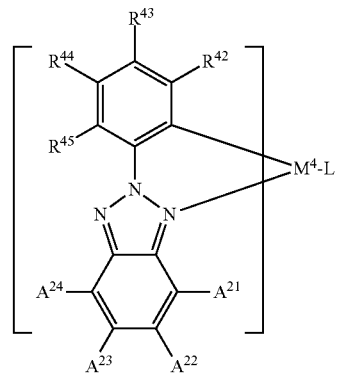
(VIId)

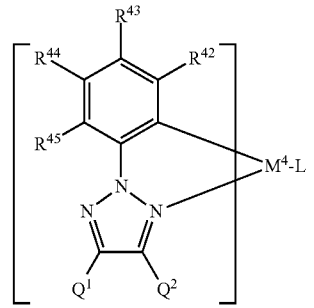
(VIIIa)

-continued

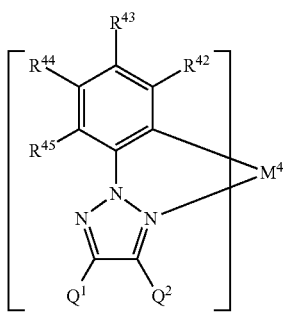

(VIIIb)

wherein
M² is Rh, Re or Ir;
M⁴ is Pd or Pt;
$Q^1$ and $Q^2$ are independently of each other hydrogen, $C_1$-$C_{24}$alkyl or $C_6$-$C_{18}$aryl which is optionally substituted by G;
L is a bidentate ligand;
$A^{11}, A^{12}, A^{13}, A^{14}, A^{15}$ and $A^{16}$ are independently of each other H, CN, halogen, $C_1$-$C_{24}$alkyl, $C_1$-$C_{24}$perfluoroalkyl, $C_1$-$C_{24}$alkoxy, $C_1$-$C_{24}$alkylthio, $C_6$-$C_{18}$aryl, —$NR^{25}R^{26}$, —$CONR^{25}R^{26}$, —$COOR^{27}$ or $C_2$-$C_{10}$heteroaryl which is optionally substituted by G;
$A^{21}, A^{22}, A^{23}$ and $A^{24}$ are independently of each other hydrogen, halogen, $C_1$-$C_{24}$alkyl, $C_1$-$C_{24}$alkoxy, $C_1$-$C_{24}$alkylthio, $C_1$-$C_{24}$perfluoroalkyl, $C_6$-$C_{18}$aryl which is optionally substituted by G, —$NR^{25}R^{26}$, —$CONR^{25}R^{26}$, —$COOR^{27}$ or $C_2$-$C_{10}$heteroaryl which is optionally substituted by G; or
$A^{22}$ and $A^{23}$ are a group of formula

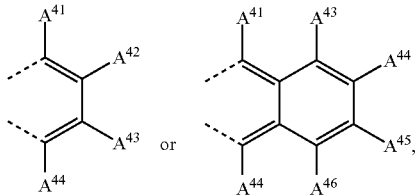

wherein $A^{41}, A^{42}, A^{43}, A^{44}, A^{45}$ and $A^{46}$ are independently of each other H, halogen, CN, $C_1$-$C_{24}$alkyl, $C_1$-$C_{24}$perfluoroalkyl, $C_1$-$C_{24}$alkoxy, $C_1$-$C_{24}$alkylthio, $C_6$-$C_{18}$aryl which may optionally be substituted by G, —$NR^{25}R^{26}$, —$CONR^{25}R^{26}$, —$COOR^{27}$ or $C_2$-$C_{10}$heteroaryl;
$R^{25}$ and $R^{26}$ are independently of each other $C_6$-$C_{18}$aryl, $C_7$-$C_{18}$aralkyl or $C_1$-$C_{24}$alkyl, $R^{27}$ is $C_1$-$C_{24}$alkyl, $C_6$-$C_{18}$aryl or $C_7$-$C_{18}$aralkyl;
G is $C_1$-$C_{18}$alkyl, —$OR^{305}$, —$SR^{305}$, —$NR^{305}R^{306}$, —$CONR^{305}R^{306}$ or —CN, wherein $R^{305}$ and $R^{306}$ are independently of each other $C_6$-$C_{18}$aryl, $C_6$-$C_{18}$aryl which is substituted by $C_1$-$C_{18}$alkyl or $C_1$-$C_{18}$alkoxy, $C_1$-$C_{18}$alkyl or $C_1$-$C_{18}$alkyl which is interrupted by —O—; or
$R^{305}$ and $R^{306}$ together form a five or six membered ring;
$R^{42}$ is hydrogen, $C_1$-$C_{24}$alkyl, CN, $C_1$-$C_{24}$alkyl which is substituted by halogen, $C_6$-$C_{18}$-aryl, $C_6$-$C_{18}$aryl which is substituted by $C_1$-$C_{12}$alkyl or $C_1$-$C_8$alkoxy,
$R^{43}$ is hydrogen, CN, halogen, $C_1$-$C_{24}$alkyl which is substituted by F, $C_6$-$C_{18}$aryl, $C_6$-$C_{18}$aryl which is substituted by $C_1$-$C_{12}$alkyl, $C_1$-$C_8$alkoxy, —$CONR^{25}R^{26}$, —$COOR^{27}$, wherein
$E^2$ is —S—, —O— or —$NR^{25'}$—, wherein $R^{25'}$ is $C_1$-$C_{24}$alkyl or $C_6$-$C_{10}$aryl,
$A^{11'}, A^{12'}, A^{13'}$ and $A^{14'}$ are independently of each other H, halogen, CN, $C_1$-$C_{24}$alkyl, $C_1$-$C_{24}$alkoxy, $C_1$-$C_{24}$alkylthio, —$NR^{25}R^{26}$, —$CONR^{25}R^{26}$ or —$COOR^{27}$,
$R^{110}$ is H, CN, $C_1$-$C_{24}$alkyl, $C_1$-$C_{24}$alkoxy, $C_1$-$C_{24}$alkylthio, —$NR^{25}R^{26}$, —$CONR^{25}R^{26}$ or —$COOR^{27}$ or
$R^{42}$ and $R^{43}$ are a group of formula wherein $A^{41}, A^{42}, A^{43}, A^{44}, A^{45}$ and $A^{46}$ are independently of each other H, halogen, CN, $C_1$-$C_{24}$alkyl, $C_1$-$C_{24}$perfluoroalkyl, $C_1$-$C_{24}$alkoxy, $C_1$-$C_{24}$alkylthio, $C_6$-$C_{18}$aryl which may optionally be substituted by G, —$NR^{25}R^{26}$, —$CONR^{25}R^{26}$, —$COOR^{27}$ or $C_2$-$C_{10}$heteroaryl;
$R^{44}$ is hydrogen, CN, $C_1$-$C_{24}$alkyl, $C_1$-$C_{24}$alkyl which is substituted by halogen, $C_6$-$C_{18}$-aryl, $C_6$-$C_{18}$-aryl which is substituted by $C_1$-$C_{12}$ alkyl or $C_1$-$C_8$alkoxy and
$R^{45}$ is hydrogen, CN, $C_1$-$C_{24}$alkyl, $C_1$-$C_{24}$alkyl which is substituted halogen, $C_6$-$C_{18}$-aryl, $C_6$-$C_{18}$-aryl which is substituted by $C_1$-$C_{12}$ alkyl or $C_1$-$C_8$alkoxy.

2. A compound according to claim 1 wherein the bidentate ligand L is a compound of formula wherein the ring A, represents an optionally substituted aryl group which can optionally contain heteroatoms, the ring B,

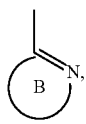

represents an optionally substituted nitrogen containing aryl group, which can optionally contain further heteroatoms, or the ring A may be taken with the ring B binding to the ring A to form a ring of formula

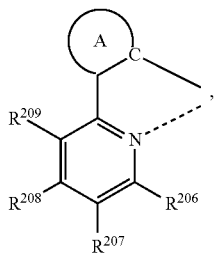

wherein $R^{206}$, $R^{207}$, $R^{208}$, and $R^{209}$ are independently of each other hydrogen, $C_1$-$C_{24}$alkyl, $C_2$-$C_{24}$alkenyl, $C_2$-$C_{24}$alkynyl, aryl, heteroaryl, $C_1$-$C_{24}$alkoxy, $C_1$-$C_{24}$alkylthio, cyano, acyl, alkyloxycarbonyl, a nitro group or a halogen atom; the ring A represents an optionally substituted aryl or heteroaryl group; or the ring A may be taken with the pyridyl group binding to the ring A to form a ring; and the alkyl group, alkenyl group, alkynyl group, aryl group, heteroaryl group, alkoxy group, alkylthio group, acyl group, and alkyloxycarbonyl group represented by $R^{206}$, $R^{207}$, $R^{208}$ and $R^{209}$ may be substituted.

3. A compound according to claim 1 wherein

L is a bidentate ligand selected from 3-(diphenylphosphino)-1-oxypropane, 1,1-bis(trifluoromethyl)-2-(diphenylphosphino)-ethoxide,

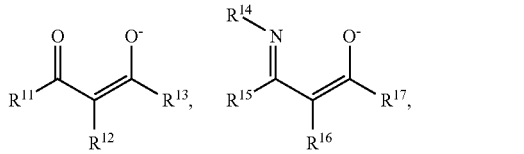

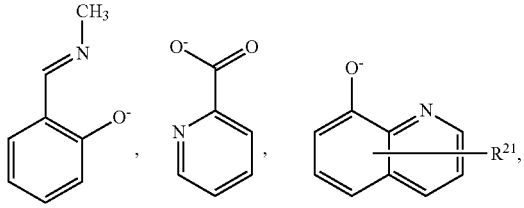

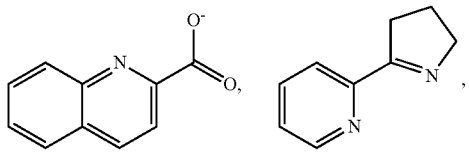

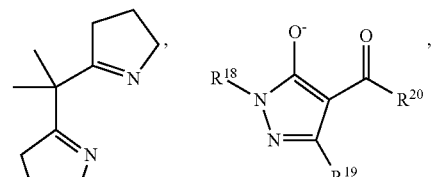

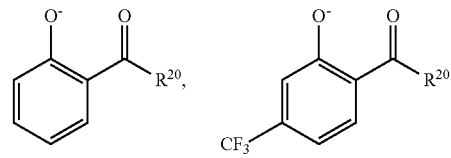

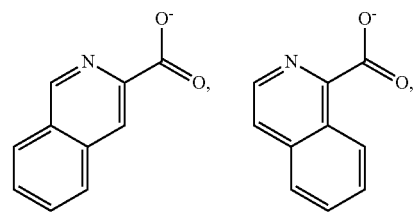

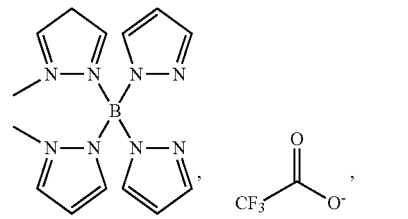

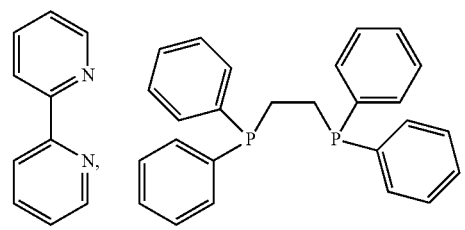

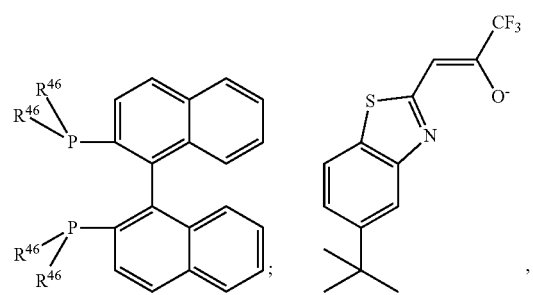

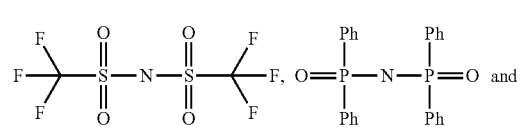

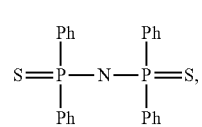

or L is a bidentate ligand selected from
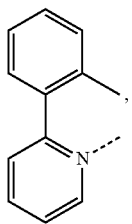 (X-1)
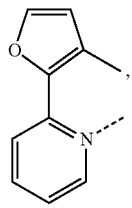 (X-2)
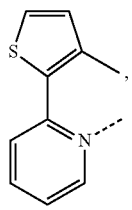 (X-3)
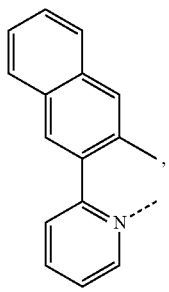 (X-4)
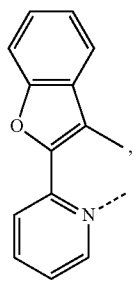 (X-5)
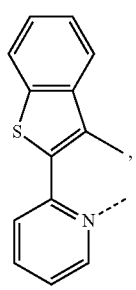 (X-6)
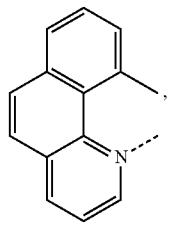 (X-7)
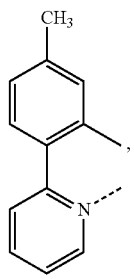 (X-8)
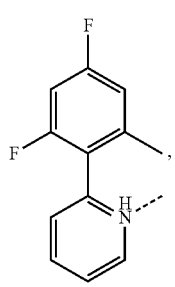 (X-9)
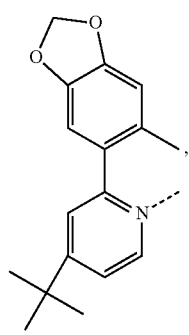 (X-10)
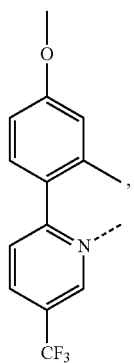 (X-11)

(X-12)
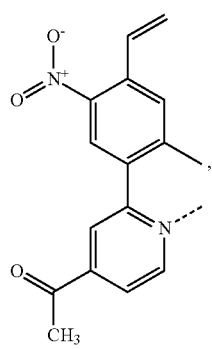
(X-13)
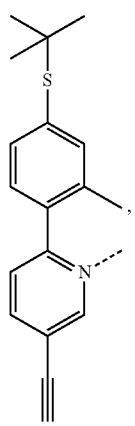
(X-14)
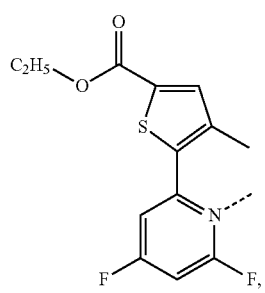
(X-15)
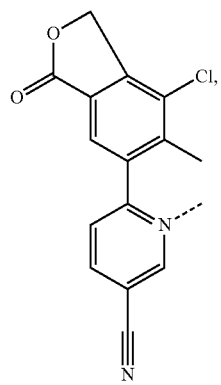
(X-16)
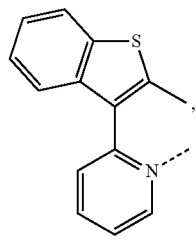
(X-17)
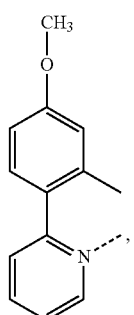
(X-18)
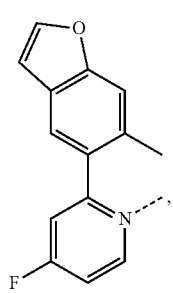
(X-19)
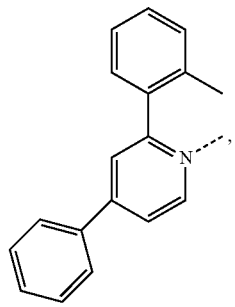
(X-20)
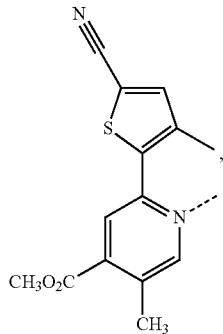

(X-21) 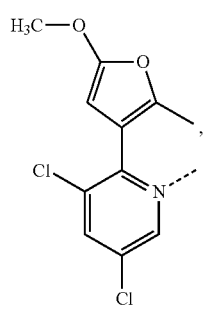
(X-22) 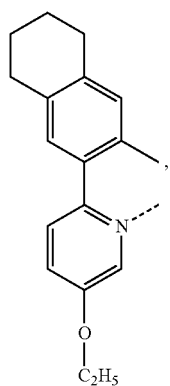
(X-23) 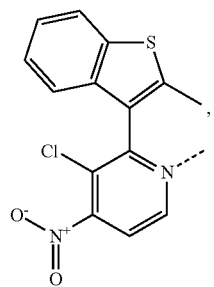
(X-24) 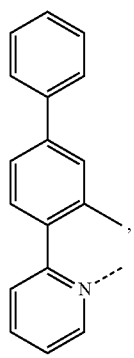
(X-25) 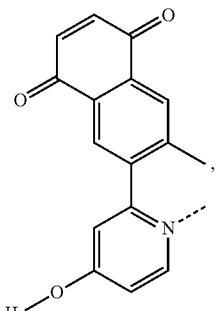
(X-26) 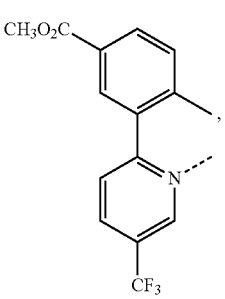
(X-27) 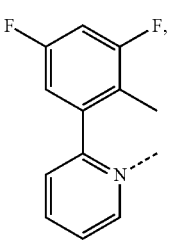
(X-28) 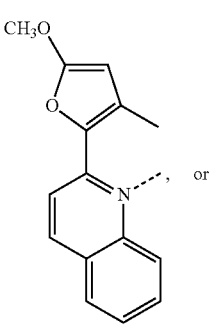 or
(X-29) 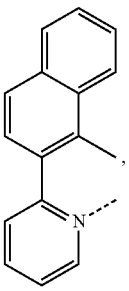

(X-30) 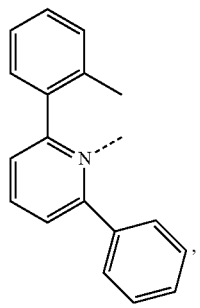
(X-31) 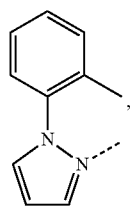
(X-32) 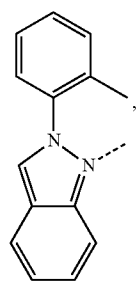
(X-33) 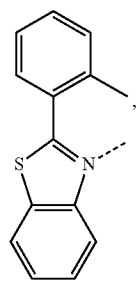
(X-34) 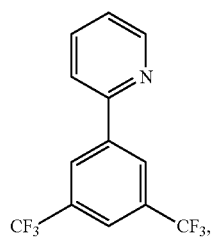
(X-35) 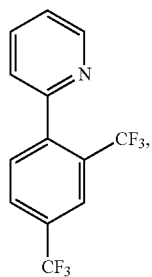
(X-36) 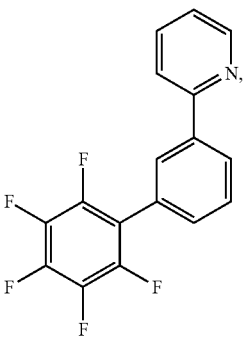
(X-37) 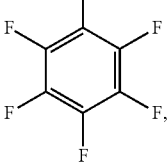
(X-37) 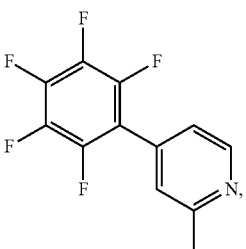
(X-38) 

-continued

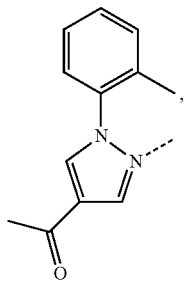 (X-39)

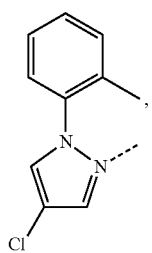 (X-40)

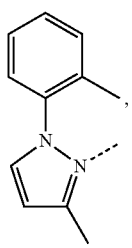 (X-41)

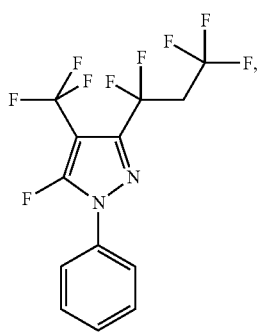 (X-42)

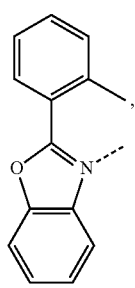 (X-43)

-continued

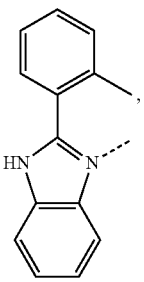 (X-44)

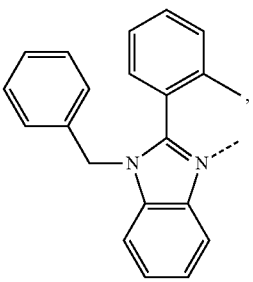 (X-45)

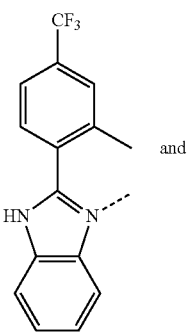 (X-46)

and

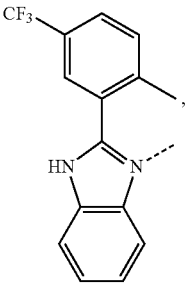 (X-47)

wherein
$R^{11}$ and $R^{15}$ are independently of each other hydrogen, $C_1$-$C_8$alkyl, $C_6$-$C_{18}$aryl, $C_2$-$C_{10}$heteroaryl or $C_1$-$C_8$perfluoroalkyl,
$R^{12}$ and $R^{16}$ are independently of each other hydrogen or $C_1$-$C_8$alkyl and
$R^{13}$ and $R^{17}$ are independently of each other hydrogen, $C_1$-$C_8$alkyl, $C_6$-$C_{18}$aryl, $C_2$-$C_{10}$heteroaryl, $C_1$-$C_8$perfluoroalkyl or $C_1$-$C_8$alkoxy and
$R^{14}$ is $C_1$-$C_8$alkyl, $C_6$-$C_{10}$aryl or $C_7$-$C_{11}$aralkyl,
$R^{18}$ is $C_6$-$C_{10}$aryl,
$R^{19}$ is $C_1$-$C_8$alkyl,
$R^{20}$ is $C_1$-$C_8$alkyl or $C_6$-$C_{10}$aryl, $R^{21}$ is hydrogen, $C_1$-$C_8$alkyl or $C_1$-$C_8$alkoxy which may be partially or fully fluorinated, $A^{11}$ is hydrogen, $A^{12}$ is hydrogen, $A^{13}$ is hydrogen, $A^{14}$ is hydrogen or $C_6$-$C_{18}$aryl, $A^{15}$ is hydrogen or $C_6$-$C_{18}$aryl, $A^{16}$ is hydrogen, $A^{21}$ is hydrogen, $A^{22}$ is hydrogen or $C_6$-$C_{10}$aryl, $A^{23}$ is hydrogen or $C_6$-$C_{10}$aryl, $A^{24}$ is hydrogen, $R^{42}$ is H, F, $C_1$-$C_4$alkyl, $C_1$-$C_8$alkoxy or $C_1$-$C_4$perfluoroalkyl, $R^{43}$ is H, F, $C_1$-$C_4$alkyl, $C_1$-$C_8$alkoxy, $C_1$-$C_4$perfluoroalkyl or $C_6$-$C_{10}$aryl, $R^{44}$ is H, F, $C_1$-$C_4$alkyl, $C_1$-$C_8$alkoxy or $C_1$-$C_4$perfluoroalkyl, $R^{45}$ is H, F, $C_1$-$C_4$alkyl, $C_1$-$C_8$alkoxy or $C_1$-$C_4$perfluoroalkyl and $R^{46}$ is $C_1$-$C_8$alkyl, $C_6$-$C_{18}$aryl, $C_1$-$C_8$alkoxy or $C_6$-$C_{18}$aryl which is substituted by $C_1$-$C_8$alkyl.

4. A compound according to claim 3 of formulae

| Cpd. | $R^{45}$ | $R^{44}$ | $R^{43}$ | $R^{42}$ | $Q^1$ | $Q^2$ |
|---|---|---|---|---|---|---|
| C-1 | H | H | H | H | H | H |
| C-2 | F | H | H | H | H | H |
| C-3 | H | H | F | H | H | H |
| C-4 | F | H | F | H | H | H |
| C-5 | F | H | H | F | H | H |
| C-6 | H | H | $CF_3$ | H | H | H |
| C-7 | H | $CF_3$ | H | $CF_3$ | H | H |
| C-8 | $CF_3$ | H | H | H | H | H |
| C-9 | H | $CH_3$ | H | $CH_3$ | H | H |
| C-10 | H | H | $CH_3$ | H | H | H |
| C-11 | H | H | Ph | H | H | H |
| C-12 | H | H | Ome | H | H | H |
| C-13 | $CH_3$ | $CH_3$ | H | H | H | H |
| C-14 | $CH_3$ | H | $CH_3$ | H | H | H |
| C-15 | H | H | Ph | H | H/Ph[1] | Ph/H[1] |
| C-16 | H | H | t-Bu | H | H | H |

[1] mixture of isomers

| Cpd. | L | $R^{45}$ | $R^{44}$ | $R^{43}$ | $R^{42}$ | $Q^1$ | $Q^2$ |
|---|---|---|---|---|---|---|---|
| D-1 | A[2] | H | H | H | H | H | H |
| D-2 | A[2] | F | H | H | H | H | H |
| D-3 | A[2] | H | H | F | H | H | H |
| D-4 | A[2] | F | H | F | H | H | H |
| D-5 | A[2] | F | H | H | F | H | H |
| D-6 | A[2] | H | H | $CF_3$ | H | H | H |
| D-7 | A[2] | H | $CF_3$ | H | $CF_3$ | H | H |
| D-8 | A[2] | $CF_3$ | H | H | H | H | H |
| D-9 | A[2] | H | $CH_3$ | H | $CH_3$ | H | H |
| D-10 | A[2] | H | H | $CH_3$ | H | H | H |
| D-11 | A[2] | H | H | Ph | H | H | H |
| D-12 | A[2] | H | H | OMe | H | H | H |
| D-13 | A[2] | $CH_3$ | $CH_3$ | H | H | H | H |
| D-14 | A[2] | $CH_3$ | H | $CH_3$ | H | H | H |
| D-15 | A[2] | H | H | Ph | H | H/Ph[1] | Ph/H[1] |
| D-16 | A[2] | H | t-Bu | H | H | H | H |
| D-17 | B[2] | H | H | H | H | H | H |
| D-18 | B[2] | F | H | H | H | H | H |
| D-19 | B[2] | H | H | F | H | H | H |
| D-20 | B[2] | F | H | F | H | H | H |
| D-21 | B[2] | F | H | H | F | H | H |
| D-22 | B[2] | H | H | $CF_3$ | H | H | H |
| D-23 | B[2] | H | $CF_3$ | H | $CF_3$ | H | H |
| D-24 | B[2] | $CF_3$ | H | H | H | H | H |
| D-25 | B[2] | H | $CH_3$ | H | $CH_3$ | H | H |
| D-26 | B[2] | H | H | $CH_3$ | H | H | H |
| D-27 | B[2] | H | H | Ph | H | H | H |
| D-28 | B[2] | H | H | OMe | H | H | H |
| D-29 | B[2] | $CH_3$ | $CH_3$ | H | H | H | H |
| D-30 | B[2] | $CH_3$ | H | $CH_3$ | H | H | H |
| D-31 | B[2] | H | H | Ph | H | H/Ph[1] | Ph/H[1] |
| D-32 | B[2] | H | t-Bu | H | H | H | H |
| D-33 | C[2] | H | H | H | H | H | H |
| D-34 | C[2] | F | H | H | H | H | H |
| D-35 | C[2] | H | H | F | H | H | H |
| D-36 | C[2] | F | H | F | H | H | H |
| D-37 | C[2] | F | H | H | F | H | H |
| D-38 | C[2] | H | H | $CF_3$ | H | H | H |
| D-39 | C[2] | H | $CF_3$ | H | $CF_3$ | H | H |
| D-40 | C[2] | $CF_3$ | H | H | H | H | H |
| D-41 | C[2] | H | $CH_3$ | H | $CH_3$ | H | H |
| D-42 | C[2] | H | H | $CH_3$ | H | H | H |
| D-43 | C[2] | H | H | Ph | H | H | H |
| D-44 | C[2] | H | H | OMe | H | H | H |
| D-45 | C[2] | $CH_3$ | $CH_3$ | H | H | H | H |
| D-46 | C[2] | $CH_3$ | H | $CH_3$ | H | H | H |

-continued

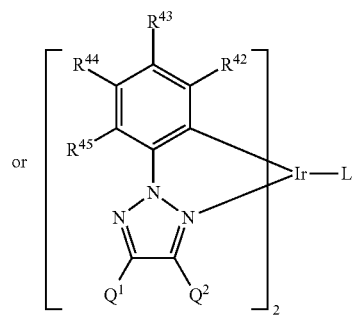

| Cpd. | L | R45 | R44 | R43 | R42 | Q1 | Q2 |
|---|---|---|---|---|---|---|---|
| D-47 | C[2] | H | H | Ph | H | H/Ph[1] | Ph/H[1] |
| D-48 | C[2] | H | t-Bu | H | H | H | H |
| D-49 | D[2] | H | H | H | H | H | H |
| D-50 | D[2] | F | H | H | H | H | H |
| D-51 | D[2] | H | H | F | H | H | H |
| D-52 | D[2] | F | H | F | H | H | H |
| D-53 | D[2] | F | H | H | F | H | H |
| D-54 | D[2] | H | H | CF3 | H | H | H |
| D-55 | D[2] | H | CF3 | H | CF3 | H | H |
| D-56 | D[2] | CF3 | H | H | H | H | H |
| D-57 | D[2] | H | CH3 | H | CH3 | H | H |
| D-58 | D[2] | H | H | CH3 | H | H | H |
| D-59 | D[2] | H | H | Ph | H | H | H |
| D-60 | D[2] | H | H | OMe | H | H | H |
| D-61 | D[2] | CH3 | CH3 | H | H | H | H |
| D-62 | D[2] | CH3 | H | CH3 | H | H | H |
| D-63 | D[2] | H | H | Ph | H | H/Ph[1] | Ph/H[1] |
| D-64 | D[2] | H | t-Bu | H | H | H | H |
| D-65 | E[2] | H | H | H | H | H | H |
| D-66 | E[2] | F | H | H | H | H | H |
| D-67 | E[2] | H | H | F | H | H | H |
| D-68 | E[2] | F | H | F | H | H | H |
| D-69 | E[2] | F | H | H | F | H | H |
| D-70 | E[2] | H | H | CF3 | H | H | H |
| D-71 | E[2] | H | CF3 | H | CF3 | H | H |
| D-72 | E[2] | CF3 | H | H | H | H | H |
| D-73 | E[2] | H | CH3 | H | CH3 | H | H |
| D-74 | E[2] | H | H | CH3 | H | H | H |
| D-75 | E[2] | H | H | Ph | H | H | H |
| D-76 | E[2] | H | H | OMe | H | H | H |
| D-77 | E[2] | CH3 | CH3 | H | H | H | H |

-continued

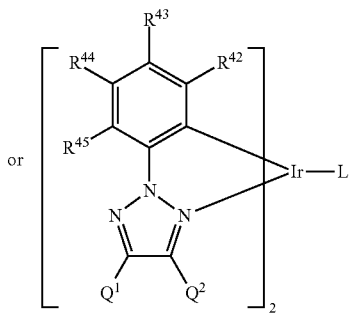

| Cpd. | L | R45 | R44 | R43 | R42 | Q1 | Q2 |
|---|---|---|---|---|---|---|---|
| D-78 | E[2] | CH3 | H | CH3 | H | H | H |
| D-79 | E[2] | H | H | Ph | H | H/Ph[1] | Ph/H[1] |
| D-80 | E[2] | H | t-Bu | H | H | H | H |

[1] mixture of isomers

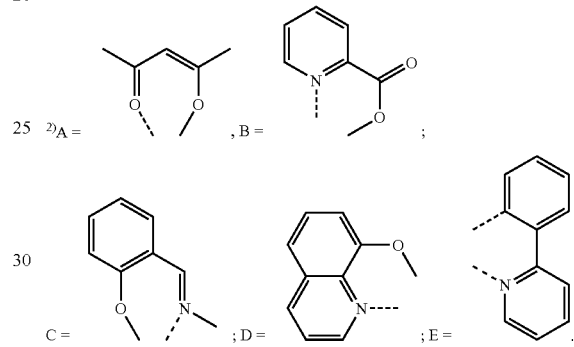

[2] A = ... , B = ... ; C = ... ; D = ... ; E = ... .

5. An organic electronic device, comprising an emitting layer wherein the emitting layer comprises a compound according to claim 1.

6. A device according to claim 5, further comprising a hole transport layer selected from polyvinyl-carbazol, N,N'-diphenyl-N,N'-bis(3-methylphenyl)-[1,1'-biphenyl]-4,4'-diamine (TPD), 1,1-bis[(di-4-tolylamino)phenyl]cyclohexane (TAPC), N,N'-bis(4-methylphenyl)-N,N'-bis(4-ethylphenyl)-[1,1'-(3,3'-dimethyl)biphenyl]-4,4'-diamine (ETPD), tetrakis-(3-methylphenyl)-N,N,N',N'-2,5-phenylenediamine (PDA), a-phenyl-4-N,N-diphenylaminostyrene (TPS), p-(diethylamino)benzaldehydediphenylhydrazone (DEH), triphenylamine (TPA), bis[4-(N,N-diethylamino)-2-methylphenyl](4-methylphenyl)methane (MPMP), 1-phenyl-3-[p-(diethylamino)styryl]-5-[p-(diethylamino)phenyl] pyrazoline (PPR or DEASP), 1,2-trans-bis(9H-carbazol-9-yl)cyclobutane (DCZB), N,N,N',N'-tetrakis(4-methylphenyl)-(1,1'-biphenyl)-4,4'-diamine (TTB), porphyrinic compounds and combinations thereof.

* * * * *